(12) United States Patent  
Kanda et al.

(10) Patent No.: US 6,813,696 B2  
(45) Date of Patent: Nov. 2, 2004

(54) SEMICONDUCTOR MEMORY DEVICE AND METHOD OF CONTROLLING THE SAME

(75) Inventors: Tatsuya Kanda, Kawasaki (JP); Hiroyoshi Tomita, Minato-ku (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,982

(22) Filed: Oct. 29, 2003

(65) Prior Publication Data

US 2004/0085832 A1 May 6, 2004

Related U.S. Application Data

(62) Division of application No. 09/264,672, filed on Mar. 9, 1999, now Pat. No. 6,671,787.

(30) Foreign Application Priority Data

Sep. 24, 1998 (JP) .......................................... 10-269719  
Oct. 9, 1998 (JP) .......................................... 109287992  
Nov. 27, 1998 (JP) .......................................... 10-336708

(51) Int. Cl.[7] .............................................. G06F 12/00
(52) U.S. Cl. ............. 711/167; 365/189.04; 365/189.05; 365/201; 365/220; 365/221; 365/236
(58) Field of Search ..................... 711/167; 365/189.01, 365/189.04, 189.05, 201, 221, 236

(56) References Cited

U.S. PATENT DOCUMENTS

| | | | |
|---|---|---|---|
| 5,892,730 A | 4/1999 | Sato et al. | |
| 5,930,819 A | 7/1999 | Hetherington et al. | |
| 6,060,916 A | 5/2000 | Park | |
| 6,061,292 A | 5/2000 | Su et al. | |
| 6,091,663 A | 7/2000 | Kim et al. | |
| 6,094,375 A | 7/2000 | Lee | |
| 6,094,727 A | 7/2000 | Manning | |
| 6,118,729 A | 9/2000 | Hirabayashi et al. | |
| 6,128,233 A | 10/2000 | Yu et al. | |
| 6,134,180 A | 10/2000 | Kim et al. | |
| 6,151,271 A | 11/2000 | Lee | |
| 6,151,664 A | 11/2000 | Borkenhagen et al. | |
| 6,226,755 B1 | 5/2001 | Reeves | |
| 6,259,647 B1 * | 7/2001 | Ooishi ................... | 365/230.01 |
| 6,279,073 B1 | 8/2001 | McCraken et al. | |
| 6,317,372 B1 * | 11/2001 | Hayashi et al. ............. | 365/201 |
| 6,512,719 B2 * | 1/2003 | Fujisawa et al. ............ | 365/233 |

FOREIGN PATENT DOCUMENTS

| | | |
|---|---|---|
| JP | 10-302465 | 11/1998 |
| JP | 11-213668 | 8/1999 |
| KR | 1998-77763 | 11/1998 |

OTHER PUBLICATIONS

Cases, M., Packaging Challenges in the design of . . . IEEE, Conference, 2000.  
Office Action of corressponding Korean application 97–15004, dated Sep. 3, 2001, with English Translation.

* cited by examiner

*Primary Examiner*—Donald Sparks  
*Assistant Examiner*—Christian P. Chace  
(74) *Attorney, Agent, or Firm*—Westerman, Hattori, Daniels & Adrian, LLP

(57) ABSTRACT

The present invention relates to a SDRAM and its control method which write or read data in synchronization with the external clock and its object is to provide a semiconductor memory device and its method which can be easily tested and evaluated by the conventional memory test equipment having a transfer type which transfers the data in synchronization with the rising and falling edges of the external clock. The semiconductor memory device has a write amplifier control section 14 and I/O data buffer/register 22 as a data transfer circuit corresponding to the data transfer type for the DDR type and SDR type. Also, a mode register 28 is formed to be used as a switch signal to switch the data transfer circuit to either DDR type or SDR type.

4 Claims, 34 Drawing Sheets

Fig.2

| COMMAND FUNCTION NAME | COMMAND | CKE n-1 | CKE n | $\overline{CS}$ | $\overline{RAS}$ | $\overline{CAS}$ | $\overline{WE}$ | A11 | A10 | A9 ~ A0 |
|---|---|---|---|---|---|---|---|---|---|---|
| NON-SELECTION OF DEVICE | DESL | H | X | H | X | X | X | X | X | X |
| NO OPERATION | NOP | H | X | L | H | H | H | X | X | X |
| READ | READ | H | X | L | H | L | H | V | L | V |
| READ / AUTO PRECHARGE | READA | H | X | L | H | L | H | V | H | V |
| WRITE | WRIT | H | X | L | H | L | L | V | L | V |
| WRITE / AUTO PRECHARGE | WRITA | H | X | L | H | L | L | V | H | V |
| BANK ACTIVE (RAS) | ACTV | H | X | L | L | H | H | V | V | V |
| SINGLE BANK PRECHARGE | PRE | H | X | L | L | H | L | V | L | X |
| ALL BANK PRECHARGE | PALL | H | X | L | L | H | L | X | H | X |
| MODE REGISTER SET | MRS | H | X | L | L | L | L | L | V | V |

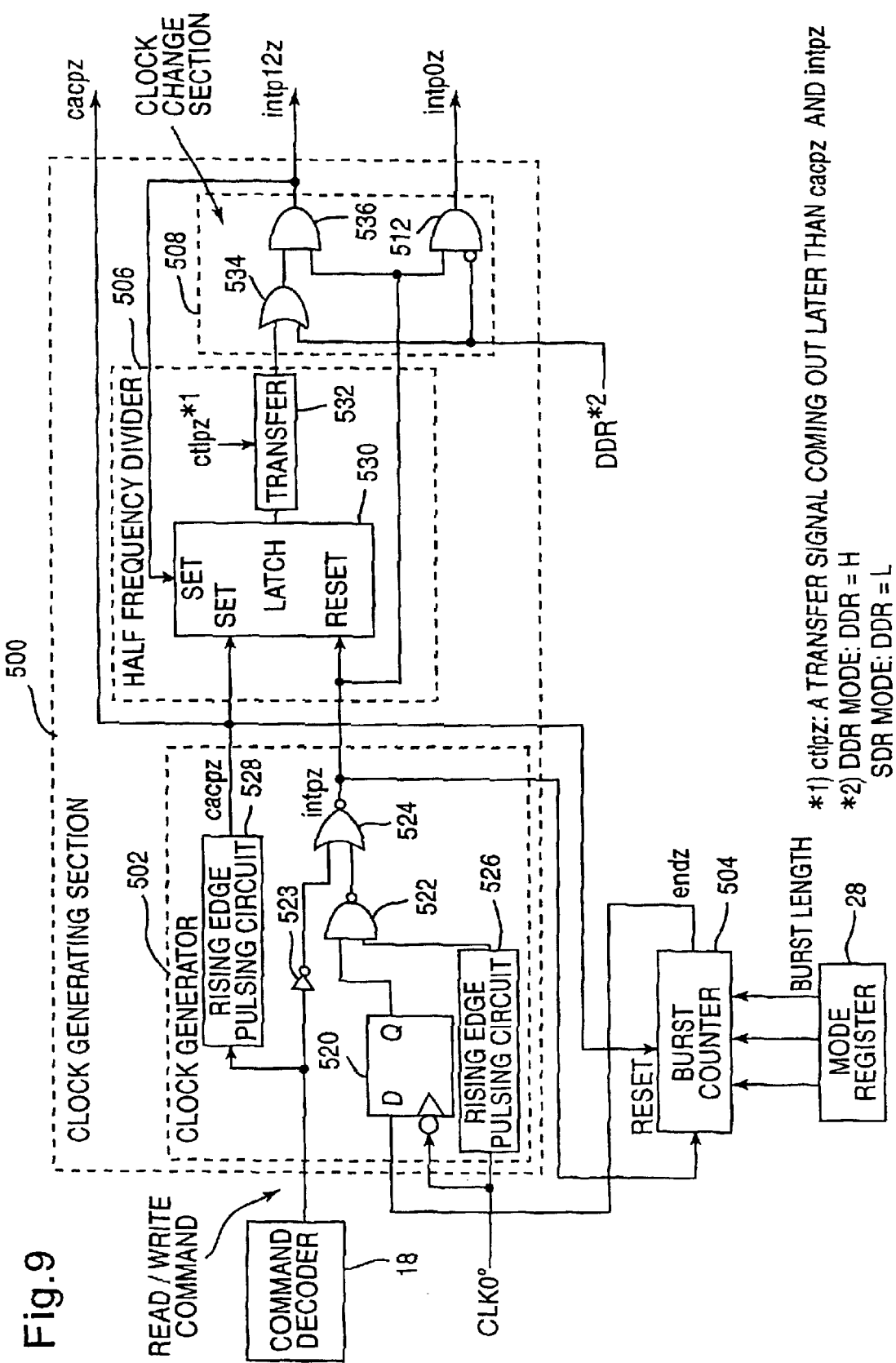

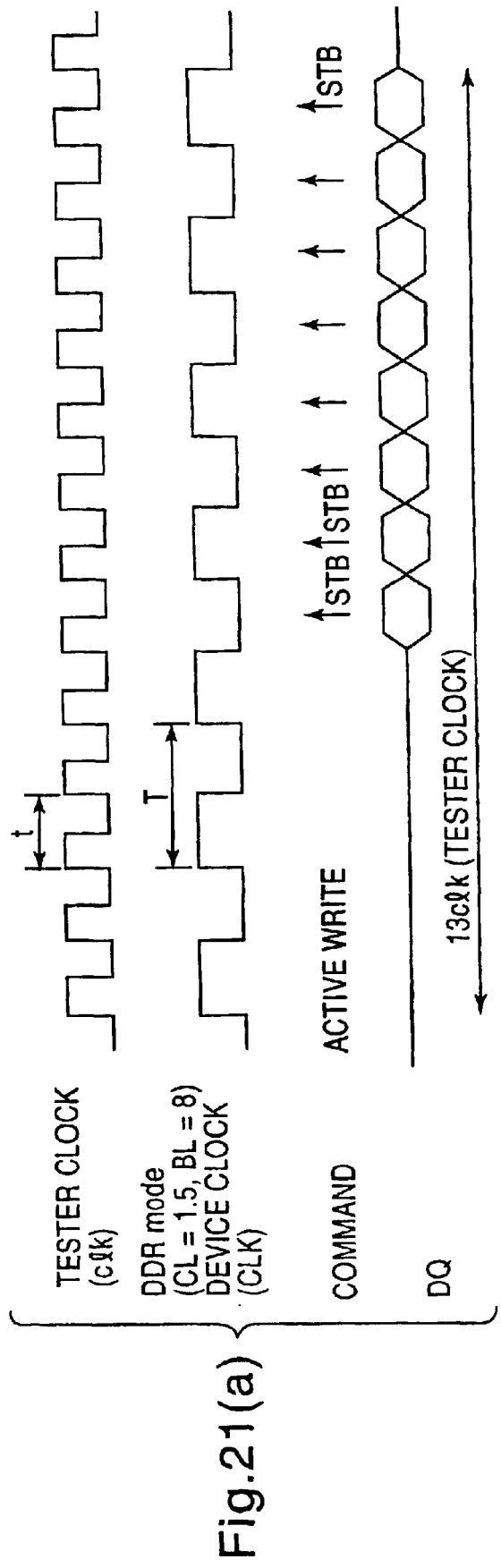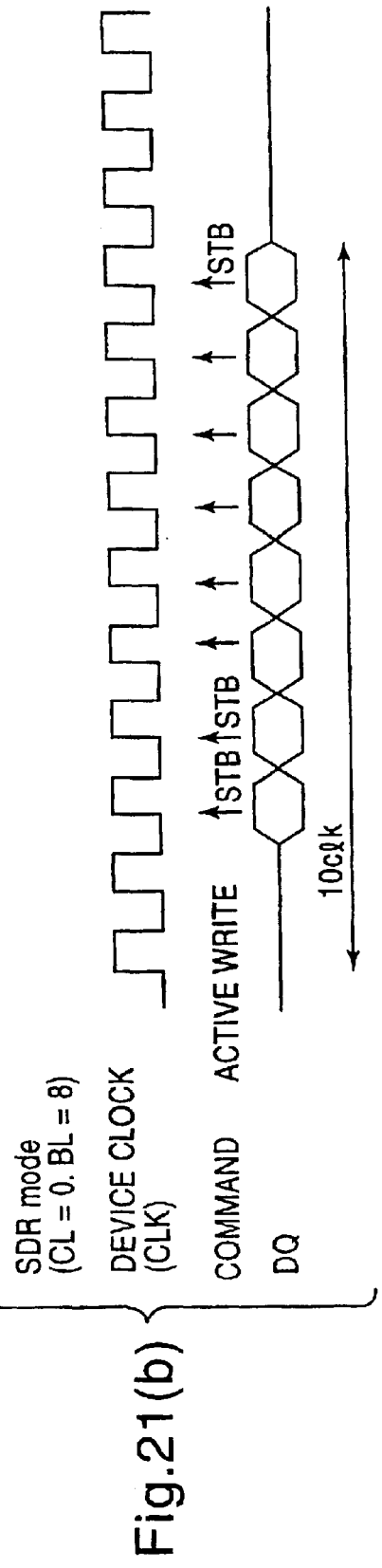
Fig.21(a)
Fig.21(b)

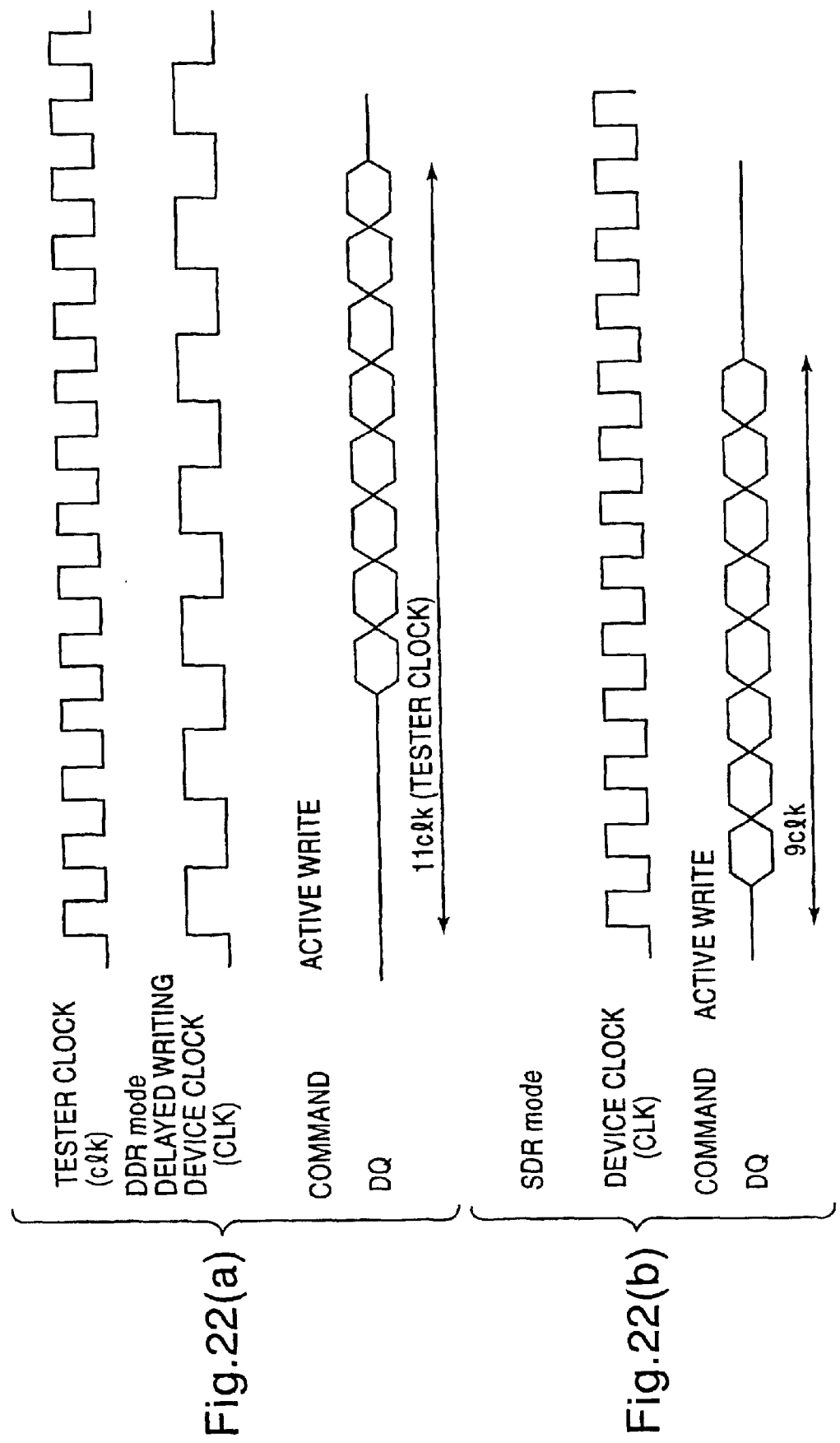

SEMICONDUCTOR MEMORY DEVICE AND METHOD OF CONTROLLING THE SAME

RELATED APPLICATION

This application is a divisional of U.S. patent application Ser. No. 09/264,672 filed on Mar. 9, 1999 now U.S. Pat. No. 6,671,787, which is hereby incorporated by reference in its entirety. Priority under 35 U.S.C. §§120 and 121 is hereby claimed for benefit of the filing date of U.S. patent application Ser. No. 09/264,672.

BACKGROUND OF THE INVENTION

1. Field of the Invention

The present invention relates to a semiconductor memory device in synchronization with an external clock signal and its control method, and relates in particular to synchronous DRAM (Synchronous Dynamic Random Access Memory: SDRAM) which reads or writes data synchronously with the external clock signal and its control method for writing data.

2. Description of the Related Art

The conventional DRAM inputs or outputs data independently (Asynchronous) from the clock signal supplied to a system, thereby preventing the input of following addresses until the data corresponding to the address is output from an address input. Thus the cycle time of a data transfer depends upon the access time up to the data output, thus causing a difficulty in the improvement of data transfer rate. For this reason, along with a remarkable improvement of processing speed of a processing unit (MPU) installed in the personal computer (PC) in recent years, the improvement of the data transfer speed of the DRAM used as a main memory in the PC arises as an important object.

To address this problem, a SDRAM with the column access path divided into several pipelines and the read/write process between each pipelines synchronized with the rising edge of the external clock signal supplied from the system side has been developed. Furthermore, with no change in the basic architecture of the circuit, a SDRAM in DDR mode (Double Data Rate) which inputs or outputs the data synchronously with both the rising and falling edges of the external clock signal (CLK) is developed (for example, described in particular in Japanese Application No. 9-167451, Japanese Application No. 10-22257, etc.) The data transfer rate of the SDRAM in the DDR mode has an advantage of being approximately twice as fast as that of the SDRAM in which the data is synchronized in transmission only with the rising edge of the external clock signal (hereinafter called SDR mode for convenience), thus becoming the present mainstream of the SDRAM.

SUMMARY OF THE INVENTION

Now, these semiconductor memory devices are tested and evaluated by memory test equipment (IC tester) in the manufacturing stage. The memory test equipment's functions include counting the number of defective memory cells and judging whether the repair of the defective memory cells is feasible under a situation identical to the normal operative condition. For example, in testing for the defective memory cells in the SDRAM, the memory test equipment generates a signal identical to the external clock signal CLK used during the actual operation of the SDRAM and input it to the SDRAM. It should be noted that a wafer test checks all chips formed on a semiconductor wafer and tests writing and reading of the predetermined data to each chip.

However, the above-mentioned SDRAM having the DDR mode is quite different from the SDRAM having the conventional SDR mode in operations. Especially in the write/read operation, since the DDR mode generates the write/read data in frequency twice that of the conventional type, it is required to newly introduce the memory test equipment which can generate the clock signal for a test corresponding to the DDR mode. This in turn requires the purchase of new memory test equipment for manufacturing SDRAM in the DDR mode, so resulting in higher investment in equipment and increasing the cost of the SDRAM having the DDR mode. Also, the inability of using the conventional memory test equipment causes a delay in product development of the DDR mode SDRAM.

More specifically, there is a restriction that only one strobe can be generated within one clock in the semiconductor tester. When the SDRAM is tested with DDR method under such restriction, two outputs are provided in one clock, requiring the use of two clocks from the semiconductor tester as one clock and to generate two strobes within one clock of clocks given to the semiconductor memory device. That is, the test must be executed by operating the semiconductor memory device in half the frequency of the actual tester ability.

FIG. 21 is a timing chart showing a comparison between the data reading tests in the wafer test of the semiconductor memory device regarding to an embodiment of the prior and present inventions. FIG. 22 is a timing chart showing a comparison between the data writing tests in the wafer test of the semiconductor memory device regarding to an embodiment of the prior and present inventions. Here, FIG. 21(a) and FIG. 22(a) are the timing charts of the data reading and data writing tests of the SDRAM in the DDR type which is a conventional semiconductor memory device, and FIG. 21(b) and FIG. 22(b) are the timing charts of the data reading and data writing tests of the SDRAM of the DDR type which is a semiconductor memory device as an embodiment of the present invention later described.

As shown in FIG. 21(a), since the conventional data reading test in the wafer test of the SDRAM having the DDR type can execute only the reading operation in the DDR type, it, for example, gives a clock (a device clock) CLK which has a cycle (T=2xt) twice as long as the main clock (a tester clock) clk of the semiconductor tester to the SDRAM in the DDR type to read twice standing two strobes (STB) to one clock of this device clock CLK. Here, when a CAS latency is 1.5 clocks (CL=1.5) and a bus length is 8 (BL=8: when 8 different data are read), the completion of a series of data readings requires a time equivalent to 13 clk's after an active state.

Also, as shown in FIG. 22(a), the conventional data writing test in the wafer test of the SDRAM having the DDR type allows only the write operation in the DDR type, therefore, for example, two write operations are executed during one clock of this device clock CLK by giving a device clock CLK which has a cycle (T=2xt) twice as long as that of the tester clock clk. Here, When the 8 different data are written by delayed write, the completion of a series of write operations requires a time equivalent to 13 clk's (tester clocks) after active state.

By the way, since the wafer test is required for all chips formed on the semiconductor wafer, testing by operating the device with a half the frequency of the actual semiconductor tester like this leads to a problem to introduce an increase in manufacturing cost. For example, testing the SDRAM of the DDR type under the ordinary operation requires expensive test equipment that has a frequency band twice as fast as the operation speed of the SDRAM, which consequently increases the manufacturing cost of the SDRAM of the DDR type significantly. Use of the ordinary test equipment, on the other hand, requires all device clocks CLK to be operated with a half the frequency of the tester clock clk and a redundant timing must be set in all tests. Consequently, the test time becomes longer and also the manufacturing cost of the devices is increased.

An object of the present invention is to provide a semiconductor memory device that can be easily tested and evaluated by the conventional memory test equipment and its control method, while having a transfer mode to transfer data in synchronization with the rising and falling edges of the external clock.

A further object of the present invention is to provide a semiconductor memory device that can reduce the test time without the use of expensive test equipment.

The above objects are achieved by a semiconductor memory device operable in synchronization with an external clock signal, comprising a data transfer circuit, having a first transfer mode and a second transfer mode, for transferring data in synchronization with rising and falling edges of an external clock signal in the first transfer mode, and for transferring data in synchronization with only one of the rising and falling edges in the second transfer mode. Also, in the semiconductor memory device of the present invention, the data transfer circuit switches the first and second transfer modes in response to a mode switch signal. According to this structure, the conventional memory test equipment can be used to test and evaluate the semiconductor memory device by switching to the second transfer mode. In an actual use, it is also possible to realize a high-speed data transfer rate by switching to the first transfer mode.

Further, in the semiconductor memory device of the present invention, the mode switch signal is generated on the basis of a setting signal input from outside the device. Furthermore, the semiconductor memory device of the present invention has a register to latch the setting signal. By forming such a structure, the transfer mode of the data transfer circuit can easily be switched from the system side which utilizes the semiconductor memory device.

In the semiconductor memory device of the present invention, an empty register in a mode register can be used as the register. It is possible to easily maintain the mode switch signal by utilizing the empty register of the mode register arranged also in the conventional SDRAM. Or, by arranging a switch signal input terminal to the semiconductor memory device of the present invention and by inputting a mode switch signal from the system side to the switch signal input terminal, the transfer mode of a direct data transfer circuit may be switched from the system side. By doing like this, the circuit structure of the semiconductor memory device can be more simply formed.

In the semiconductor memory device of the present invention, the second transfer mode may transfer data in synchronization with the rising and falling edges of the external clock signal. By doing this, the transfer rate of half that of the first transfer mode can be realized with a duty ratio of the external clock equal to 50%.

Also, in the semiconductor memory device of the present invention, the data transfer circuit has a data input converter, for simultaneously transferring parallel data converted from serial data which are input serially in the first transfer mode, and for sequentially transferring the serial data in the second transfer mode. By forming this structure, even in the first transfer mode which inputs or outputs data at the transfer rate twice as fast as that of the second transfer mode to the external (system side), the same write or read speed as that of the second transfer mode can be used for the memory cells in the semiconductor memory device.

Furthermore, in the semiconductor memory device of the present invention, the data transfer circuit has a data input clock generating circuit, for generating a first clock signal in the first transfer mode or a second clock signal in the second transfer mode in response to the mode switch signal, and for transmitting the first clock signal or the second clock signal to the data input converter. By using the clock signal, a data input operation at the data input converter in the first or second transfer mode can be easily changed by a simple circuit structure.

Also, in the semiconductor memory device of the present invention, the data transfer circuit has a write control circuit, for generating a first write enable signal to simultaneously transfer the parallel data to a memory cell array in the first transfer mode, and for generating a second write enable signal to sequentially transfer the serial data to the memory cell array in the second transfer mode. Thus, since a write enable signal in response to the first and second transfer modes are output on the basis of the mode switch signal, data can surely be transferred in both of the first and second transfer modes in synchronization with a data input converter which executes a data input operation by the clock signal on the basis of the mode switch signal also.

Further in the semiconductor memory device of the present invention, the semiconductor memory device comprises a column address counter which can change a timing to count up a column address in response to the mode switch signal.

Furthermore, a column address counter of the present invention comprises a clock generating circuit supplying a first internal address generating clock and a second internal address generating clock, a first address generating section generating a first internal address in synchronization with the first internal address generating clock, and a second address generating section generating a second internal address in synchronization with the second internal address generating clock. Furthermore, the clock generating circuit comprises a clock generator and a frequency divider, the clock generator generating an internal clock in response to the external clock, the frequency divider receiving the internal clock and generating a divided clock, and wherein the clock generating circuit outputs the internal clock as the first internal address generating clock in the first transfer mode, and outputs the divided clock as the first internal address generating clock and the internal clock as the second internal address generating clock in the second transfer mode.

The semiconductor memory device of the present invention also comprises a burst counter which starts counting the internal clock according to a write or read command, and deactivates the clock generator signal when the predetermined number of the internal clocks is counted. Furthermore, the burst counter comprises a burst length conversion circuit for converting the predetermined number of the internal clocks in response to the mode switch signal.

With this structure, in a burst mode with the predetermined burst length, a counting up of the column address is executed matching with the data transfer rate of the first or second transfer mode, so that a sure data transfer can be possible in each transfer mode.

In the semiconductor memory device of the present invention, the data transfer circuit transfers data to a memory cell array when the data is the write data. When the semiconductor memory device is tested and evaluated, the reason of the data write failure is easily analyzed using the conventional test equipment particularly by switching the first transfer mode to the second transfer mode when data are written.

Also, the above objects are achieved by a control method of the semiconductor memory device operable in synchronization with an external clock signal, comprising transferring data in synchronization with both of rising and falling edges of the external clock signal in a first transfer mode, and transferring the data in synchronization with one of the rising and falling edges in a second transfer mode. According to this control method, since it is possible to switch to the second transfer switch in the test of the semiconductor memory device, the failure analysis of the memory cells is easily made by using the conventional memory test equipment. On the other hand, the first transfer method which can realize a high-speed data transfer rate can be employed in the actual use of the semiconductor memory device.

In this control method, the first and second transfer modes are switched in response to a switch signal which is generated on the basis of a setting signal input from outside of the device or directly input from the outside. Also, the data is transferred in synchronization with the rising edge of the external clock signal in the second transfer mode. Further, in this control method, in the first transfer mode, a plurality of data serially input are converted from serial data to parallel data and the converted parallel data are simultaneously transferred. In the second transfer mode, a plurality of data are sequentially transferred.

Also, in the control method of the semiconductor memory device of the present invention, whether a plurality of data are simultaneously transferred after the serial to parallel conversion or are sequentially transferred is switched in response to the switch signal. Further, in this control method, the step of transferring includes outputting a first write enable signal to a write amplifier in the first transfer mode and outputting a second write enable signal in the second transfer mode in response to a switch signal when the data is transferred to a memory cell array. Furthermore, in the control method of the semiconductor memory device of the present invention, a timing to count up a column address is changed in response to the switch signal.

Also, in this control method, the second transfer mode is selected when the data is written in a test mode.

By employing such control method in the test and evaluation of the semiconductor memory device the cause of the data write failure is easily analyzed using the conventional memory test equipment by switching the first transfer mode to the second transfer mode at the data write.

Above objects are achieved by a semiconductor memory device of a double data rate type for reading the data in response to rising and falling edges of a clock having an operating mode to immediately read the data with a read command.

Also, the above objects are achieved by a semiconductor memory device of a double data rate type for reading data in response to both of rising and falling edges of a clock having a single data rate mode for reading the data in response to one of the rising and the falling edges of the clock.

Also, the above object is achieved by a semiconductor memory device of a double data rate type for writing data in response to both of rising and falling edges of a clock having an operating mode for immediately writing the data after a write command is received.

Further, the above objects are achieved by a semiconductor memory device of a double data rate type for writing data in response to both of rising and falling edges of a clock having a single data rate mode to write data in response to one of the rising and falling edges of the clock.

According to the semiconductor memory device of the present invention, it has not only the double data rate mode but also a mode to read data immediately with a write command.

Also, according to the semiconductor memory device of the present invention, it has not only the double data rate mode but also the single data rate mode to read data in response to one of the rising and falling edges of a clock.

Further, according to the semiconductor memory device of the present invention, it has not only the double data rate mode but also a mode to write data immediately with a write command.

Furthermore, according to the semiconductor memory device of the present invention, it has not only the double data rate mode but also the single data rate mode to write data in response to one of rising or falling edges of a clock.

Thus, according to the present invention, a semiconductor memory device capable of reducing a test time can be provided without the use of expensive test equipment.

BRIEF DESCRIPTION OF THE DRAWINGS

The present invention is further described in connection with the accompanying drawings, in which:

FIG. 2 is a table describing an example of commands that are generated at a command decoder of the semiconductor memory device in the first embodiment of the present invention.

FIG. 9 is a diagram showing a circuit example of a clock generating section in the column address counter of the semiconductor memory device in the first embodiment of the present invention.

FIG. 21 is a timing chart showing a comparison between data read tests in the semiconductor memory device in the second embodiment of the prior and present invention.

FIG. 22 is a timing chart showing a comparison between data write tests in the semiconductor memory device in the second embodiment of the prior and present invention.

DESCRIPTION OF THE PREFERRED EMBODIMENTS

A semiconductor memory device and its control method in the first embodiment of the present invention are described with reference to FIG. 1 through FIG. 8. The first embodiment describes a structure, in a data write operation, which operates in the DDR type during the ordinary operation and can operate in the SDR type during the test operation. First, a schematic structure of the semiconductor memory device in the first embodiment is described with reference to a system block diagram shown in FIG. 1. The semiconductor memory device in the first embodiment comprises a basic structure of the SDRAM that operates in the DDR mode.

Figure 1:
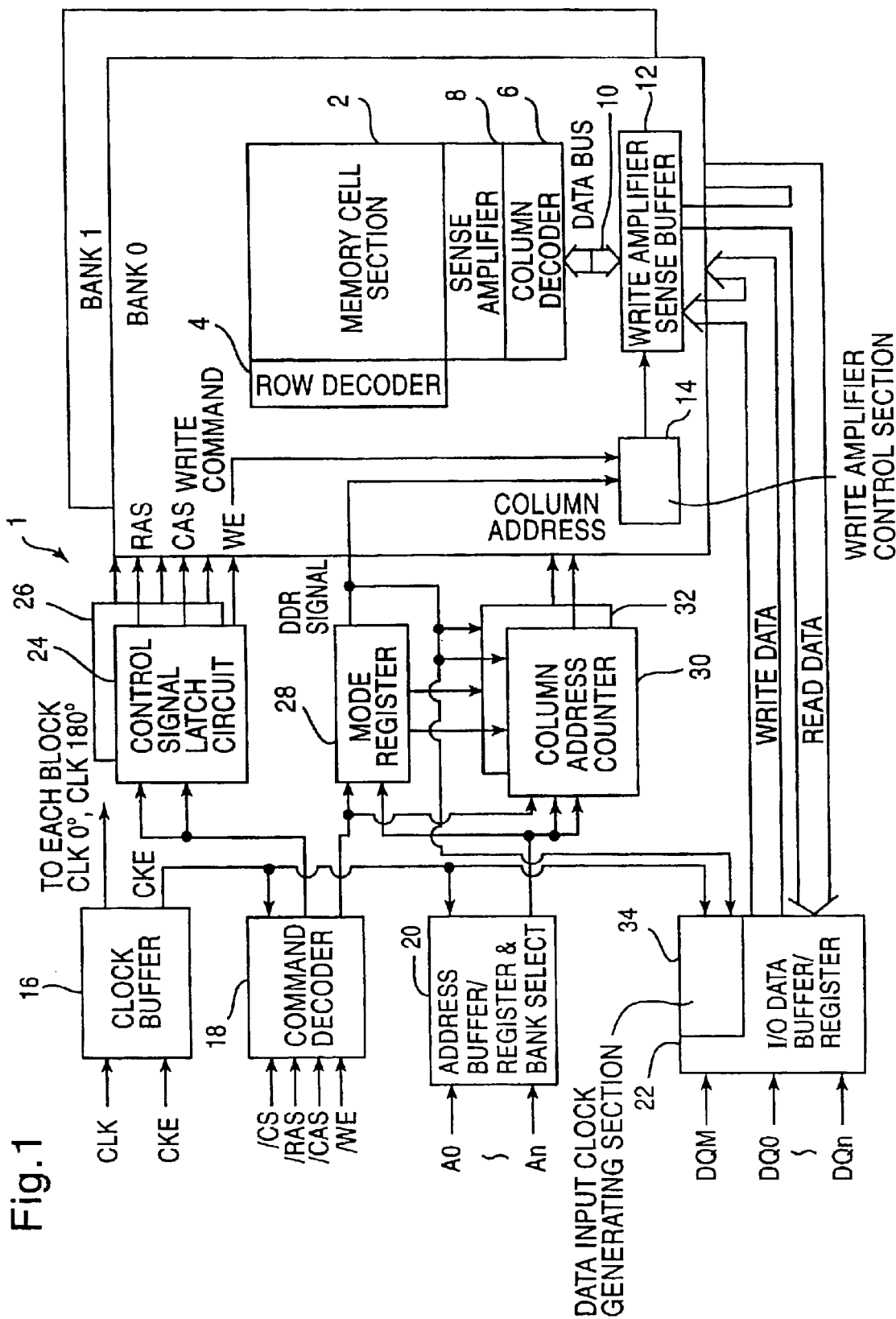
FIG. 1 is a block diagram showing a total structure of the semiconductor memory device in the first embodiment of the present invention.

In FIG. 1, an inside of the SDRAM 1 is divided into two banks (bank 0 and bank 1) where each can be controlled independently. Though the SDRAM 1 in the first embodiment has two banks 0 and 1, actually a plurality of banks (for example, four banks) can be provided of course. The banks 0 and 1 have the same circuit structure. For example, if they are 16 Mb SDRAM's, the same situation as operating two independent two 8 Mb DRAM's can be made.

The following are described mainly with reference to examples of the bank 0. A memory cell section 2 in which memory cells consisting of a transistor for a transfer gate and a capacitor (both are omitted in the diagrams) are arranged in the matrix. Also, a row selection line (word line) and a bit line extending to the direction of the row and column are formed between each memory cells at the memory cell section 2. A gate electrode of the transistor in each memory cell arranged in the same direction of the row is connected to the same row selection line, and a drain electrode of the transistor in each memory cells arranged in the same direction of the column is connected to the same bit line.

A plurality of these row selection lines are driven by a row decoder 4, and a plurality of column selection lines which control a column gate between the bit line and a data bus 10 are driven by a column decoder 6.

Also, between a pair of bit lines, when writing to or reading from the predetermined memory cell or when refreshing, a sense amplifier 8 is provided to output an amplified signal existing at the paired bit lines. A data bus 10 is connected to a write amplifier/sense buffer 12. At the write amplifier/sense buffer 12, data which are output to the data bus 10 are controlled on the basis of a write control signal WE from a write amplifier control section (write control section) 14. During a data read, the data of the memory cell selected at a desired row selection line is amplified at a sense amplifier and is output to the data bus 10 via a column gate which is controlled by the desired column selection line. During a data write, via the column gate, data on the data bus 10 is written to the sense amplifier 8 and amplified, and then written to the predetermined memory cell.

Further, SDRAN 1 has a clock buffer 16, a command decoder 18, an address buffer/register & bank select 20, an I/O data buffer/register 22, control signal latch circuits 24 and 26, a mode register 28, and column address counters 30, and 32. An external clock signal CLK and a clock enable signal CKE are supplied to the clock buffer 16 externally. The clock buffer 16 generates a clock signal CLK0° in synchronization with the rising edge of the external clock signal CLK, while it generates a clock signal CLK180° in synchronization with the falling edge of the external clock signal CLK.

Also, the clock buffer 16 controls the supply of the clock signal CLK0° and the clock signal CLK180° to each circuit of the SDBAM 1 on the basis of the level of a clock enable signal CRE. When the clock enable signal CKE is at active level, the clock signal CLK0° and the clock signal CLK180° are supplied to each block of the SD1AM 1. It should be noted that the clock enable signal CKE is supplied from the clock buffer 16 to each of the command decoder 18, the address buffer/register & bank selector 20, and a data input clock generator 34 in the I/O data buffer/register 22.

The command decoder 18 decodes a chip select signal/CS, a row address strobe signal/RAS, a column address strobe signal/CAS, and a write enable signal/WE, thus generating a variety of control signals (command) controlling the operation of the SDRAM 1 by combinations of these signals. Here, "/" shows that each signal is activated with a signal level being low. The generated control signals are input to the control signal latch circuits 24 and 26, the column address counter 30, the mode register 28, and so on.

An example of the control signal generated at this command decoder 18 is described with reference to FIG. 2. Sequentially from the left, FIG. 2 shows a command function name, a command name, the state of the clock enable signal CKE, the chip select signal/CS, the row address strobe signal/RAS, the column address strobe signal/CAS, each state of the write enable signal/WE, and the state of each bit of addresses A0~A11 which will be described later. It should be noted that "H" shows a high level, "L" shows a low level, "X" shows a high or low level, "V" shows a definite input, "n" shows a state in the present clock cycle, and "n−1" shows a state one cycle previous.

For example, when the clock enable signal CKE (n−1) is "H", CKE (n) is "X", the chip select signal/CS is "L, the row address strobe signal/RAS is "H", the column address strobe signal CS is "L", the write enable signal/WE is "L", the addresses A0–A9 are "V", the address A10 is "L" and the Address A11 is "V", a WRIT (write) command to write data to the memory cell section 2 of the SDRAM 1 is generated. The generated WRIT command is input to the write amplifier control section 14 in the bank 0 (1) through the control signal latch circuit 24 (26).

The address buffer/register & bank select 20 latches and decodes the input address signals A0–An (in this example, n=11), and then outputs the decoded signals to the decoder 4, the mode register 28 and the column address counters 30 and 32. In this example, most significant bit A11 of the address is used for selecting the bank 0 or 1.

Data input/output data DQ 0~DQ n (in this example, n=15) and data input/output mask DQM are input to the I/O data buffer/register 22. The I/O data buffer register 22 inputs or outputs the write/read data between either bank 0 or bank 1, and it has 32 bit parallel data lines respectively for writing or reading to write the data to the memory cell section or to read the data from the memory cell section 2. The data lines are connected to each of the write amplifier/sense buffer 12 in the banks 0 and 1 after diverging on the way. Also, the I/O data buffer/register 22 has the data input clock generating section 34 as will be described later.

After receiving the control signal (command) described before from the command decoder 18, based on it, the control signal latch circuits 24 and 26 generate a various internal control signals (RAS, CAS, WE, and so on) and output them to banks 0 and 1. As has been described before, the write control signal WE output from the signal latch circuit 24 is input to the write amplifier control section 14 in the bank 0.

The mode register 28, for example, has a register consisting of 12 bits of A0~A11, and therefore can set the data length (burst length: for example, 1, 2, 4, or 8) sequentially accessing during a burst mode which will be described later, a burst type in a sequential mode or in an interleave mode, or a CAS latency which outputs the data with delay of the predetermined number of clocks (for example, 1, 2, or 3 clocks) from the receiving time of the read (READ) command during the burst transfer mode. For example, as the structure of the register, A0~A2 are used for setting the burst length, A3 is used for setting the burst type, and A4~A6 are used for setting the CAS latency.

The setting of the mode register 28 is described with reference to FIG. 2. The clock enable signal CKE (n−1) is "H" and CKE(n) is "X". Also, the chip select signal/CS, the row address strobe signal/RAS, the column address strobe signal/CAS and the write enable signal/WD are all "L", Furthermore, when the addresses A0–A10 are "V'1 and address A11 is "L", a mode register set (MRS) command is generated to set the data to the registers A0–A11 of the mode register 28. When the generated MRS command is executed, the mode register 28 receives the signal A0–A11 for setting the mode register 28 which is input to the address buffer/register & bank select 20 as the setting signal input from the external, thereby setting its own register A0–A11. With this, the settings of the predetermined burst length, the burst type and the CAS latency are completed.

Further, the mode register 28 in the embodiment 1 uses, for example, the bit A11 as a register to switch and set the SDRAM 1 to one of the DDR mode and SDR mode when the data is written. If the bit A11 is "0", the data write operation of the SDRAM 1 is set to the DDR mode, and if it is "1", the operation is set to the SDR mode.

The mode register 28 outputs a DDR signal (switch signal), which shows one of the DDR or SDR mode, to the column address counters 30 and 32 along with outputting the set burst length, the burst type, and information of the CAS latency to the column address counters 30 and 32. At the same time, the mode register 28 also transmits the DDR signal to the data input clock generating section 34 in the I/O data buffer/register 22 and to the write amplifier control section 14 in the banks 0 and 1.

A data transfer circuit which can be used by switching the DDR mode and the SDR mode at least by the I/O data buffer/register 22 and the write amplifier control section 14 is formed. Also, the mode register 28 is an example of the switching means to switch the data transfer circuit to either the DDR or SDR mode. By forming such a structure, the transfer mode of the data transfer circuit can be easily switched from the system side, which uses the semiconductor memory device.

The column address counters 30 and 32 are counters to sequentially increment the column address of the data write/read in the burst mode. The column address counters 30 and 32 count up the column address received from the address buffer/register & bank selector 20 in synchronization with the clocks CLK0° and CLK180° supplied from the clock buffer 16, thereby making it possible to read or write the sequential address data. The transfer type of the data using the column address counters 30 and 32 is referred to a burst mode. At the column addresses 30 and 32, the column addresses whose number is the same as that of the data sequentially input or output are generated and supplied to the banks 0 and 1 at each predetermined clock, on the basis of the burst length set to the mode register 28.

Figure 3:
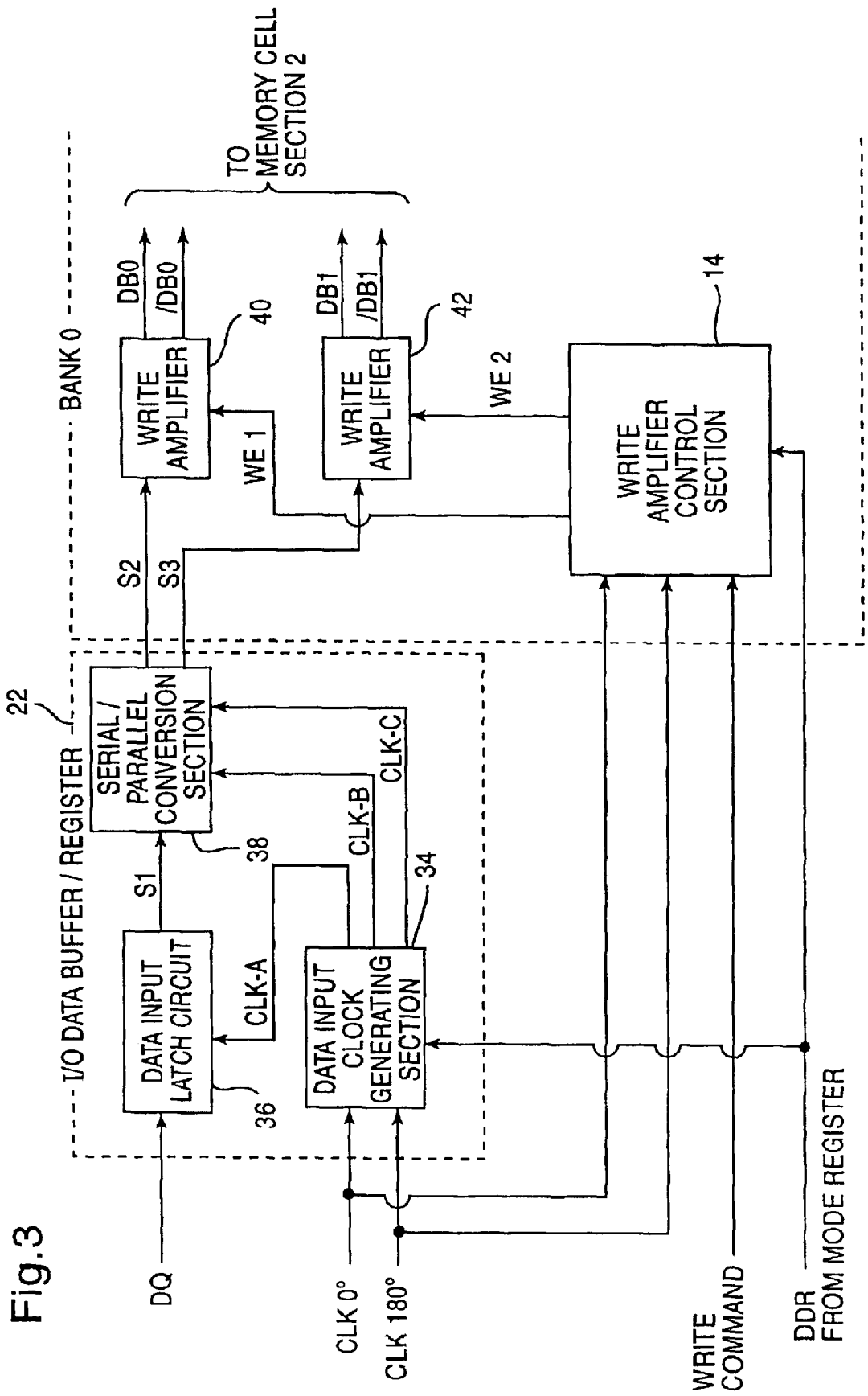
FIG. 3 is a block diagram showing a structure of a data input clock generating section and a write amplifier control section of the semiconductor memory device in the first embodiment of the present invention.

Next, A control method of the SDRAN 1 according to the first embodiment is described with reference to a circuit block diagram in FIG. 3 which shows, when the data is written, the I/O data buffer/register 22, signals supplied to the write amplifier control section 14 and to the write amplifier in the write amplifier/sense buffer 12 in the bank 0, and the flow of signals supplied. It should be noted that though FIG. 3 shows an operation to process either one bit of a bundle of data DQ0–DQn input to the I/O data buffer/register 22, the whole processing of the data DQ0–DQn consisting of actual n+1 bits can also be executed in the same way.

First, the I/O data buffer/register 22 comprises the above-mentioned data input clock generating section 34, a data input latch circuit 36, and serial/parallel conversion section 38 which is a data input/output conversion section. The pulses of the clock signals CLK0° and CLK180° generated at the clock buffer 16 and the DDR signal from the mode register 28 inputs to the data input clock generating circuit 34. The three kinds of signals consisting of a clock signal CLK-A, a clock signal-B, and a clock signal-C are generated at the data input clock generating section 34, where the CLK-A is formed by synthesizing the clock signal CLK0° and the clock signal CLK180°. The CLK-B is formed on the basis of the clock signal CLK0°, and the CLK-C is formed on the basis of the clock signal CLK180°.

The generated clock signal cLK-A is input to the data input latch circuit 36, thereby controlling the external data DQ which input to the data input latch circuit 36. The generated clock signals CLK-B and CLK-C are input to the serial/parallel conversion section 38 connected to an output terminal of the data input latch circuit 36, thereby controlling a signal S1 (=DQ) from the data input latch circuit 36.

When the DDR signal from the mode register 28 is "H" (DDR mode), output signals S2 and S3 controlled by the clock signals CLK-B and CLK-C are output to write amplifiers 40 and 42 in the bank 0 at the serial/parallel conversion section 38. The signal S2, which is a $DQ_{(FIRST)}$ previously input to the data input latch circuit 36, is input to the write amplifier 40. The signal S3, which is a $DQ_{(SECOND)}$ in turn input to the data input latch circuit 36, is input to the write amplifier 42.

On the other hand, the write command WE generated at the command decoder 18 is input to the write amplifier control section 14 in the bank 0 through the control signal latch circuit 24, and the pluses of the clock signals CLK0° and CLK180° from the clock buffer 16 and the DDR signal from the mode register 28 are input. When the write command WE is input and the DDR signal from the mode register 28 is "H", the write amplifier control section 14 simultaneously sets the write control signals WE1 and WE2 "H" to the write amplifiers 40 and 42 with the predetermined interval on the basis of the clock signals CLK0° and CLK180°.

The write amplifiers 40 and 42 output the signals S2 as data DB0 and /DB0 and S3 as data DB1 and /DB1 respectively to the side of the memory cell section 2 during the write control signals WE1 and WE2 are "H". The period in which the write control signals WE1 and WE2 are "H" is actually a data input definite period, and therefore the data can be written.

Thus, when the DDR signal from the mode register 28 is "H" (write operation is executed in the DDR mode), the data $DQ_{(FIRST)}$ and $DQ_{(SECOND)}$ which are input sequentially to the data input latch circuit 36 are converted at a serial/parallel conversion section 38, and thereby the 2 data of $DQ_{(FIRST)}$ and $DQ_{(SECOND)}$ can be simultaneously output to the write amplifiers 40 and 42 respectively.

On the other hand, when the DDR signal from the mode register 28 is "L" (write operation is executed in the SDR mode), the clock signals CLK-B and CLK-C are fixed at "H" level not to generate a pulse at the data input clock generating section 34, so that the period of the signals S2 and S3 are defined only by the clock signal CKL-A which inputs to the data input latch circuit 36.

When the DDR signal from the mode register 28 is "H" separate signals $DQ_{(FIRST)}$ and $DQ_{(SECOND)}$ are output to the signals S2 and S3, while when the DDR signal from the mode register 28 is "L", the data $DQ_{(FIRST)}$ or $DQ_{(SECOND)}$ identical to both of the signals S2 and S3 at the same time is output. Therefore, the same data at the same time are input to the write amplifiers 40 and 42.

On the other hand, the write amplifier control section 14, in case the DDR signal from the mode register 28 is "L", alternatively sets the write control signals WE1 and WE2 to the write amplifiers 40 and 42 as "H" at the predetermined interval on the basis only of the clock signal CLK0°. Therefore, the data Db0 and /Db0, and DB1 and /DB1 can be alternatively output from the write amplifiers 40 and 42 to the side of the memory cell section 2 with a cycle twice as long as that in the DDR mode. This is equivalent to executing the same SDR operation as the conventional SDRAM. For example, the test and evaluation can be made by the use of the memory test equipment corresponding only to the conventional SDR mode without buying and preparing new memory test equipment for the SDRAM which operates in the DDR mode having a clock frequency twice as high as the conventional one as the memory test equipment to use for the circuit evaluation. Thus, as long as it is a semiconductor memory device in the first embodiment, the memory test equipment can be used together with the one for the conventional SDRAM, so that the burden of the test evaluation can be reduced and an increase in investment for the equipment can be suppressed.

Next, an example of a more detailed circuit structure of the data input clock generating section 34, the serial/parallel conversion section 38, and the write amplifier control section 14 of the SDRAM in the first embodiment described with reference to FIG. 3 is described with reference to FIG. 4.

First, an example of the circuit structure of the data input clock-generating section 34 is described. Two three-input NAND circuits 50 and 52 are provided at the side of the signal input of the data input clock-generating section 34. The clock signal CLK0° and the write command WE are input to two-input terminals of the NAND circuit 50 and the rest of the input terminals are continuously maintained in the "H" state. To the NAND circuit 52, the clock signal CLK180°, the write command WE, and the DDR signal are input. Also, the DDR signal is input to an inverter 62.

An output terminal of the NAND circuit 50 is connected to an inverter 56 and to one of the input terminals of the two-input NAND circuit 54, while an output terminal of the NAND circuit 52 is connected to an inverter 60 and to the other terminal of the two-input NAND circuit 54. An output of the NAND circuit 54 is input to the data input latch circuit 36 in the I/O data buffer/register 22 as the clock signal CLK-A.

An output terminal of the inverter 56 is connected to one of the input terminals of a two-input NOR circuit 66, while one of the terminals of a capacitor 58 for the signal delay is connected between the inverter 56 and the NOR circuit 66. The other terminal of the capacitor 58 is, for example, maintained at the ground potential. Similarly, an output terminal of the inverter 60 is connected to one of the input terminals of a two-input NOR circuit 68, while one of the terminals of a capacitor 64 for the signal delay is connected between the inverter 60 and the NOR circuit 68. The other terminal side of the capacitor 64 is, for example, maintained at the ground potential. To the other terminals of the two-input NOR circuits 66 and 68 the output terminal of the inverter 62 are respectively connected.

An output terminal of the NOR circuit 66 is connected to an input terminal of an inverter 70 and then an output of the inverter 70 is input to the serial/parallel conversion section 38 in the I/O data buffer/resister 22 as the clock signal CLK-B. Similarly, an output terminal of the NOR circuit 68 is connected to the input terminal of an inverter 72, while an output of the inverter 72 is input to the serial/parallel conversion section 38 in the I/O data buffer/register 22 as the clock signal CLK-C.

In the data input clock generating section 34 having the above circuit structure, when the DDR signal and the write command WE becomes "H" state, in short, the SDRAM 1 is in a mode to execute the write operation in the DDR type, the output of the NAND circuit 50 becomes "L" when the clock signal CLK0° becomes "H", and "H" when the clock signal CLK0° becomes "L". On the other hand, the output of the NAND circuit 52 becomes "L" when the clock signal CLK180° becomes "H", and "H" when the clock signal CLK0° becomes "L". Since the phase shift between the clock signals CLK0° and 180° is 180°, the clock signal CLK-A synchronizing with both the rising and falling edges of the external clock signal CLK is output as a synthesized signal of the clock signal CLK0° and clock signal CLK180° at the output of the NAND circuit 54 whose two inputs are outputs from the NAND circuits 50 and 52.

Next, a signal which has converted the output of the NAND circuit 50 through the inverter 56 is input to one of the input terminals of the NOR circuit 66 and a signal at "L" level which has converted the DDR signal through the inverter 62 is input to the other of the input terminals of the NOR circuit 66. Therefore, a signal which has converted the clock signal CLK0° is output from the NOR circuit 66. At this time, an output of the NOR circuit 66 becomes a signal output which is delayed the predetermined time from the clock signal CLK0° by the capacitor 58 operating as a signal delay circuit. This signal is input to the inverter 70 to be converted, and the clock signal CLK-B of a like-pole with the predetermined phase shift from the clock signal CLK0° is output from the inverter 70.

Similarly, a signal which has converted the output of the NAND circuit 52 through an inverter 62 is input to one of the input terminals of the NOR circuit 68 and a signal at "L" level which has converted the DDR signal through the inverter 62 is input to the other terminal. Therefore, a signal which has converted the clock signal CLK180° is output from the NOR circuit 68. At this time, the output of the NOR circuit 68 becomes a signal output delayed the predetermined time from the clock signal CLK180° by the capacitor 64 operating as a signal delay circuit. This signal is input to an inverter 72 to be converted and the clock signal CLK-C of a like-pole with the predetermined phase shift from the clock signal CLK180° is output from the inverter 72.

Though the signal output of the data input clock generating section 34 when the DDR signal is "H" is described above, a signal output when the DDR signal is "L" and the write command WE is in "H" state, in short, in the mode in which the SDRAM 1 executes the write operation in the SDR type, is described next. First, since two-input terminals are maintained at "H", a signal in response to the state transition of the clock signal CLK0° is output from the 3-input NAND circuit 50. On the other hand, the output signal of the 3 input NAND circuit 52 is always "H" regardless of the state transition of the clock signal CLK180° because the DDR signal is maintained at "L" and the write command WE is maintained at "H". Therefore, a signal in synchronization with the clock signal CLK0°, in short, the clock signal CLK-A in synchronization with the rising edge of the external clock signal CLK, is output from the output of the NAND circuit to which the outputs from these NAND circuits 50 and 52 are input.

Next, a signal converted from the output of the NAND circuit 50 through the inverter 56 is input to one of the input terminals of the NOR circuit 66 and a signal at "H" level converted from the DDR signal through the inverter 62 is input to the other terminal. Therefore, the output of the NOR circuit 66 continuously becomes "L", and the clock signal CLK-B which is continuously maintained "H" after inputting to and converted by the next stage inverter 70 is output. Similarly, when the DDR signal is "L", the clock signal CLK-C continuously maintained at "H" is output also from the NOR circuit 68.

Figure 5:
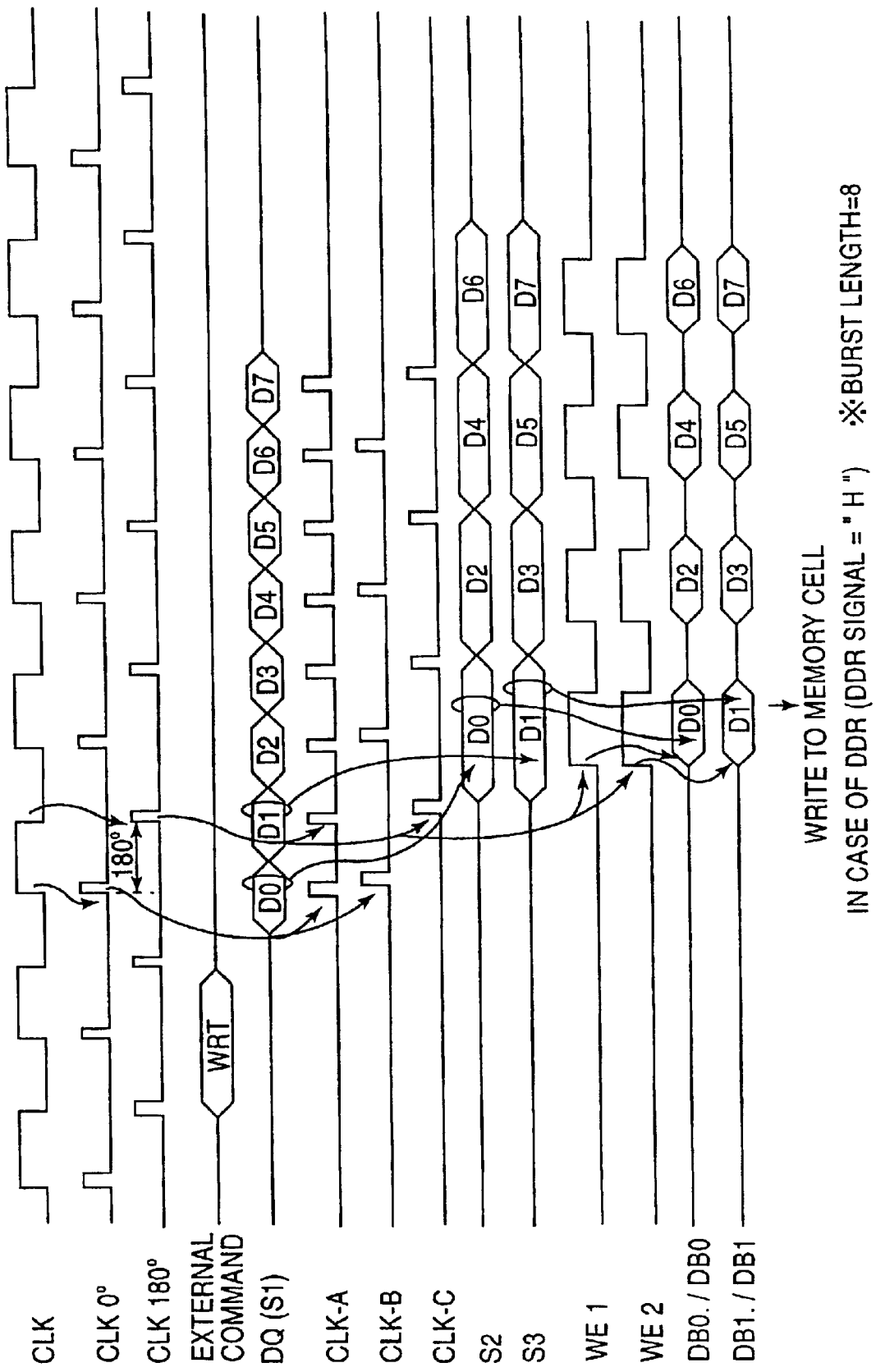
FIG. 5 is a timing chart showing a control method of a write operation in the DDR mode of the semiconductor memory device in the first embodiment of the present invention.
Figure 6:
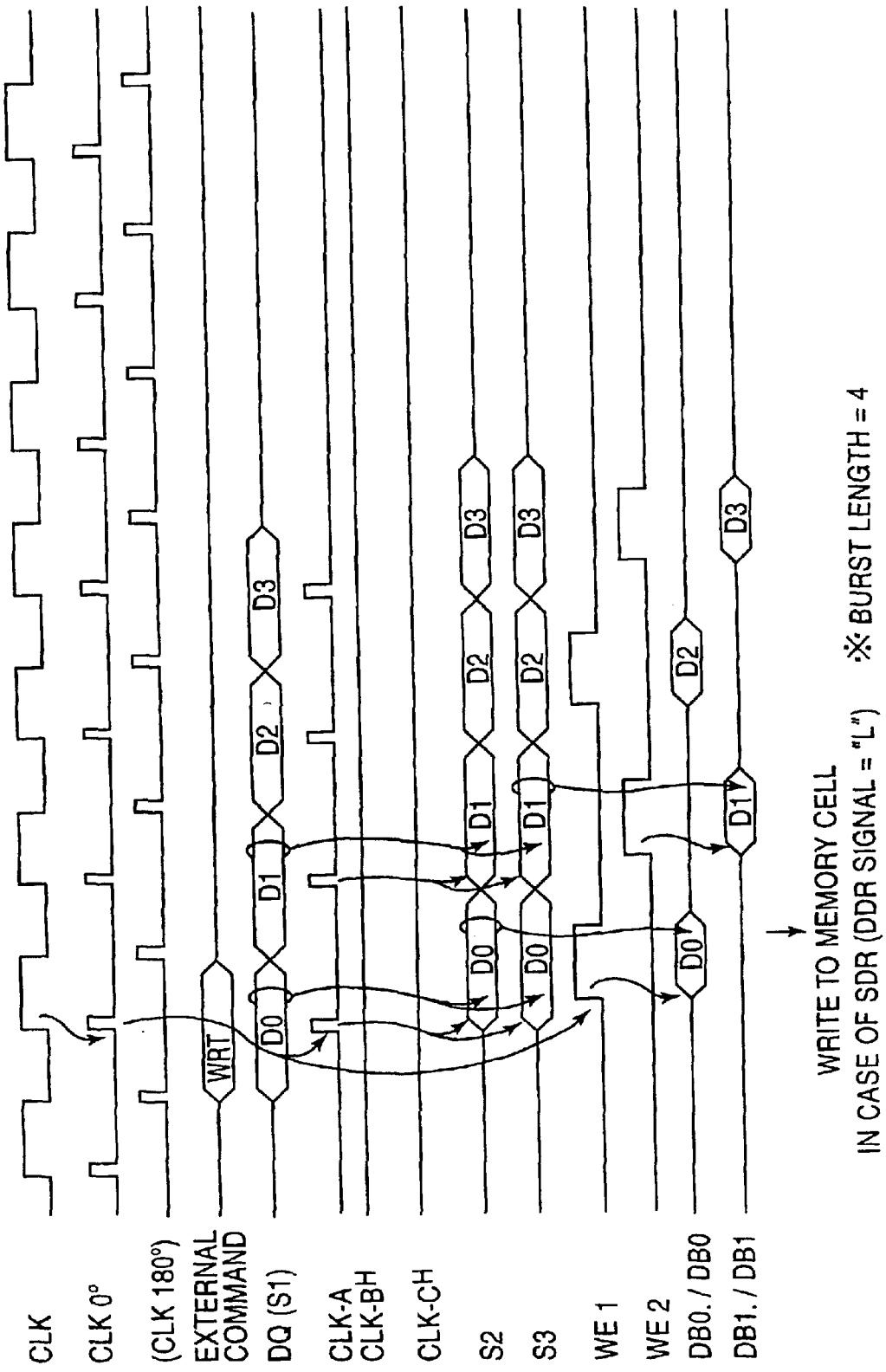
FIG. 6 is a timing chart showing a control method of a write operation in the SDR mode of the semiconductor memory device in the first embodiment of the present invention.

An operation of the data write clock generating section 34 is further described with reference to timing charts in FIG. 5 and FIG. 6. FIG. 5 shows the timings (burst length is 8) of the write operation of the SDRAM 1 when the DDR signal is "H". FIG. 6 shows timings (burst length is 4) of the write operation of the SDRAM 1 when the DDR signal is "L". In the write operation in the DDR mode as shown in FIG. 5, using the clock signals CLK0° and CLK180° respectively generated at the clock buffer 16 in synchronization with both of the rising and falling edges of the external clock signal CLK so that the clock signal CLK-A is generated by synthesizing both of the clock signals CLK CLK0° and CLK180°, the clock signal CLK-B is generated from the clock signal CLK0° with the predetermined time delay, and the clock signal CLK-C is generated from the clock signal CLK180° with the predetermined time delay. On the other hand, in the write operation in the SDR mode as shown in FIG. 6, the clock signal CLK-A is generated on the basis of the clock signals CLK CLK0°, thereby maintaining the clock signal CLK-B and CLK-X at "H".

Next, returning to FIG. 4, an example of the circuit structure of the data input latch 36 to which the clock signal CLK-A is input and the serial/parallel conversion section 38 to which the CLK-B and CLK-C are input are described. The write data (DQ) transferred from the data lines (omitted in FIG. 4) connected to a pad (pad) is input to the data input latch circuit 36. The data input latch circuit 36 latches the DATA DQ in synchronization with the clock signal CLK-A input from the data input clock generating section 34, and then transfers it to the serial/parallel conversion section 38 as a signal S1.

The serial/parallel conversion section 38 has a latch circuit 82 consisting of two inverters 84 and 86, where one output is the input for the other to latch the signal S1 from the data input latch circuit 36. Also, the signal S1 is input also to a latch circuit 88 consisting of inverters 90 and 92 through a transfer gate circuit 74. The transfer gate circuit 74 is formed by connecting a n-channel MOSFET 76 and p-channel MOSFET 78 in parallel, where ON/OFF of the n-channel MOSFET76 is controlled by the level of the clock signal CLK-B and ON/OFF of the p-channel MOSFET 78 is controlled according to the output from an inverter 80 reversing the level of the clock signal CLK-B. Therefore, when the clock signal CLK-B becomes "H", the n-channel MOSFET 76 and p-channel MOSFET 78 become ON state, and the signal flows to the transfer gate circuit 74. When the clock signal CLK-B becomes "L", the n-channel MOSFET76 and p-channel MOSFET78 become OFF state, and the signal is discontinued at the transfer gate circuit 74. A transfer gate circuit 94 consisting of an n-channel MOSFET 98 and p-channel MODFET 96 is provided at the next stage of the latch circuit 82. Also, at the next stage of the latch circuit 88, a transfer gate circuit 100 consisting of an n-channel MODFET 102 and a p-channel MOSFET 104 is provided. The clock signal CLK-C is input to the gate of the n-channel MODFET's 98 and 102 in the transfer gate circuits 94 and 100, and ON/OFF is controlled by the level of the clock signal CLK-C. Also, the clock signal CLK-C is reversed at an inverter and then input to the gate of the p-channel MOSFET's 96 and 104 in the transfer gate circuits 94 and 104. So that, when the clock CLK-C become "H", a signal flows to the transfer gates 94 and 100, thereby cutting off the signal at the transfer gates 94 and 100.

Latch circuits 108 and 114 are respectively provided at the next stage of the transfer gate circuits 94 and 100. The latch circuit 108 has two inverters 100 and 112 in which one output is the input for the other and this maintains the data maintained at the latch circuit 82 as the signal S3 when it is input through the transfer gate circuit 94. On the other hand, the latch circuit 114 has two inverters 116 and 118 in which one output is the input for the other, also maintaining the data maintained at the latch circuit 88 as the S2 when they are input through the transfer gate circuit 100.

The signal S2 maintained at the latch circuit 114 is output to the write amplifier 40 in the bank 0. The signal S3 maintained at the latch circuit 108 is output to the write amplifier 42. A write operation of the serial/parallel conversion section 38 having the above circuit structure, when the DDR signal and the write command WE are in "H" state, in short, when the SDRAM 1 is in the DDR mode, is described with reference to FIG. 4 and FIG. 5. First, the data D0 inputs to the data input latch circuit 36 through the data pad, and then latches at the rising edge of the clock signal CLK-A. Next, since the clock signal CLK-B which rises with the predetermined time delay from the clock signal CLK-A becomes "H", the transfer gate circuit 74 becomes conductive state and the data D0 is maintained as the signal S1 at the latch circuits 88 and 82.

Next, at the data input latch circuit 36, the next data D1 is latched at the rising edge of the clock signal CLK-A and then is input to the serial/parallel conversion section 38 as the signal S1. At this time, because the clock signal CLK-B remains "L", the signal is discontinued at the transfer gate circuit 74, thereby keeping the data D0 without the input of the signal S1 to the latch circuit 88. On the other hand, the latch circuit 82 changes the data holding content from D0 to D1 by the signal S1.

Next, the clock signal CLK-C rising with the predetermined time delay from the clock signal CLK-A becomes "H", so making the two transfer gate circuits 94 and 100 conductive. And the data D0 maintained at the latch circuit 88 is maintained at the latch circuit 114 and then is input to the write amplifier 40 as the signal S2, and the data D1 maintained at the latch circuit 82 is maintained at the latch circuit 108 and then is input to the write amplifier 42 as the signal S3.

Thus, when the DDR signal is "H", the signals S2 and S3 which maintain each different data are maintained while the transfer gate circuits 94 and 100 are in the conductive state, and the data of the signals S2 and S3 are sequentially updated every time the transfer gate circuits 94 and 100 becomes conductive. Since the transfer gate circuits 94 and 100 are controlled by the clock signal CLK-C, consequently, the data of the S2 and S3 are updated with a clock pulse interval of the clock signal CLK-C.

In an example shown in FIG. 5, the burst length is 8 and eight data of D0~D7 are sequentially input, thereby latching these data by the clock signal CLK-A generated in synchronization with both the rising and falling edges of the external clock signal CLK. Therefore, the eight data D0~D8 are read to the SDRAM 1 with a time delay as long as 4 cycles of the clock signal CLK. In short, the write operation in the DDR mode is executed.

Thus, at the serial/parallel conversion section 38, the bit data sequentially input are sequentially converted to two-bit in parallel and then are output. Therefore, by arranging the same number (for example, 16 of DQ 0~D15) of serial/parallel conversion sections 38 as the data in parallel, the 16 bit data sequentially input to the I/O data buffer/register 22 are arranged in two parallel lines, thus making it possible to output to the bank 0.

Figure 4:
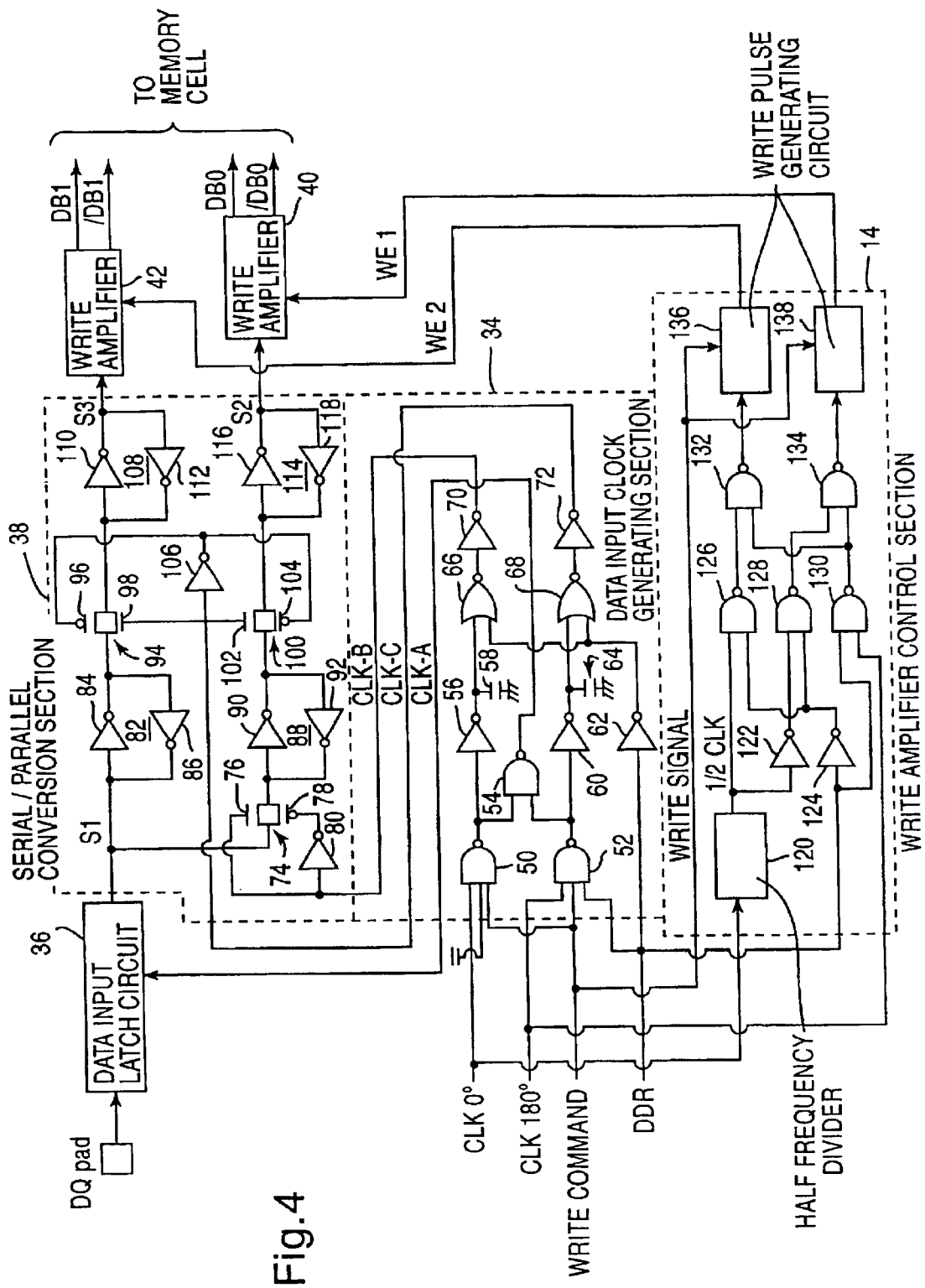
FIG. 4 is a circuit diagram showing an example of a circuit structure which has a data input clock generating section, a serial/parallel conversion section, and a write amplifier control section of the semiconductor memory device in the first embodiment of the present invention.

Next, a case in which the DDR signal is in "L" state at the serial/parallel conversion section 38, in short, a case in which the SDRAM 1 executes the write operation in the SDR mode, is describe with reference to FIG. 4 and FIG. 6. First, the data D0 inputs to the data input latch circuit 36 through the data pad, so being latched at the rising of the clock signal CLK-A. As has been mentioned above, since the circuit of the data input clock generating section is formed to make the clock signal CLK-B and clock signal CLK-C continuously "H" when the DDR signal is "L", the transfer gate circuits 74, 94 and 100 are continuously in the conductive state. And after the data D0 is maintained at both of the latch circuits 88 and 82 as a signal S1, it is maintained at the latch circuits 114 and 108 as it is and then is input to the write amplifiers 40 and 42 as a signal S3.

Thus, when the DDR signal is "L", the signals S2 and S3 which maintain the same data are sequentially updated every time the clock signal CLK-A becomes "H".

In an example shown in FIG. 6, the burst length is 4, four data of D0~D3 are sequentially input, and these data are latched by the clock signal CLK-A generated in synchronization with the rising edge of the external clock signal CLK. Therefore, the four data D0~D3 are input into the SDRAM 1 with delays of up to four cycles of the external signal CLK. In short, the write operation in the SDR mode is executed.

Next, returning to FIG. 4, an example of the circuit structure of the write amplifier control section 14 is described. First, the DDR signal is input to each one terminal of an inverter 124 and a two-input NAND circuit 130. An output terminal of the inverter 124 is connected to each terminals of two two-input NAND circuits 126 and 128. The clock signal CLK0° is input to a ½-frequency divider 120. The clock signal CLK0° inputting to the ½-frequency divider 120 is output from the ½-frequency divider 120 after the number of the clock is thinned out to a half. An output of the ½-frequency divider is input to the other terminal of the NAND circuit 126 and to the inverter 122. Also, the clock signal CLK180° is input to the other terminal of the NAND circuit 130. Further, the write command WE is input to the write pulse generating circuits 136 and 138.

An output terminal of the NAND circuit 126 is connected to one terminal of a two-input NAND circuit 132. Also, an output terminal of the NAND circuit 128 is connected to one terminal of a 2-input NAND circuit 134. Further, an output terminal of the NAND circuit 130 is connected to the other terminals of the two NAND circuits 132 and 134. An output terminal of the NAND circuit 132 is connected to a write pulse generating circuit 136 and an output terminal of the NAND circuit 134 is connected to a write pulse generating circuit 138. The write pulse generating circuit 138 transmits an write enable signal WE1 to the write amplifier 40 and the write pulse generating circuit 136 transmits a write enable signal WE2 to the write amplifier 42.

The case in which the DDR signal and the command signal WE are in "H" state at the write amplifier control section 14 having the above circuit structure, in short, the case in which the SDRAM 1 executes the write operation in the DDR mode, is described with reference to FIG. 4 and FIG. 5. First, since the DDR signal is "H", a signal which changes corresponding to the state transition of the clock CLK180° is output from the NAND circuit 130. Also, The outputs of the NAND circuits 126 and 128 to which the "L" signal reversed from the DDR signal is continuously input are maintained at "H" level. Therefore, from the NAND circuit 132 which executes a NAND processing between the outputs of the NAND circuits 126 and 130, a signal which changes corresponding to the state transition of the clock CLK180° is output to the write pulse generating circuit 136.

On the other hand, also from the NAND circuit 134 which executes a NAND processing between the outputs of the NAND circuits 128 and 130, a signal which changes corresponding to the state transition of the clock CLK180° is output to the write pulse generating circuit 138. Therefore, in the write operation in the DDR mode, the write enable signals WE1 and WE2 are simultaneously output from the write pulse generating circuits 138 and 136 to the write amplifiers 40 and 42. It should be noted that each width of the enable periods of the write enable signals WE1 and WE2 is adjusted in each of the write pulse generating circuits 138 and 136.

Therefore, the write enable signals WE1 and WE2 are transmitted to the write amplifiers 40 and 42 in synchronization with the data output of the signals S2 and S3 updated with the interval of the clock pulse of the clock signal CLK-C from the serial/parallel conversion section 38. The write amplifier 40 which receives the enable signal WE1 sends data DB0 and /DB0 to the side of the memory cell section 2 and the write amplifier 42 which receives the enable signal WE2 simultaneously sends the data DB1 and /DB1 to the side of memory cell section 2 as well. Thus, the two bit data is sent in parallel to the memory cell section 2 and is then memorized.

Next, the case in which the DDR signal is in "L" state, in short, the case in which the SDRAM 1 executes the write operation in the SDR mode, is described with reference to FIG. 4 and FIG. 6. Since the DDR signal maintains at "L", an output of the NAND circuit 130 is maintained at "H". The outputs of the NAND circuits 126 and 128 to which "H" signal reversing the DDR signal is input changes according to the state transition of a signal ½ CLK from the ½-frequency divider which thins out the number of the clock of the clock signal CLK0°. Also, since the signal inputting to the NAND circuit 128 is a signal which has reversed the signal ½ CLK at the inverter 122, the output of the NAND circuit 128 becomes a signal which has reversed the output of the NAND circuit 126.

Accordingly, from the NAND circuit 132 which executes the NAND processing between the outputs of the NAND circuits 126 and 130, a signal changing according to the state transition of the signal ½CLK from the ½-frequency divider 120 is output to the write pulse generating circuit 136. On the other hand, from the NAND circuit 134 which executes the NAND processing between the output of the NAND circuits 128 and 130, a signal changing according to the state transition of the signal ½CLK which has reversed the output signal from the ½-frequency divider 120 is output to the write pulse generating circuit 138. Therefore, in the write operation in the SDR mode, the write enable signals WE1 and WE2 are alternatively output from the write generation circuits 138 and 136 to the write amplifiers 40 and 42.

Therefore, from the serial/parallel conversion section 38, the write enable signals WE1 and WE2 are alternatively transmitted to the write amplifiers 40 and 42 in synchronization with the same data output to the write amplifiers 40 and 42 where the data are updated as the signals S2 and S3 with a clock pulse interval of the clock signal CLK-A. The write amplifier 40 which has received the write enable signal WE1 sends the data DB0 and /DB0 to the side of the memory cell section 2, and the write amplifier 42 which has received the write enable signal WE2 in turn sends the DB1 and /DB1 to the side of the memory cell section 2. With this, one bit data is sent serially to the memory cell section 2 and memorized.

It should be noted that an external command input (WRT) shown in FIG. 5 and FIG. 6 is a command to be a trigger for the write operation. In the DDR mode in FIG. 5, the clock signal CLK-A starts latching the data one clock delayed after the external command (WRT) is input. On the other hand, in the SDR mode in FIG. 6, though the data latching by the clock signal CLK-A starts simultaneously with the external command, there are the only difference on the standard in both modes and not the essential one.

As has been described above, according to the semiconductor memory device in the first embodiment, when the semiconductor memory device is tested and evaluated it is possible to use the memory test equipment of the conventional type by switching to the SDR mode. Also, a high-speed data transfer rate can be realized by switching to the DDR mode in case of the actual use.

Figure 7:
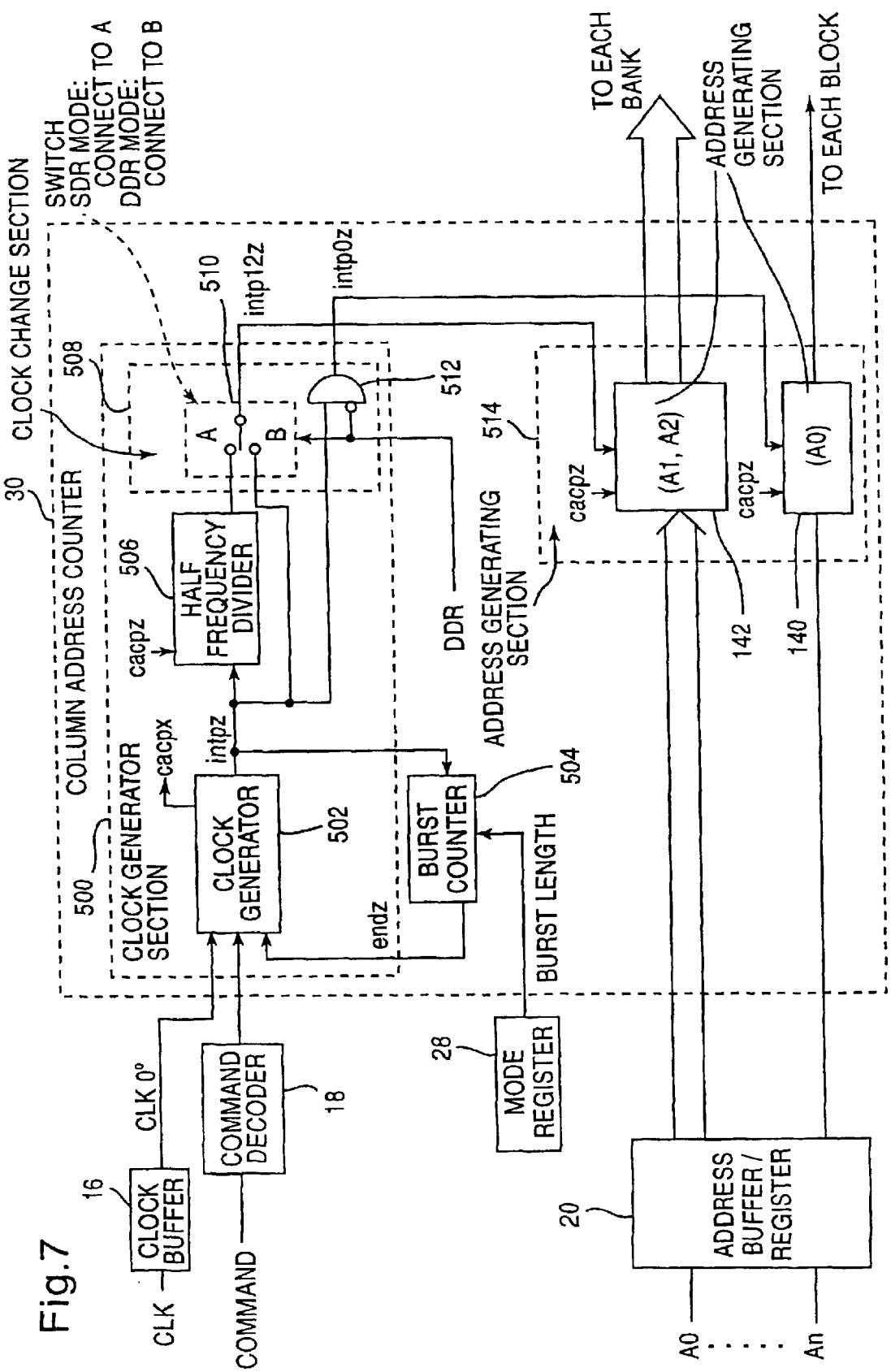
FIG. 7 is a circuit block diagram of a column address counter of the semiconductor memory device in the first embodiment of the present invention.

Next, the column address counter 30 during the data write of the SDRAM 1 according to the first embodiment is described with reference to FIG. 7 and FIG. 20. FIG. 7 shows a circuit block of the column address counter 30.

The column address counter 30 generates a clock signal cacpz as soon as the write/read control signal from the command decoder 18 is input, and in response to the clock signal cacpz, the address generates section 514 inputs the column address A0–An output by the address buffer/register & bank select 20. Along with this, a burst counter 504 generates a burst period signal endz to start a burst operations and a clock generator 502 generates a clock signal intpz in response to a burst length in synchronization with the rising edge of the clock signal CLK0°. On the basis of the clock signal intpz, clock signals intp12z and intp0z are generated, and the column address is counted up at an address generating section 514 by these clock signal intp12z and intp0z to generate sequential addresses. Thus, the column address counter 30, on the basis of the burst length set at the mode register 28, the number of the column addresses having the number of data which is sequentially input or output are generated at every predetermined clock to be supplied to the banks 0 and 1.

In FIG. 7, the clock signal CLKO° generated at the clock buffer 16 inputs to the clock generator 502 provided at a clock generating section 500 in the column address counter 30. Further, the write/read control signal from the command decoder 18 and the burst period signal endz from the burst counter 504 are input at the clock generator 502. The clock generator 502 outputs the clock cacpz for reading the external address and the clock signal intpz for generating the clock signal (intp0z and intp12z) for counting up in the internal generating address. The clock signal intpz output from the clock generator 502 inputs to the ½-frequency divider 506, on terminal B of a two-input switching switch 510 in a clock switch section 508, and one input terminal of a two-input AND circuit 512 in the clock section 508. The ½-frequency divider 506 generates a signal having a cycle twice as long as the clock signal intpz and then outputs to the other terminal A of the switching switch 510. The switching switch 510, on the basis of the level of the DDR signal from the mode register 28, switches the clock signal intpz and the signal having a cycle twice as long as the clock signal intpz. The switching switch 510 selects the terminal A when operating the SDRAM 1 in the SDR mode and the terminal B when operating the SDRAM 1 in the DDR mode. The signal selected by switching is input to an address generation section (A1, A2) 142 in the address generation section 514 as the clock signal intp12z. A signal which has reversed the DDR signal is input to the AND circuit 512 in the clock switch section 508, outputting the clock signal intp0z to an address generating section (A0) 140 on the basis of the level of the DDR signal.

The subordinate addresses A1 and A2 among the addresses A0~An that input to the address buffer/register & bank select 20 are input to the address generating section (A1, A2) 142. The address generating section (A1, A2) 142 outputs the incremented addresses A1 and A2 among the column addresses to each of the bank 0 and 1. On the other hand, the least significant address A0 among the addresses A0~An which are input to the address buffer/register & bank select 20 is input to the address generating section (A0) 140. The address generating section (A0) 140 outputs the address A0 among the column addresses to each of the banks 0 and 1.

Figure 8A:
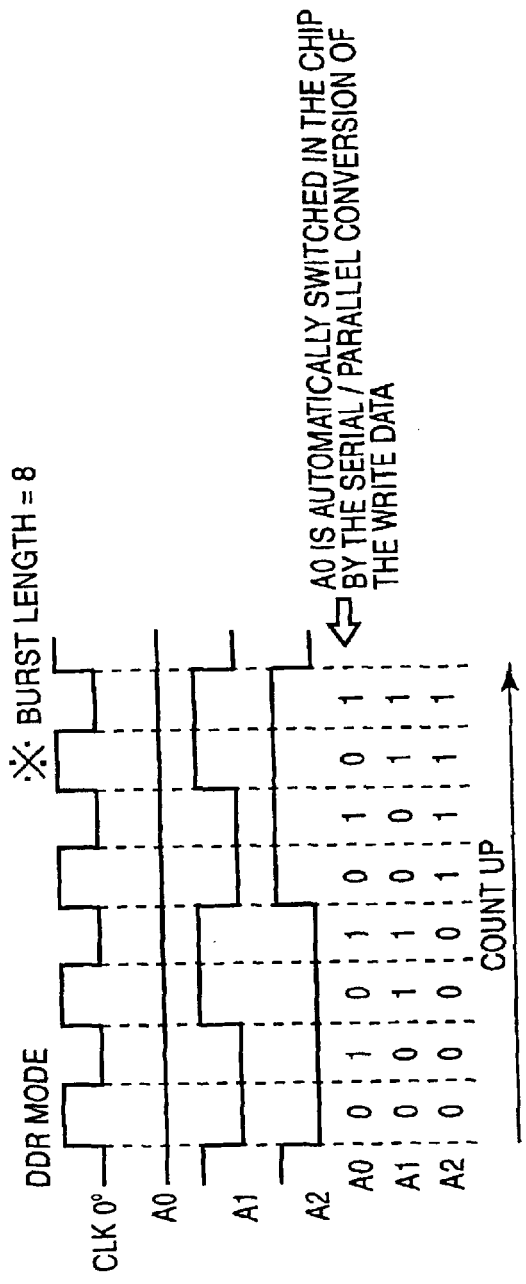
FIG. 8 is a timing chart showing a control method of an operation of the column address counter of the semiconductor memory device in the first embodiment of the present invention.

Next, the operation of the column address counter 30 is described with reference to FIG. 7 and FIG. 8. FIG. 8 is a timing chart showing an example of the operation of the column address counter 30 when the burst length is 8. First, the case in which the DDR signal is in the "H" state, in short, the SDRAM 1 executes the write operation in the DDR mode, is described with reference to FIG. 8(a) and FIG. 7. When the DDR signal at the "H" level inputs to the switching switch 510, the switching switch 510 outputs the clock signal intpz as the clock signal intp12z to the address generating section 142 after connecting to the terminal B. Also, since the inversion signal of the DDR signal at the "H" level is input to the AND circuit 512, the clock signal intp0z which is an output of the AND circuit 512 is retained at the "L" level. When the clock signal intp0z is at the "L" level, the address A0 signal is not output from the address generating section (A0) 140. Therefore, in the burst mode in the DDR mode, the address A0 signal is not output from the address generating section (A0) 140. However, no problem is caused because the address A0 automatically switches in the SDRAM 1 by the serial/parallel conversion of the write data in case of the DDR mode.

Also, when the clock signal intp12z is input to the address conversion section (A, A2), the address (A1, A2) incremented one each corresponding to the clock signal intp12z are output.

Figure 8B:
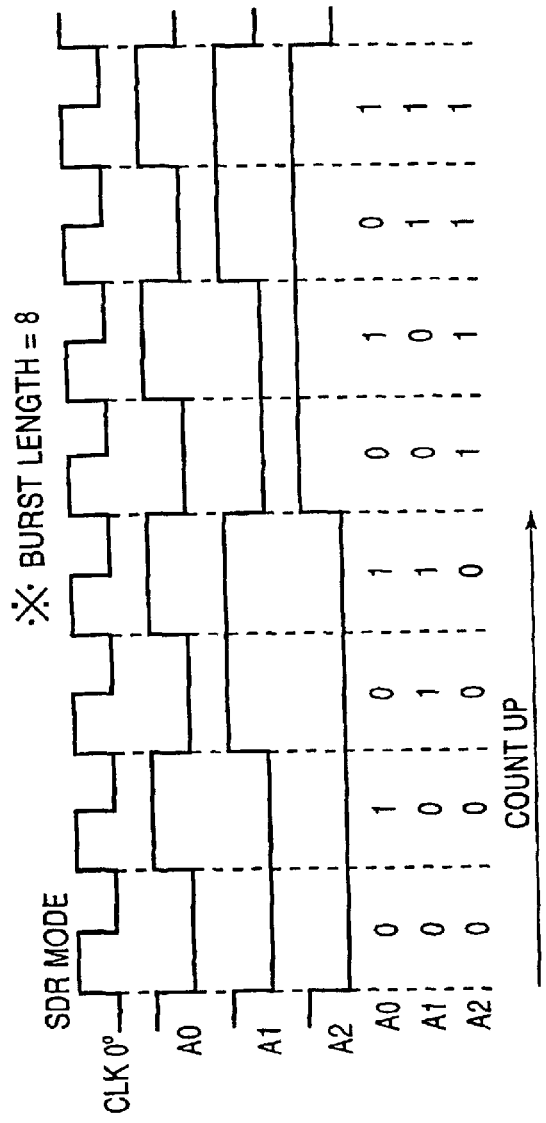

Next, the case in which the DDR signal is in the "L" state, in short, the SDRAM 1 executes the write operation in the SDR mode is described with reference to FIG. 7 and FIG. 8(b). When the DDR signal at the "L" level is input to the switching switch 510, the switching switch 510 outputs a clock signal connecting to the terminal A and having a cycle twice as long as the clock signal intpz to the address generating section 142 as the clock signal intp12z. Also, since the inversed signal of the DDR signal at the "L" level is input to the AND circuit 512, the clock signal intpz is output from the AND circuit 512 as the clock signal intp0z.

The address generating section (A0) 140 outputs the address A0 signal in response to the input clock signal intp0z (=intpz). Also, when the clock signal intp12z (=intpz/2) is input to the address conversion section (A1, A2) 142, the addresses (A1, A2) incremented one each according to the clock signal intp12z are output.

Thus, the column address counters 30 and 32 in the first embodiment can sequentially count up and output the column address of the data write/read in the burst mode at the predetermined timing corresponding to both the DDR mode and the SDR mode.

Next, an example of the circuit structure of the clock generating section 500 is described with reference to FIG. 9. The clock generating section 500 is roughly divided into the clock generator 502, the ½-frequency divider 506, and the clock switch section 508. The clock generator 502 has a D flip-flop (D-FF) 520 triggered at the falling edge of the clock CLK0°. The burst period signal endz output from the burst counter 504 is input to the D-FF 520. The burst counter 504, on the basis of a signal setting the burst length from the mode register 28, becomes "H" state during the burst period when a reset signal RESET is input, thereby generating the burst period signal endz which becomes "L" state as soon as the completion of the burst. The burst counter 504 controls the output of the burst period signal endz by counting the clock signal intpz supplied from the clock generator 502.

An output of the D-FF 520 is input to one of the input terminals of a two-input NAND circuit 522. At the other input terminal of the NAND circuit 522, an output terminal of a rising edge pulsing circuit 526 is connected. The rising edge pulsing circuit 526 generates pluses at the rising edge of the input clock CLK0°, so outputting them to the NAND circuit 522. An output terminal of the NAND circuit 522 is connected to one of the input terminals of a two-input NOR circuit 524. To the other input terminal of the NOR circuit 524, a signal which has reversed the read/write command from the command decoder 18 at an inverter 523 is input. From the NOR circuit 524, the clock signal intpz is output to generate the clocks (intp0z, intp12z) for counting up the internal generating address.

The read/write command from the command decoder 18 is input to a rising edge pulsing circuit 528. The rising edge pulsing circuit 528 generates a clock signal cacpz to input the column address A0~An, which is output from the address buffer/register & bank select 20, to the address generating section 514.

The clock signals cacpz and intpz from the clock generator 502 described above are input to the ½-frequency divider 506, while the clock signals cacpz is input as reset signal RESET and the clock signal intpz is input for generating the burst period signal endz to the burst counter 504 respectively. Further, the clock signal cacpz is also output to the address generating section 514 and the like, which will be later described.

The clock signal cacpz input to the ½-frequency divider 506 is input to a set terminal of a latch circuit 530 and the clock signal intpz is input to a reset terminal of the latch circuit 530 while it is also output to the clock switch section 508. At the other set terminal of the latch circuit 530, the generated clock signal intp12z is input. An output of the latch circuit 530 is output to the clock switch section 508 through a transfer control circuit 532. A transfer control signal ctlpz delayed from the clock signals cacpz and intpz is input to the transfer control circuit 532.

An output of the transfer control circuit 532 is connected to one of the input terminals of a two-input OR circuit 534 in the clock switch section 508. To the other input terminal, the DDR signal from the mode register 28 is input. An output terminal of the OR circuit 534 is connected to one input terminal of a two-input AND circuit 536. To the other input terminal of the AND circuit 536, the clock signal output from the NOR circuit 524 is input. The output of the AND circuit 536 is transmitted to the address generating section (A1, A2), as well as the output is supplied to the latch circuit 530 of the ½-frequency divider 506. The switching switch consists of the OR circuit 534 and the AND circuit 536.

Also, as has been described above, the clock signal intpz output from the clock generator 502 is input to an input terminal of the two-input AND circuit 512 and a signal reversed from the DDR signal is input to the other input terminal.

Figure 10:
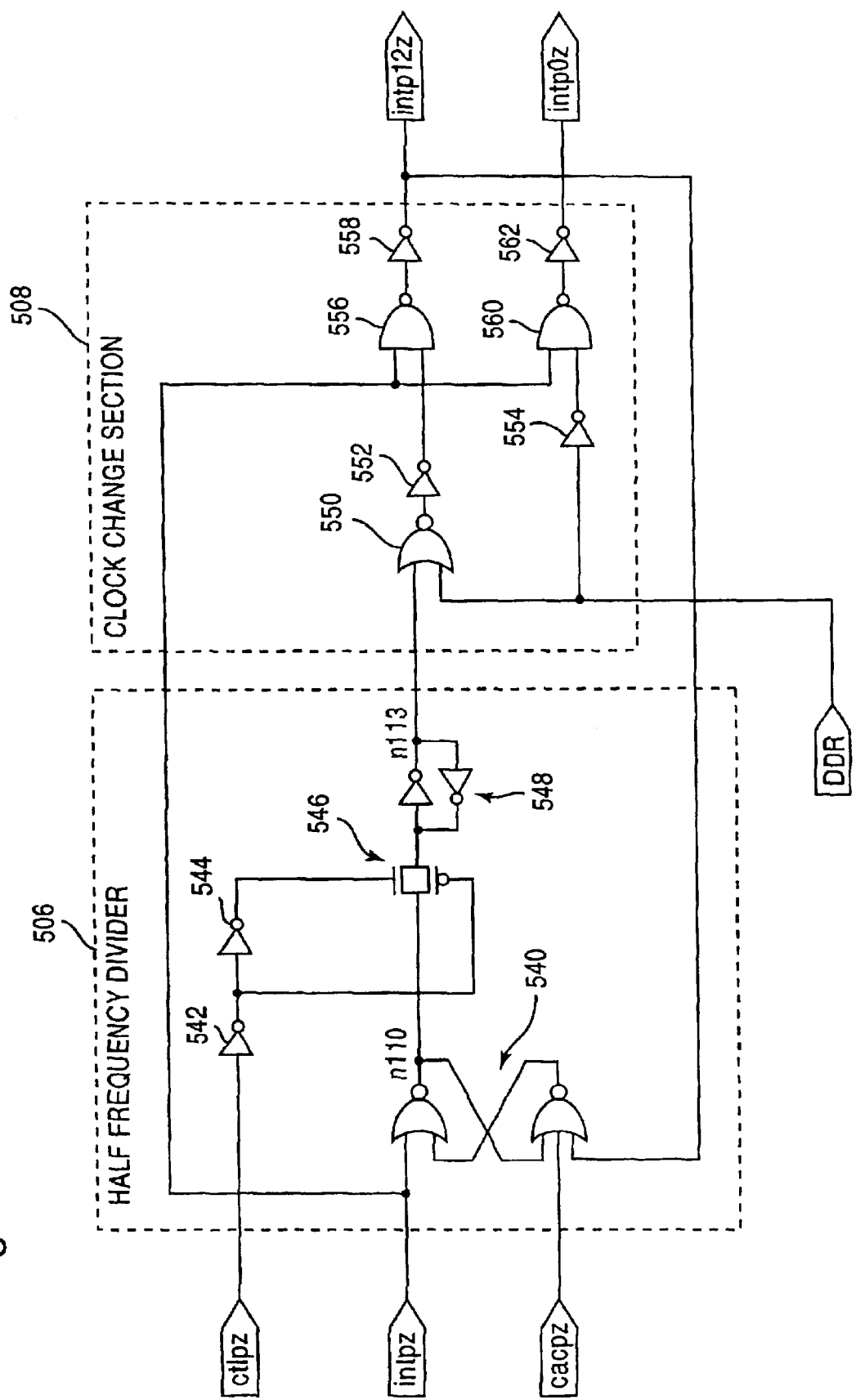
FIG. 10 is a diagram showing a circuit example of a ½-frequency divider and a clock switch section in the column address counter of the semiconductor memory device in the first embodiment of the present invention.

FIG. 10 shows a more detailed example of the circuit of the ½-frequency divider 506 and the clock switching switch 508. In FIG. 10, a RS flip-flop (RS-FF) 540 is used as the latch circuit 530 in the ½-frequency divider 506. As the transfer control circuit 532, the ½-frequency divider 500 has a transfer gate circuit 546 and a latch circuit 548, where the transfer gate circuit 546 is formed by connecting a p-channel MOSFET and n-channel MOSFET in parallel and the latch circuit 548 consists of two inverters in which the output of one is the other's input. Furthermore, an inverter 542 which reverses the clock signal ctlpz inputs to a transfer gate circuit 546 and an inverter 544, which reverses again the signal reversed at the inverter 542 are provided.

As a configuration element of the switching switch 510 in the clock switch section 508 a two-input NOR circuit 550, which has one of the input terminals to input a signal n113 latched at a latch circuit 548 in the ½-frequency divider is provided. The DDR signal is input to the other input terminal of the NOR circuit 550. An output terminal of the NOR circuit 550 is connected to a two-input NAND circuit 556 through an inverter 552. The clock signal intpz inputs to the other input terminal of the NAND circuit 556. An output of the NAND circuit 556 inputs to the address generating section 514 through an inverter 558 as the clock signal intp12z, and at the same time inputs to the set terminal of the RS-FF 540. To a NAND circuit 560, the clock signal intpz and a signal is reversed from the DDR signal at an inverter 554 are input. An output terminal of the NAND circuit 560 is connected to an inverter 562, thus outputting the clock signal intp0z.

Figure 11:
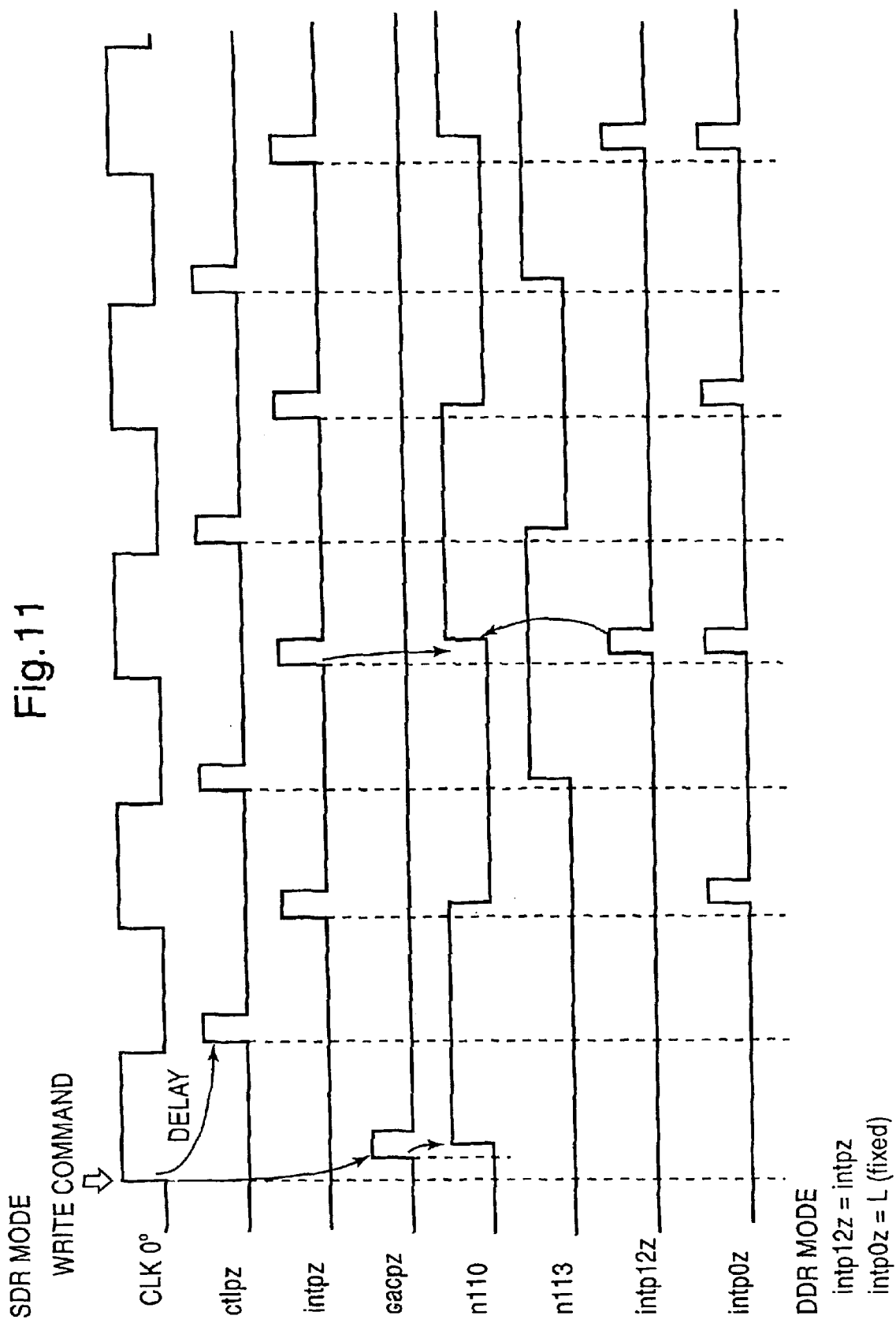
FIG. 11 is a timing chart showing an operation of the clock generation section in the column address counter of the semiconductor memory device in the first embodiment of the present invention.

An operation during the data write in the SDR mode of the column address counter 30 having the structure in FIG. 9 and FIG. 10 is shown in a timing chart in FIG. 11. First, when the write command from the command decoder 18 is input to the clock generating section 502 at the rising edge of the clock 0°, the clock signal cacpz is generated by the rising pulsing circuit 528 with the predetermined delay time. The clock signal cacpz resets the burst counter 504 and at the same time inputs to the set terminal of the latch circuit 530 in the ½-frequency divider 506.

When the burst counter 504 is reset by the clock signal cacpz, it sets the burst period signal endz in "H" state until the clock signal intpz output from the NOR circuit 524 is counted to the predetermined number based on the burst length set from the mode register 28. Therefore, when the clock CLK0° is input to the D-FF 520 and the rising edge pulsing circuit 526, and the burst period signal endz which inputs to a D input terminal of the D-FF 520 becomes "H" state, the clock signal intpz is output from the NOR circuit 524 in synchronization with pulses which are generated on based on the rising edge of the clock CLK0° generated at the rising edge pulsing circuit 526. The burst counter 504 sets the burst period signal endz in "L" state after counting the clock signal intpz up to (burst length-1). After the last clock signal intpz of the same length as the burst length is output from the NOR circuit 524, the output of the clock signal is halted. Thus, the output of the clock signal intpz of the predetermined burst length is obtained.

Next, the operations of the ½-frequency divider 506 and clock switch section 508 are described with reference to FIG. 10 and FIG. 11. When the clock signal cacpz inputs to a set terminal of the RS-FF 540, an output n110 of the RS-FF 540 changes to "H". The clock signal intpz in turn inputs to a reset terminal of the RS-FF 540, thus changing the output n110 of the RS-FF 540 to "L". Next, with the clock signal intpz also input but the state unchanged, the output n110 of the RS-FF 540 changes to "H" by the clock signal intp12z input immediately afterwards to a set terminal of the RS-FF 540. A transfer gate circuit 546 transfers the state of the output n110 to a latch circuit 548 on the basis of the clock signal ctlpz . At the latch circuit 548, a signal n113 reversed from the output n110 is latched. Since the DDR signal is "L" when operated in the SDR mode, an output of the NOR circuit 560 in the clock switch section 508 is equivalent to the clock signal intpz. Also, since an output of the NOR circuit 550 is equivalent to the signal n113, the clock signal intp12z having twice the cycle of the clock signal intp0z is output by taking an AND between the clock signal intpz and the signal n113 at the NAND circuit 556.

Further, as it is clear in FIG. 10, the clock signal intp12z is equal to intpz and the clock signal intp0z is fixed to "L" in the DDR mode.

Figure 12:
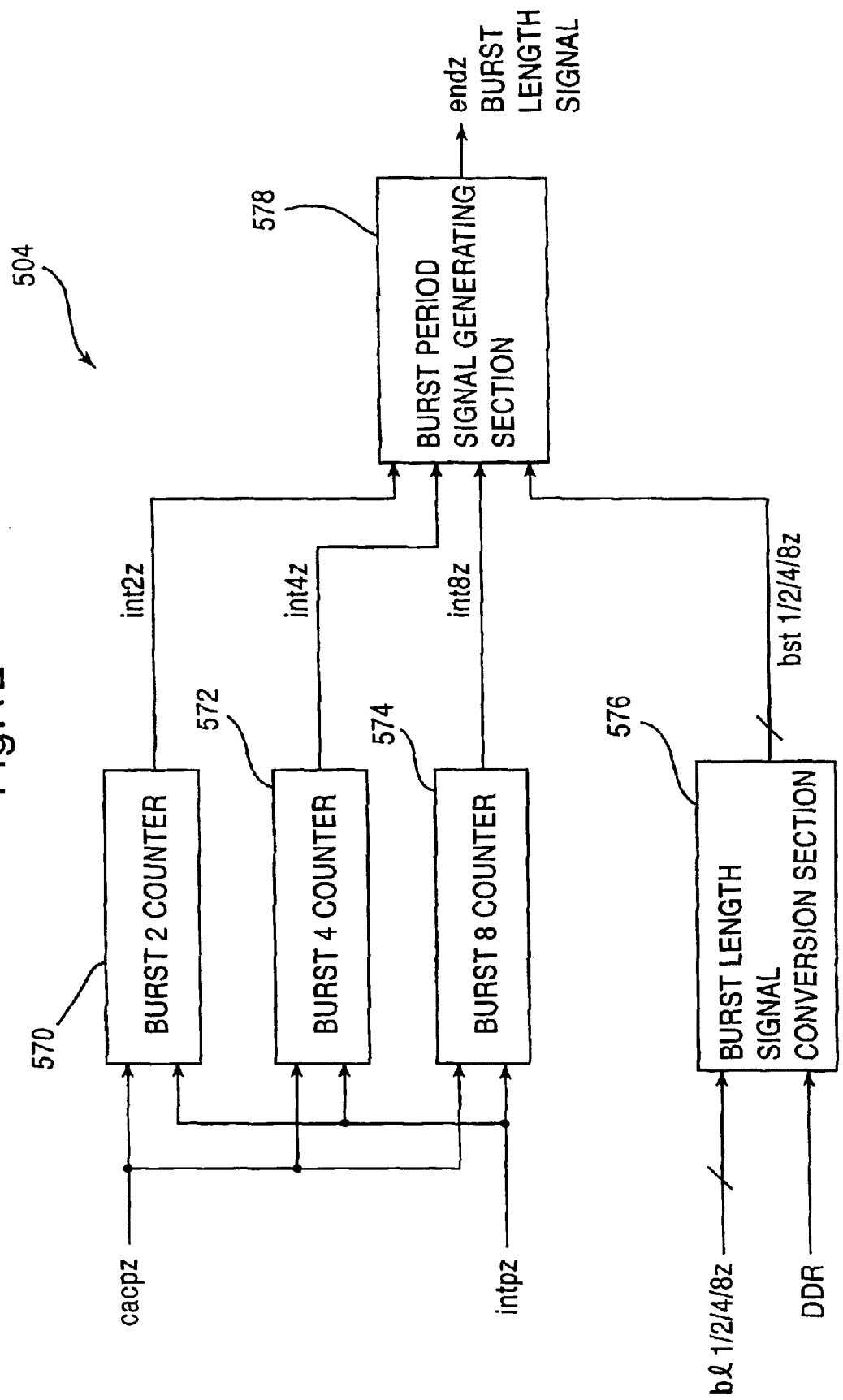
FIG. 12 is a diagram showing a circuit block in a burst counter of the semiconductor memory device in the first embodiment of the present invention.

Next, an example of the circuit of the burst counter 504 is described with reference to FIG. 12 through FIG. 15. As has been described above, the burst counter 504 in the first embodiment is made to count the clock signal intpz generated in synchronization with the rising edge of the clock CLK0°. So, as shown in FIG. 12, the clock signal intpz is supplied respectively to a burst2 counter 570, burst4 counter 572, and burst8 counter 574. Also, the clock signal cacpz to reset the counters 570, 572, and 574 is input to each of the counters. The outputs int2z, int4z, and int8z from these counters are made to input to a burst period signal generating section 578.

By the way, as understood from FIG. 8 showing the case where the burst length is equal to 8, the time required for the burst length is different in the DDR mode and the SDR mode so that the burst time in the DDR mode is half that in the SDR mode. In short, though the burst length in the SDR mode is decided by (the clock signal cacpz+the number of the pulses of the clock signal intpz), the burst length in the DDR mode is (the clock signal cacpz+the number of the pulses of the clock signal intpz)/2. Therefore, the burst length in the DDR mode is required to be converted half that of in the SDR mode. For this purpose, a burst length signal conversion section 576 is provided. To the burst length signal conversion section 576, signals b11z, b12z, b14z, and b18z are input to indicate the burst length from the mode register 28, and furthermore the DDR signal is input. From the burst length signal conversion section 576, signals bst1z and bst4z, and bst8z are output to the burst period signal generating section 578.

Figure 13:
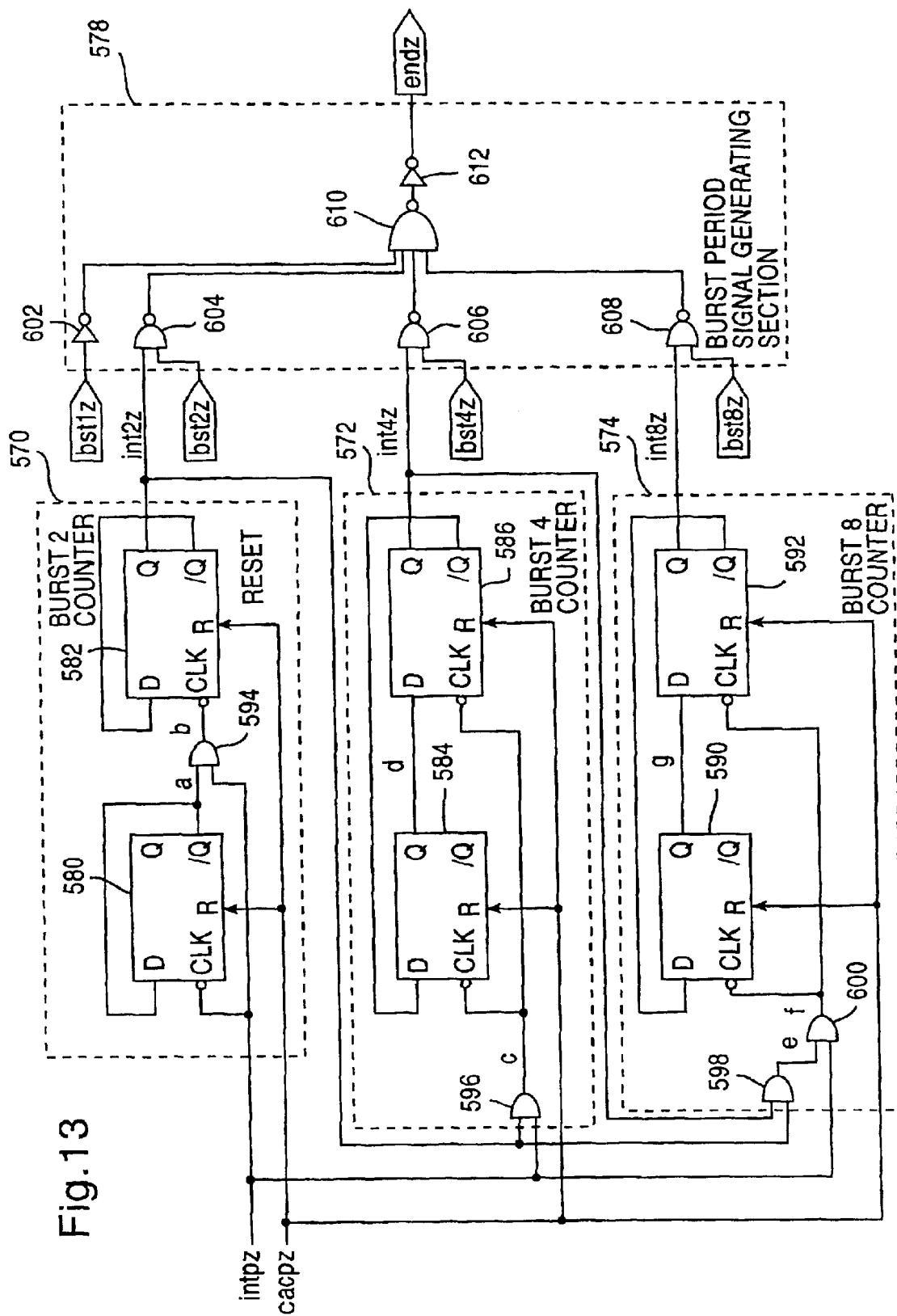
FIG. 13 is a diagram showing a circuit example in a burst counter of the semiconductor memory device in the first embodiment of the present invention.

Next, the structures of each counter 570,572, and 574 and the burst period signal generating section 578 in the burst counter 504 are described with reference to FIG. 13. First, the burst2 counter 570 has a D-FF 580 and a D-FF 582. The clock signal cacpz is input to a reset R input terminal of each of the D-FF 580 and 582. The clock signal intpz is input to a clock input terminal of the low level trigger in the D-FF 580 and to one of the input terminals of a two-input AND circuit 594 which is provided at the front stage of a clock input terminal of the low level trigger in the D-FF 582. A /Q output terminal of the D-FF 580 is connected to the other input terminal of the AND circuit 594 and at the same time it is connected to a D input terminal of the D-FF 580. An output terminal of the AND circuit 594 is connected to a clock input terminal of the D-FF 582. A /Q output terminal of the D-FF 582 is connected to a D input terminal of the D-FF 582 and a Q output terminal of the D-FF 582 is connected to one of the input terminals of a two-input NAND circuit 604 in the burst period signal generating section 578. At the same time, it is connected to one of the input terminals of a two-input AND circuit 596 in the burst4 counter 572 and to one of the input terminal of a two-input AND circuit 598 in the burst8 counter 574.

Next, the burst4 counter 572 has a D-FF 584 and a D-FF 586. The clock signal cacpz is input to each reset R input terminal of the D-FF's 584 and 586. The clock signal intpz is input to the other input terminal of the AND circuit 596. An output terminal of the AND circuit 596 is connected to clock input terminals of the low level triggers of the D-FF's 584 and 586. A Q output terminal of the D-FF 584 is connected to a D input of the D-FF 586. A Q output terminal of the D-FF 586 is connected to a D input terminal of the D-FF 584. A Q output terminal of the D-FF 586 is connected to one of input terminals of a two-NAND circuit 606 in the burst period signal generating section 578 and at the same time to the other input terminal of the two-input AND circuit 598 in the burst8 counter 574.

Next, the burst8 counter 574 has a D-FF 590 and D-FF 592. The clock signal cacpz is input to a reset R input terminal of each of the D-FF's 590 and 592. The clock signal intpz is input to one of input terminals of an AND circuit 600. An output terminal of the AND circuit 598 is connected to the other input terminal of the AND circuit 600. An output terminal of the AND circuit 600 is connected to clock input terminals of the low level trigger of the D-FF's 590 and 592. A Q output terminal of the D-FF 590 is connected to a D input terminal of the D-FF 592. A /Q output terminal of the D-FF 592 is connected to a D input terminal of the D-FF 590. A Q output terminal of the D-F 592 is connected to one of input terminals of a two-input NAND circuit 608 in the burst period signal generating section 578.

To each of the other terminals of the NAND circuits 604, 606, and 608 in the burst period signal generating section 578, each signal of bst2z, bst4z, and bst8z for a burst length conversion from the burst length signal converter 576 are respectively input. Those output terminals of the NAND circuits 604,606, and 606, are connected to an input terminal of a four-input NAND circuit 610. Also, a signal bst1z for the burst length conversion is connected to an input of a NAND circuit 610 through an inverter 602. An output of the NAND circuit 610 is input as the burst period signal endz to an input terminal of the D-FF 520 in the clock generating section 502 through an inverter 612.

Figure 14:
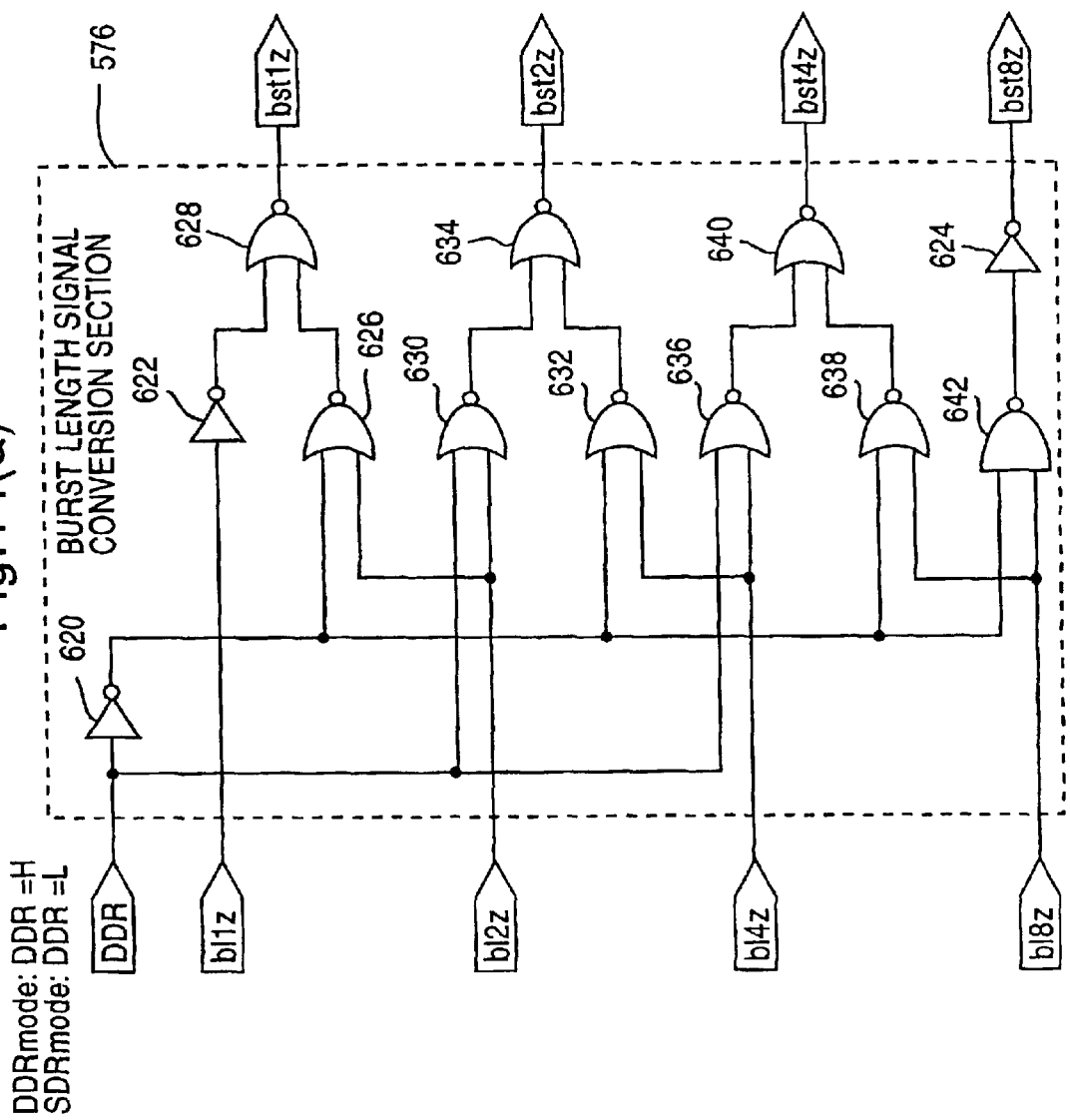
FIG. 14 is a diagram showing a circuit example in a burst counter of the semiconductor memory device in the first embodiment of the present invention.

Next, an example of the structure of the burst length signal conversion section 576 is described with reference to FIG. 14. In FIG. 14, the DDR signal and signals b11z, b12z, b14z, and b18z indicating the burst length are input from the mode register 28 to the burst length signal conversion section 576. For example, when the burst length is equal to 4, only the signal b14z becomes "H". The DDR signal is input to each one of the input terminals of an inverter 620 and two-input NOR circuits 630 and 636. An output terminal of the inverter 620 which outputs the DDR signal after reversing it is connected to each one of input terminals of two-input NOR circuits 626, 632, 638, and a two-input NAND circuit 642 respectively.

Also, the signal b11z indicating that the burst length is equal to 1 is input to an inverter 622. The signal b12z indicating that the burst length is equal to 2 is input to each of the other input terminals of the NOR circuits 626 and 630 respectively. The signal b14z indicting that the burst length is equal to 4 is input to each of the other input terminals of the NOR circuits 632 and 636 respectively. The signal b18z indicating that the burst length is equal to 8 is input to the other terminals of the NOR circuit 638 and the NAND circuit 642 respectively.

Output terminals of the inverter 622 and the NOR circuit 626 are connected to input terminals of a two-input NOR circuit 628 and the NOR circuit 628 outputs the signal bst1z. Output terminals of the NOR circuits 630 and 626 are not connected to input terminals of a two-input NOR circuit 634 and the NOR circuit 634 outputs the signal bst2z. Output terminal of the NOR circuits 636 and 628 are not connected to input terminals of a two-input NOR circuit 640 and the NOR circuit 640 outputs the signal bst4z. Also, an output terminal of the NAND circuit 642 is connected to an inverter 624 and the signal bst8z is output from the inverter 624.

FIG. 14(*b*) is a table showing the state of conversion of the burst length signals corresponding to the DDR mode and SDR mode. As shown in FIG. 14(*b*), in the burst length signal conversion section 576 in the first embodiment, for example, when the burst length signal b14z is equal to "H", the signal bst4z is equal to "H" in the SDR mode, so deciding the "H" state of the burst period signal endz by the output signal int4z of the burst4 counter 572, while the signal bst2z is equal to "H" in the DDR mode, so deciding the "H" state of the burst period signal endz by the burst2 counter 570. Thus, even if the same indication signals are received, the burst time in the DDR mode can be made half that of in the SDR mode.

Figure 15:
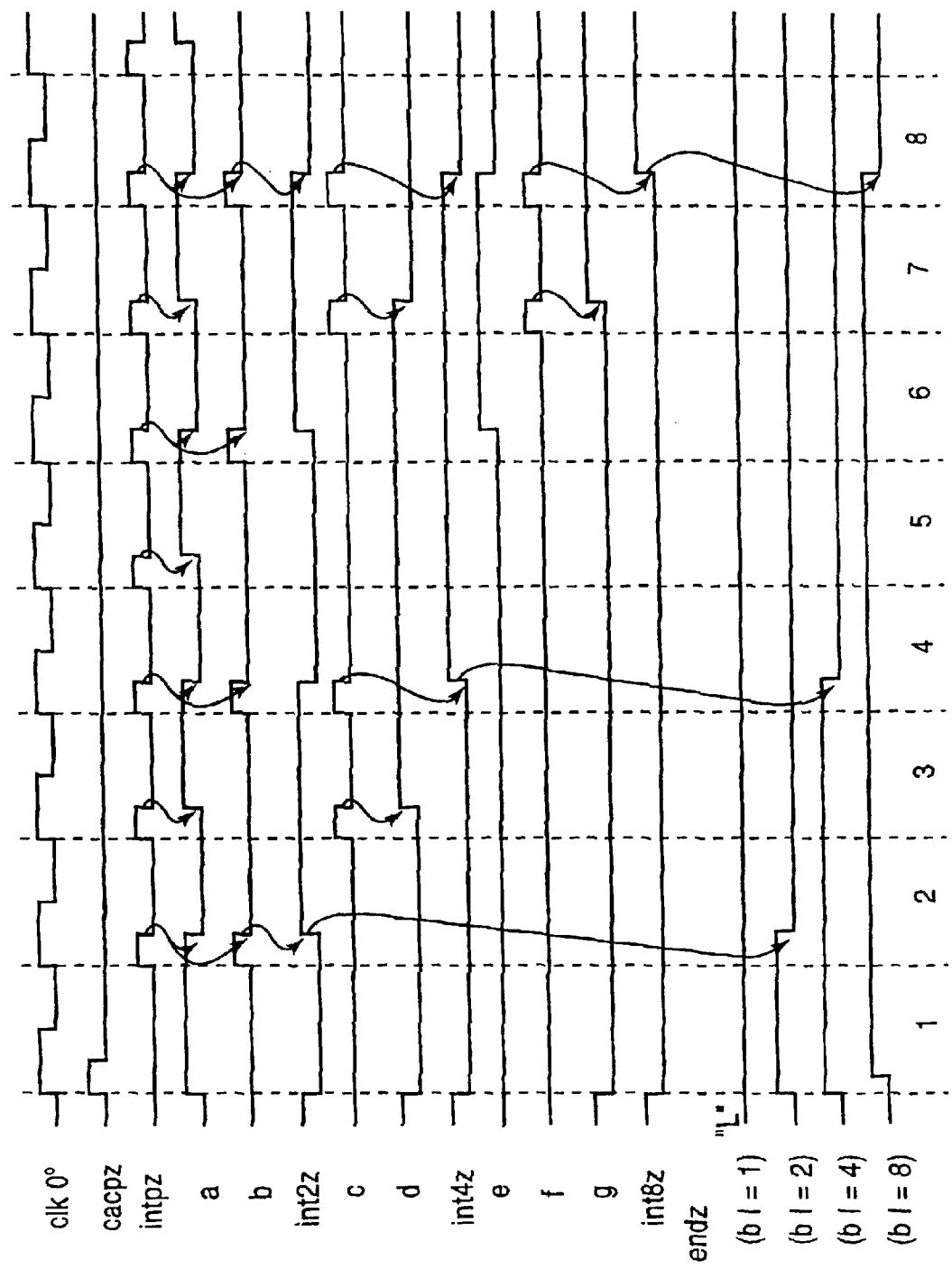
FIG. 15 is a timing chart showing an operation of the burst counter of the semiconductor memory device in the first embodiment of the present invention.

Next, an operation of the burst counter 576 on the basis of the above-mentioned structure is described with reference to a timing chart shown in FIG. 15. In FIG. 15, alphabets a~g designate states of signals at the locations of alphabets a~g and are suitably described with reference to FIG. 13.

At the burst2 counter 570, when the D-FF's 580 and 582 are reset by the clock signal cacpz, the Q terminals of the D-FF's 580 and 582 become "L", the /Q terminals become "H", and the D terminals become "H". Therefore, the signal int2z equal to "L" is output from the Q terminal of the D-FF 582. Next, when one pulse of the clock signal intpz inputs, a clock enters from the AND circuit 594 to the D-FF 582 and the signal int2z being equal to "H" is output from the Q terminal.

At the burst period signal generating section 578, on the basis of the burst length and the DDR signal for the DDR/SDR mode switch, the signals bst1z, bst2z, bst4z and bst8z generated at the burst length signal conversion section 576 are input, so setting one of them "H". When the clock signal cacpz is input to each of the D-FF's 580~592, each of the D-FF's 580~592 is reset, and the signals int2z~8z become equal to "L", the burst period signal endz becomes equal to "H". For example, if the burst indicating signal bst2z is equal to "H", when the clock signal intpz is next input and the signal int2z becomes "H", the burst period signal endz becomes equal to "L" and the burst transfer is completed.

Figure 16:
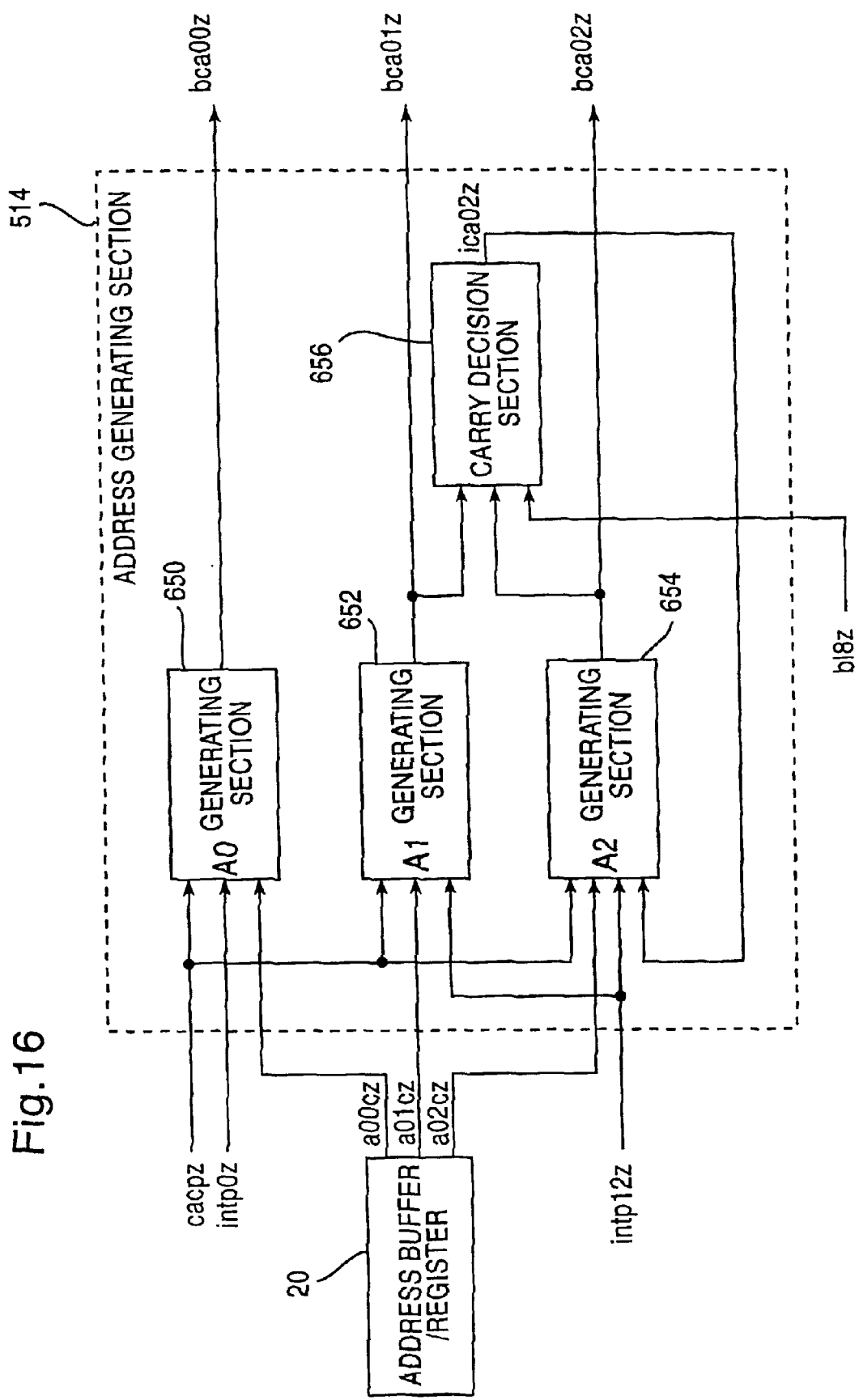
FIG. 16 is a diagram showing a circuit block of an address generating section of the semiconductor memory device in the first embodiment of the present invention.

Next, an example of the specific structure of the address generating section 514 in the first embodiment of the present invention is described with reference to FIG. 16 through FIG. 20. FIG. 16 is a block diagram showing the address generating section 514 in FIG. 7 in more detail. In FIG. 16, an A0 generating section 650 shows a part of the address generating section (A0) in FIG. 7 while an A1 generating section 652 and A2 generating section 654 show a part of the address generating section (A1,A2). Meanwhile, as has been described before, the clock signals cacpz an intp0z are input to the A0 generating section and an external address signal a00cz of the least significant bit of the address is input from the address buffer/register 20. Similarly, the clock signals cacpz and intp12z are input to the A1 generating section and an external address signal a01cz of the second least significant bit of the address is input from the address buffer/register 20. The clock signals cacpz and intp12z are input to the A2 generating section and an external address signal a02cz of the next lower bit of the subordinate bit a01cz is input from the address buffer/register 20.

An address signal bca00z is output from the A0 generating section 650 and an address signal bca01z is output from the A1 generating section 652. Also, an address signal bca02z is output from the A2 generating section 654. The address signals bca01z and bca02z which are output also input to a carry decision section 656. To the carry decision section 656, the burst length signal b18z from the mode register 28 is input to be used to prevent a carry at write/read operation when the burst length is 8. The output signal ica02z of the carry decision section 656 is input to the A2 generating section 654.

Figure 17:
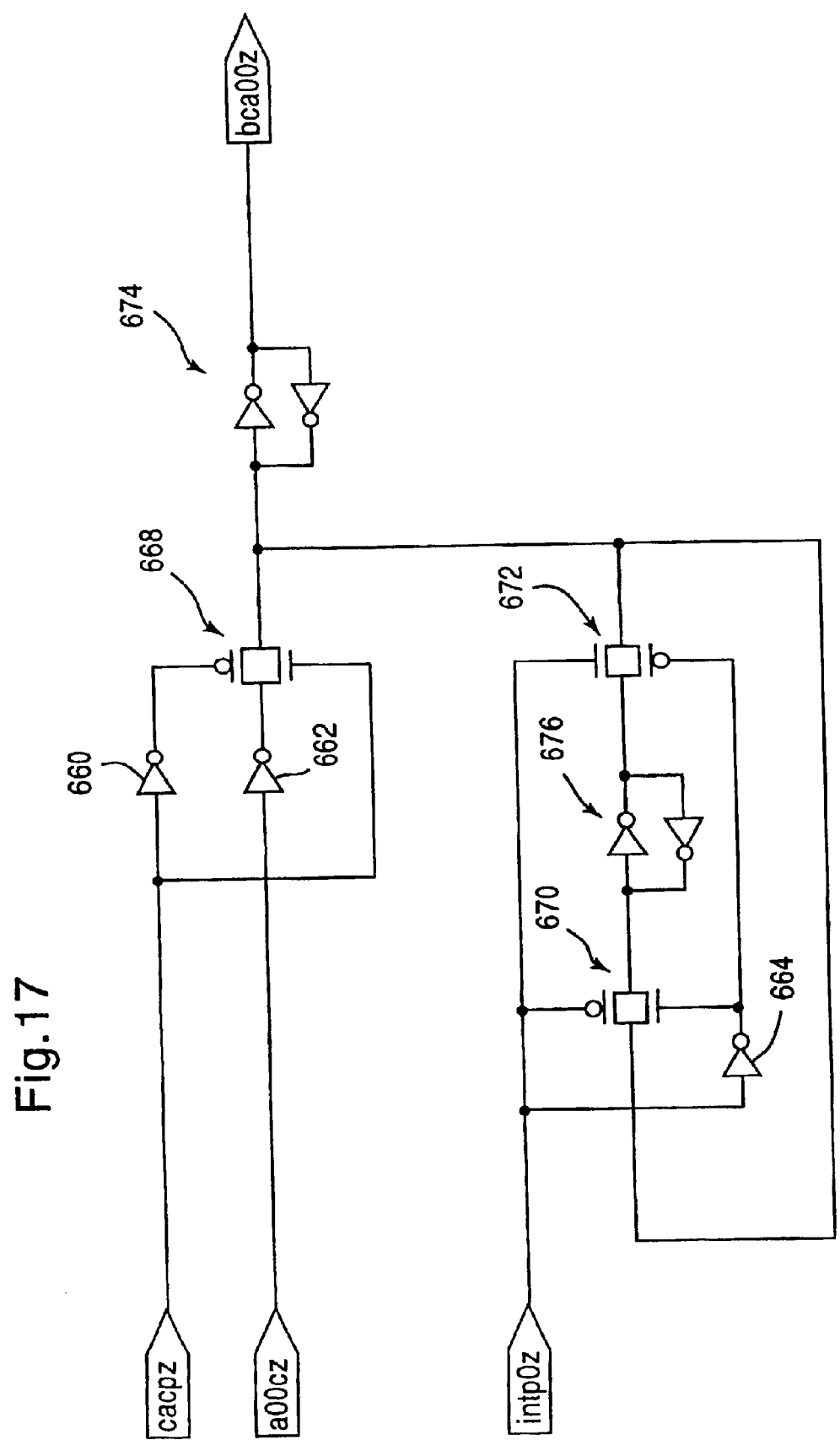
FIG. 17 is a diagram showing a circuit example of an A0 generating section in the address generating section of the semiconductor memory device in the first embodiment of the present invention.

FIG. 17 shows an example of the circuit of the A0 generating section 650. The clock signal cacpz as the gate control signal and its signal reversed by an inverter 660 control a transfer gate circuit 668. By turning on the gate, an external address signal a00cz reversed at an inverter 662 is latched to latch circuits 674 and 676, thus being output to each bank as the address signal bca00z. On the other hand, every time the clock signal intp0z is input, a signal reversed from the external address signal a00cz is output to each bank as an address signal bca00z by turning on a transfer gate circuit 672 and turning off a transfer gate circuit 670, using an inverter 664.

Figure 18:
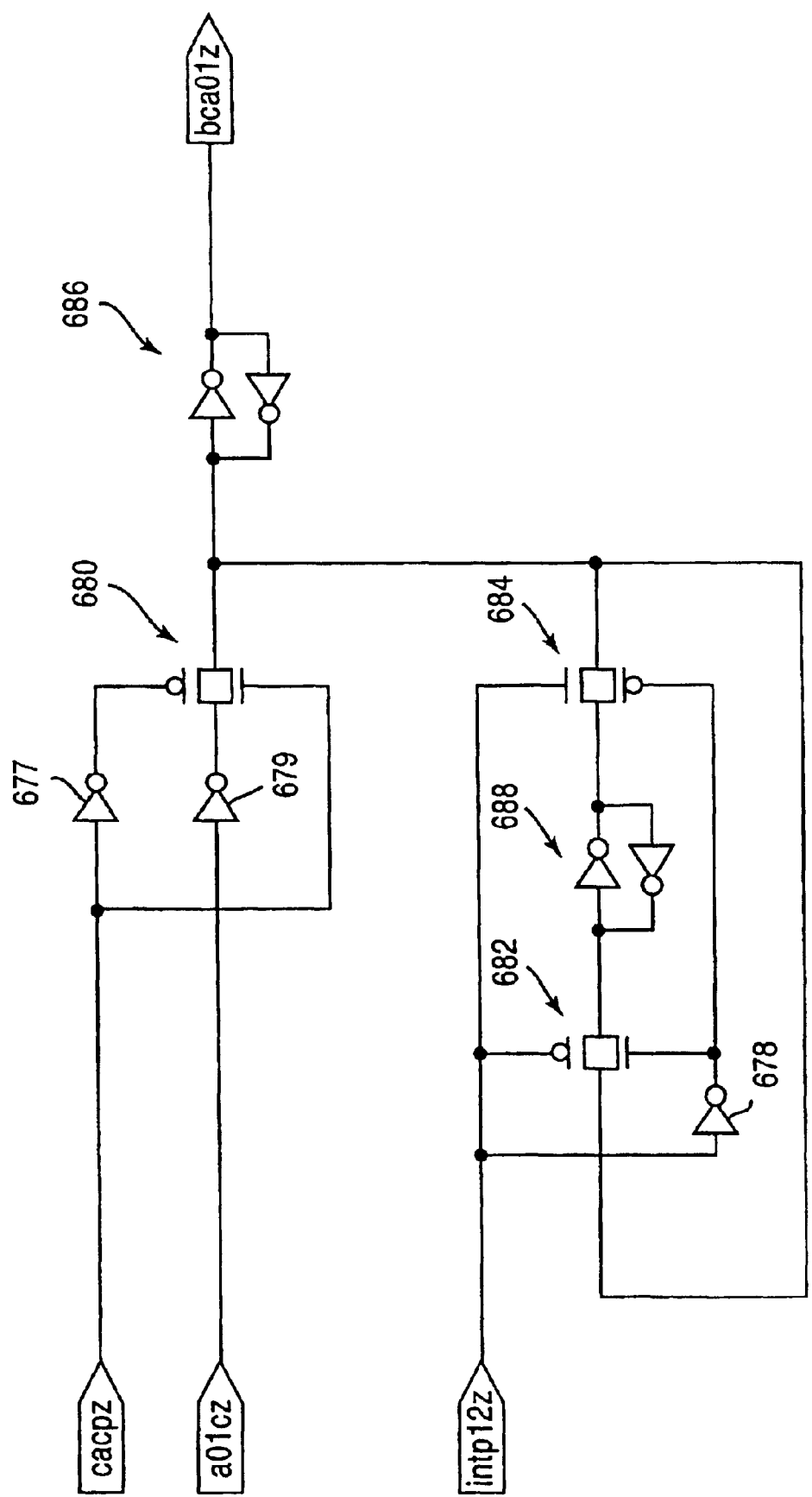
FIG. 18 is a diagram showing a circuit example of an A1 generating section in the address generating section of the semiconductor memory device in the first embodiment of the present invention.

FIG. 18 shows an example of the circuit of the A1 generating section 652. Since the circuit structure of the A1 generating section 652 is the same as one shown in FIG. 17, its description is omitted. In FIG. 18, when the clock signal cacpz inputs, the external address signal a01cz is latched and the latched external address signal a01cz is output to each bank as the address signal bca01z. Also, when the clock signal intp12z inputs, the signal reversed from the external address a01cz is output to each bank as the address signal bca01z.

Figure 19:
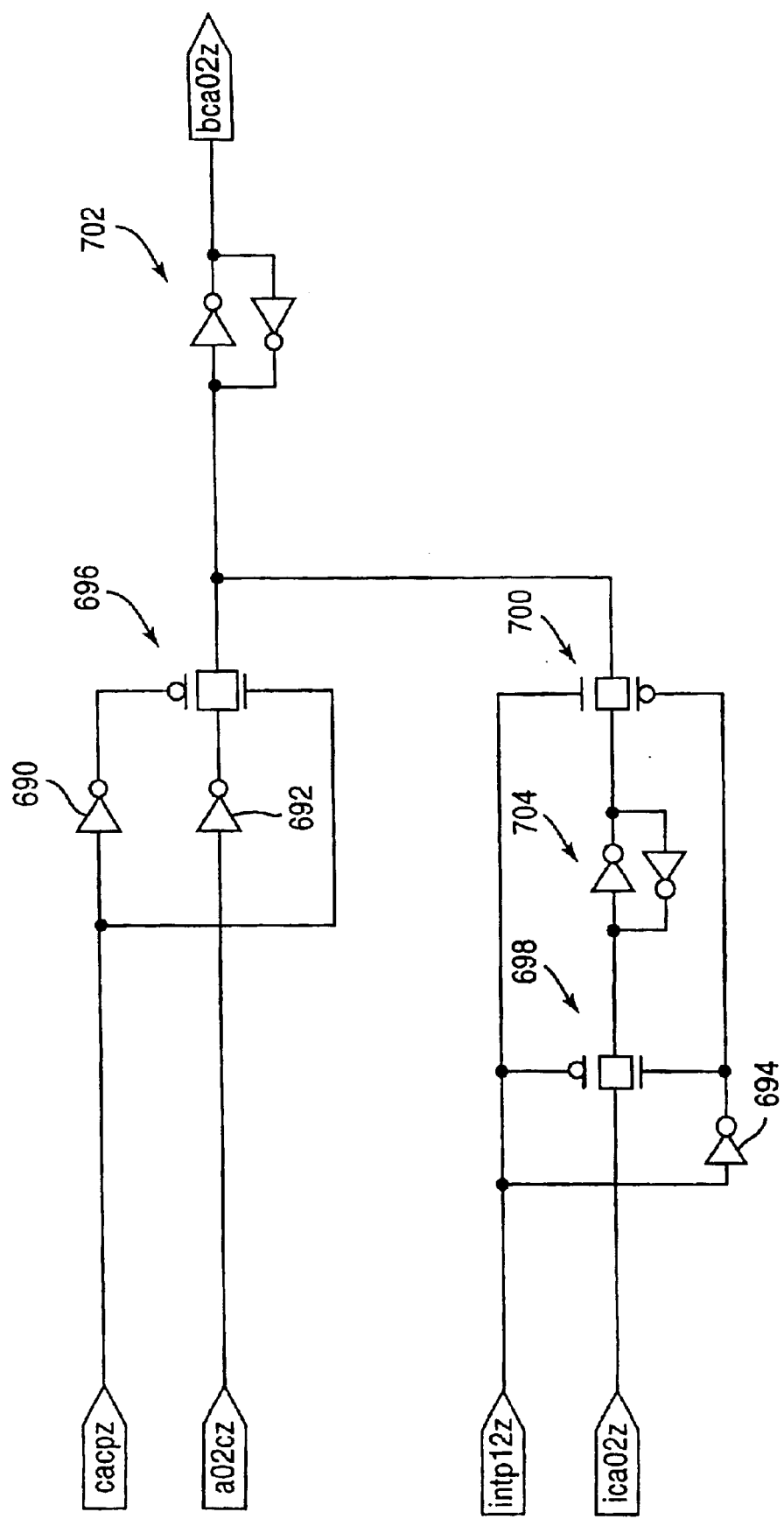
FIG. 19 is a diagram showing a circuit example of an A2 generating section in the address generating section of the semiconductor memory device in the first embodiment of the present invention.

FIG. 19 shows an example of the circuit of the A2 generating section 654. The circuit structure of the A2 generating section 654 is similar to that of the A1 generating section 652 in FIG. 18, and it inputs the external address a02cz by the clock signal cacpz, thereby outputting it to each bank as the address signal bca02z. However, there is a different point that the carry of the A2 generating section 654 is judged at the carry decision section 656 by the outputs of the A1 generating section 652 and the A2 generation section 654, thus outputting an address signal bca02z by the consequent signal ica02z in synchronization with the clock signal intp12z.

Figure 20:
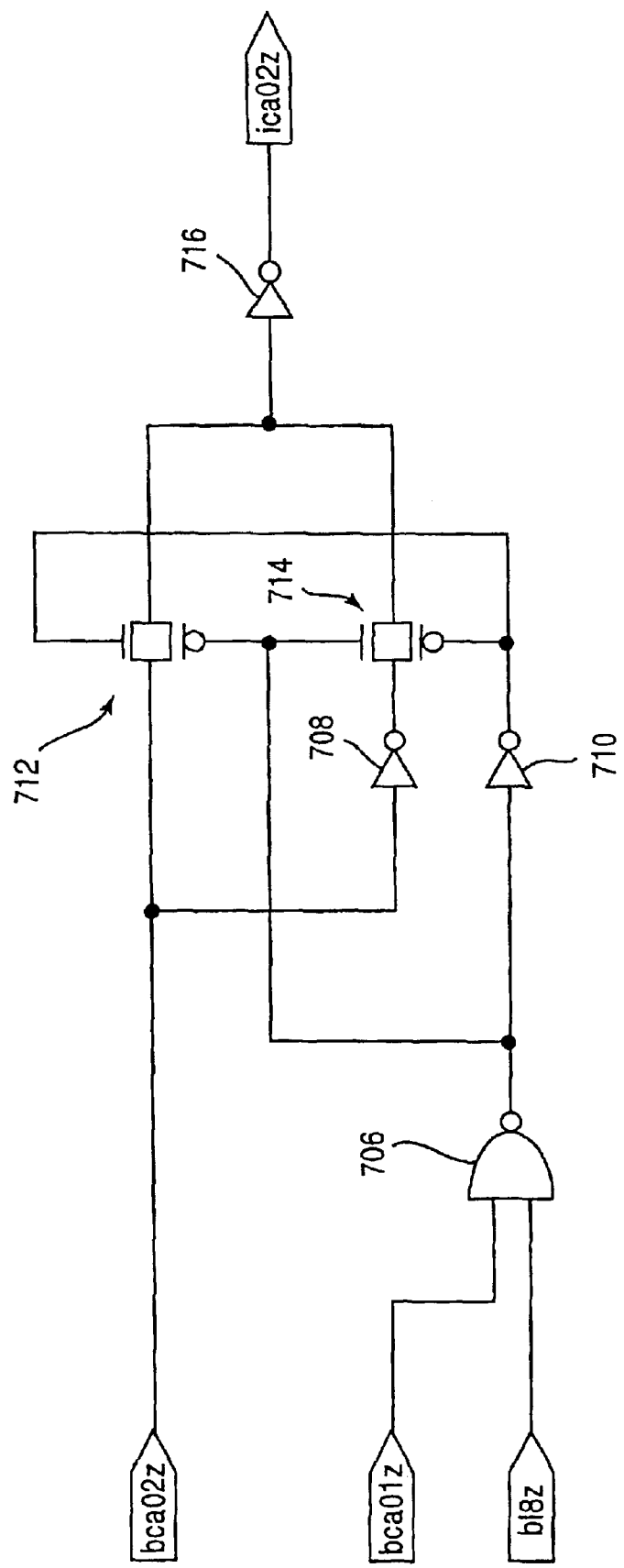
FIG. 20 is a diagram showing a circuit example of a carry decision section in the address generating section of the semiconductor memory device in the first embodiment of the present invention.

FIG. 20 shows an example of the circuit of the carry decision section 656. A signal indicating that the burst length from the mode register 28 is equal to 8 and the address signal bca01z from the A1 generating section 652 are input to a NAND circuit 706. An output of the NAND circuit 706 controls two transfer gate circuits 712 and 714, so outputting the address signal bca02z output from the A2 generating section as it is or a converted signal ica02z. For example, when the signal b18z is "H" and the address signal bca01z from the A1 generating section 652 also becomes "H", the address signal bca02z is reversed at an inverter 716 through a transfer gate circuit 712. At this time, if the address signal bca02z is "H", the signal ica02z is equal to "L" and input to the A2 generating section 654. After the signal ica02z inputting to the A2 generating section 654 is latched to a latch circuit 704 by the control of transfer gate circuits 698 and 700 of the clock signal intp12z, it is latched to a latch circuit 702, thus preventing a carry by maintaining the address signal bca02z "L". Next, a semiconductor memory device in the second embodiment of the present invention is described with reference to FIG. 21 through FIG. 33.

FIG. 21 is a timing chart showing the comparison of the data reading tests (data readings of wafer tests) of the semiconductor memory device in the prior and the second embodiment. Also, FIG. 22 is a timing chart showing the comparison of the data writing tests (data writings of wafer tests) of the semiconductor memory device in the prior and the second embodiment. Here, FIGS. 21(a) and 22(a) are timing charts of the conventional data reading test and the data writing test of the semiconductor memory device (the SDRAM of the DDR type), while FIG. 21(b) and FIG. 22(b) are timing charts of the data reading test and the data writing test of the semiconductor memory device (the SDRAM of the DDR type) of the second embodiment as will be described later.

The data read and data write in the wafer tests in the SDRAM of the DDR type as the semiconductor memory device in the second embodiment is executed in the single data rate (SDR) mode. In short, though the SDRAM of the DDR type in the second embodiment is the SDRAM of the DDR type reading and writing the data at both of the rising and falling timings of the clock, it also has the single data rate mode (SDR mode) reading the data at the timing of the rising (or falling) of the clock. Therefore, the test for the data read and data write supplies the tester clock clk of the semiconductor tester as it is to the SDRAM of the DDR type, so reading or writing the data in the SDR mode. It should be noted that in the second embodiment, since the SDR mode is a test dedicated mode, it makes a CAS latency 0 clock (CL=0) at the test reading.

Specifically, as shown in FIG. 21(b), the data read in the wafer test in the SDRAM of the DDR type in the second embodiment is executed in SDR mode, and when the case in which the burst length is 8 (BL=8: when 8 different data are read) is considered, only a time equivalent to 10 clk's (tester clock) after becoming an active state is required to complete a series of data read, so making it possible to reduce 3 clk's in time from 13 clk's in the SDRAM of the DDR type described with reference to FIG. 21(*a*) mentioned above. The effect of this time reduction is obtained for all chips formed on the wafer, so totally becoming significantly large. Also, when the burst length is made smaller than 8 (BL=2 or BL=4, and so on), a larger effect in time reduction is obtained. Further, expensive semiconductor testers (test equipment) having a frequency band more than twice as wide as the operation frequency of the SDRAM of the DDR type being the test objects are not required.

Also, as shown in FIG. 22(*b*), the data writing in the wafer test in the SDRAM of the DDR type in the second embodiment is executed in the SDR mode, as well, and further due to the unnecessary delayed writing described with reference to the above-mentioned FIG. 22(*a*), only a time equivalent to 9 clk's after becoming an active state is required to complete a series of write operations when the case in which the burst length is 8 (BL=8) is considered, thus making it possible to reduce 2 clk's in time from 11 clk's in the SDRAM of the DDR type described with reference to FIG. 22(*a*). The effect of this time reduction, as has been described, is obtained for all chips formed on the wafer, so becoming quite large as total. Furthermore, in the data writing test in the wafer test, when the burst length is made smaller than 8, the effect of the time reduction becomes larger as total. Further, it is the same as the above-mentioned data read test in the wafer test that the expensive test equipment having a frequency band more than twice as wide as the operation frequency of the SDRAM of the DDR type being the test objects is not required.

Also, the SDRAM in the second embodiment, by executing the wafer test in the SDR mode, will have only one read/write data for one clock and even at the proving test in the wafer test the elimination of the supply of the redundant clock (a clock CLK having a cycle twice as long a the tester clock CLK) to the device results in a reduction of the test time required for it.

It should be noted that, as has been described above, the smallest CAS latency at the time of reading in the DDR mode is 1.5 in the SDRAM of the DDR type in the second embodiment. This is caused from the fact that the read data is determined by specifications to be output together with the strobe signal in the SDRAM of the DDR type, this strobe signal is generated inside of the SDRAM after receiving the read command, and the delay from the read command input to the strobe signal output arises as a main cause to determine the CAS latency. On the other hand, because the SDR mode is used as a mode exclusively for the test, it is possible to form to output the data with the access time of the column address strobe signal (CAS). Also, in the SDRAM of the DDR type in the second embodiment, though the data is input in synchronization with the strobe signal during the data writing in the DDR mode, this strobe signal is determined by the specifications to be input with a timing delay of approximately one clock cycle from the write command signal. So, there is a delay between receiving the write command to receiving the write data. On the other hand, since the SDR mode is used in the mode exclusively for the test, it can be formed to write the data input almost simultaneously with the write command.

Figure 23:
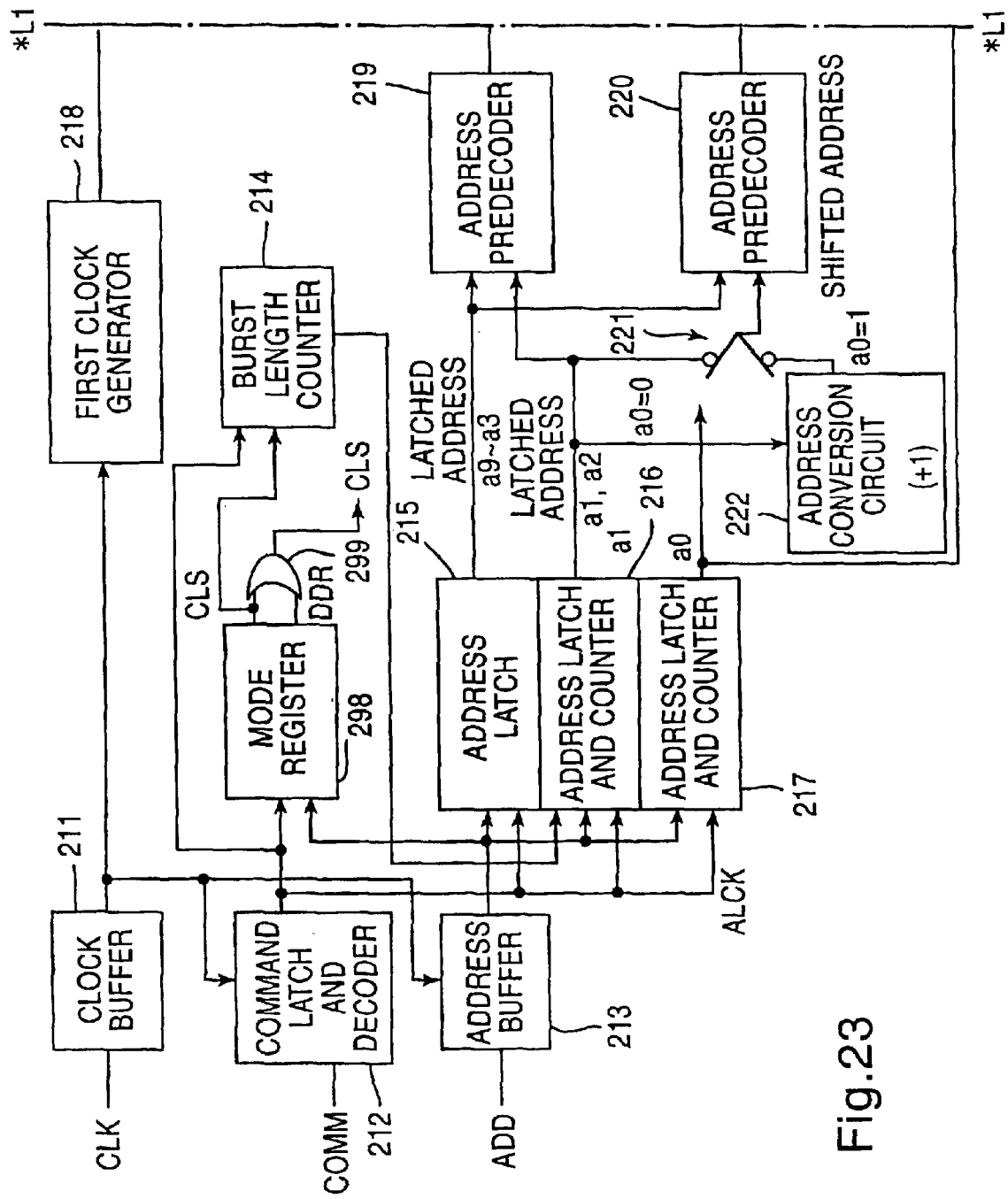
FIG. 23 is a block diagram (first) showing an example of the read circuit of the semiconductor memory device in the second embodiment of the present invention.
Figure 24:
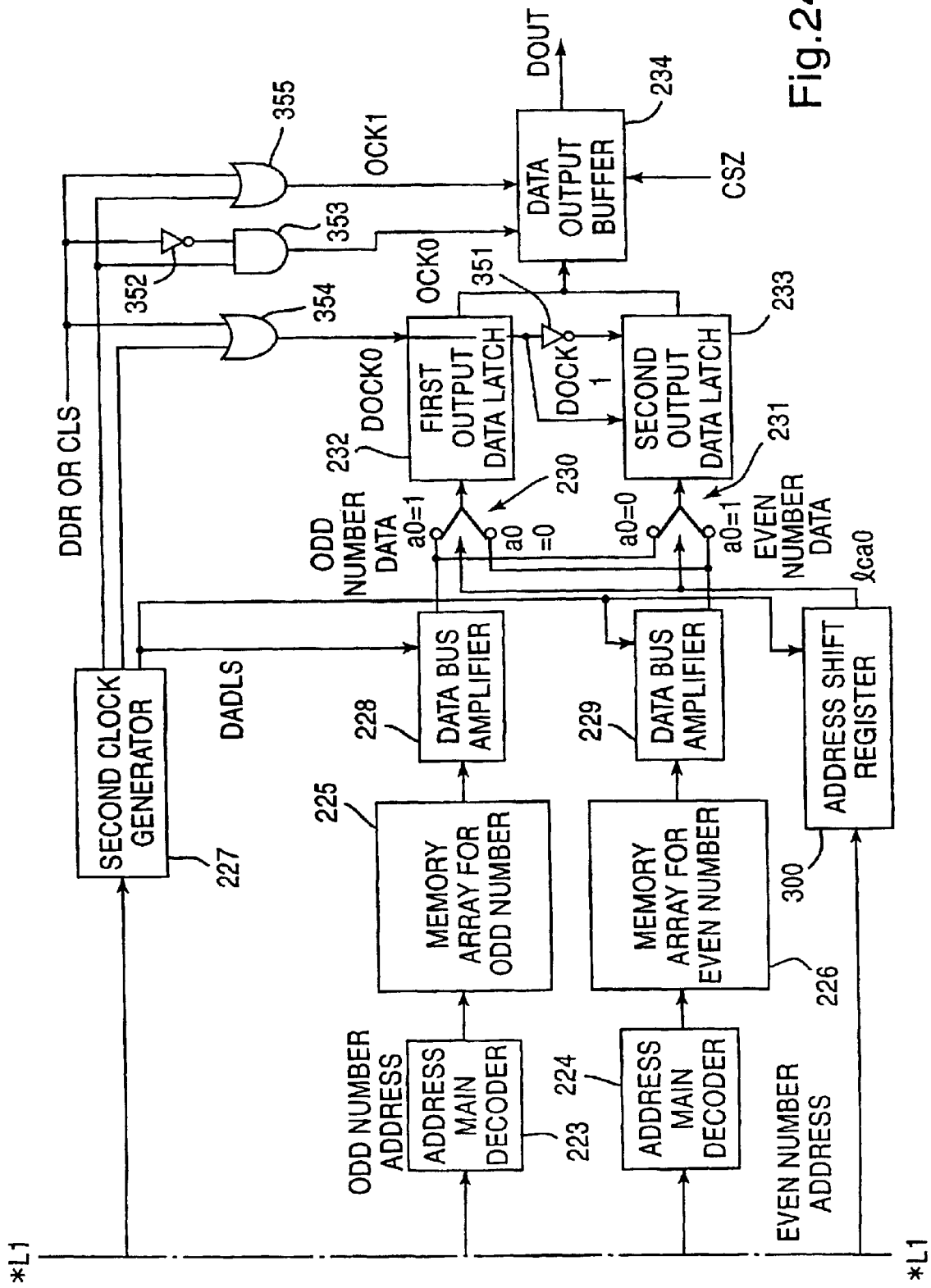
FIG. 24 is a block diagram (second) showing an example of a read circuit of the semiconductor memory device in the second embodiment of the present invention.

FIG. 23 and FIG. 24 are block diagrams showing an example of the read circuit of the semiconductor memory device in the second embodiment. In short, the second embodiment shows a structure switchable to any one of the operation modes of the DDR type and SDR type in the read operation. In FIG. 23 and FIG. 24, a reference code 211 shows a clock buffer, 212 a command latch and decoder, 213 an address buffer, 214 a burst length counter, 215 an address latch, each of 216 and 217 an address latch and counter, 298 a mode register, and 299 an OR circuit. Also, a reference code 218 shows the first clock generator, 219 and 220 address predecoders, 221 a selector, 222 an address conversion circuit, 223 and 224 address main decoders, 225 a memory cell array for the odd number address, 226 a memory cell array for the even number address, and 227 the second clock generator. Further, reference codes 228 and 229 show data bus amplifiers, 230 and 231 selectors, 232 the first output data latch, 233 the second output data latch, and 234 a data output buffer. It should be noted that reference codes 351 and 352 show inverters, 353 an AND gate, and 354 and 355 OR gates.

The clock buffer 211 receives a clock CLK supplied from the external and then outputs the clock CLK to the command latch and decoder 212, the address buffer 213, and the first clock generator 218. The command and latch decoder 212 latches a command COMM according to the clock CLK and as well as decodes it to control by transmitting the address latch clock ALCK to the mode register 298, the burst length counter 214, the address latch 215, and both address latch and counters 216 and 217. The address buffer 213 receives an address ADD (for example, 10 bit address signal a9~a0), then supplies the address to the address latch 215, to the address latch and counter's 216 and 217, and also to the mode register 298.

As has been described in the first embodiment, the DDR signal as the switch signal and the CAS latency control signal CLS input to the OR circuit from the mode register 298 to make the SDRMA in the second embodiment operable in the DDR mode or SDR mode. Therefore, when the SDRAM in the second embodiment is tested and evaluated, for example, by the conventional memory test equipment, it is possible to execute the write/read operation in the SDR mode for this SDRAM by controlling either the DDR signal of the mode register 28 or the CAS latency control signal CLS. In the second embodiment, the output signal from the OR circuit 299 is shown by CLS.

The address latch 215 supplies, for example, the upper digits addresses (a9~a3) to the address predecoders 219 and 220 latching them. The address latch and counter 216 supplies, for example, the subordinate addresses (a2,a1) to the address predecoder 219, the selector 221, and the address conversion circuit 222 receiving a increment control by the burst length counter 214. The address latch and counter 217 supplies the least significant address (a0) to the selector 221 and the address shift register 300.

The address conversion circuit 222 supplies the subordinate addresses (a2, a1) which are generated by adding the subordinate addresses (a2, a1) from the address latch and counter 216 to "1". The selector 221, according to the lest significant address (a0), outputs either the signal from the address latch and counter 216 or the signal from the address conversion circuit 222 to the address predecoder 220. An output of the address predecoder 219 is supplied to the memory cell array 225 for the odd number address through the address main decoder 223. The data corresponding to an indicated address in the memory cell array for the odd number address is supplied to read to the data bus amplifier 228 to be supplied to the selectors 230 and 231. Similarly, an output of the address predecoder 220 is supplied to the memory cell array 226 for the even number address through the address main decoder 224. The data (even data) corresponding to an indicated address in the memory cell array 226 for the even address are read to the data bus amplifier 229 to be supplied to the selectors 230 and 231. Here, the data bus amplifier data latch signal DADLS from the second clock generator 227 is supplied. It should be noted that the second clock generator 227 not only receives an output of the first clock generator 218 and generates the data bus amplifier data latch signal DADLS but also generates a control signal with the predetermined timing and supply, for example, to the AND gate 353 and OR gates 354 and 355.

An address shift register 300 receives the least significant address (a0) from the address latch and counter 217 and then outputs a latch address (lca0) to the selectors 230 and 231 as a selection control signal. On the basis of the selection control signal (lca0) from the address shift register 300, when the least significant bit a0 of the ADD is equal to 0, in short, it is the even number address (a0=0), the selector 230 selects the even number data which is the output of the data bus amplifier 229 and supplies it to the burst output data latch 232. When the least significant bit a0 of the address ADD is equal to 1, in short it is the odd number address (a0=1), it selects the even number data which is the output of the data bus amplifier 228 and outputs it to the output data latch 232. On the other hand, when the least significant bit a0 is the even number address (a0=0) the selector 231 selects the odd number data which is the output of the data bus amplifier 228 on the basis of the select control signal (lca0) from the address shift register 300 and supply it to the second output data latch 233. Also, when it is an odd number address (a0=1), the selector 231 selects the even data which is the output of the data amplifier and supplies to the second output data latch 233.

A data output clock DOCK 0 is supplied to the first output data latch 232. Also, the data output clock DOCK 0 and a data output clock DOCK1 are supplied to the second output data latch 233. Output data respectively latched by the first and second output data latches 232 and 233 are output to an output terminal (DOUT) through the data buffer 234. Here, the data output clock DOCK 0 is generated as an output of the OR gate 354 which has the first output signal of the second clock generator 227 and the CAS latency control signal CLS defining the CAS latency (CL=0) as the input. Also, the output clock OCK0 is generated as an output of the AND gate 353 which has an signal reversing the CS latency control signal CLS by the inverter 352 and the second output signal of the second clock generator 227 as the input. The output clock OCK1 is generated as an output of the OR gate 355 which has the inputs of the CAS latency control signal CLS and the second output signal of the second clock generator 227. It should be noted that the data output clock DOCK1 is generated by reversing the data output clock DOCK0 which is the output of the OR gate 354 by the inverter 351.

Figure 25:
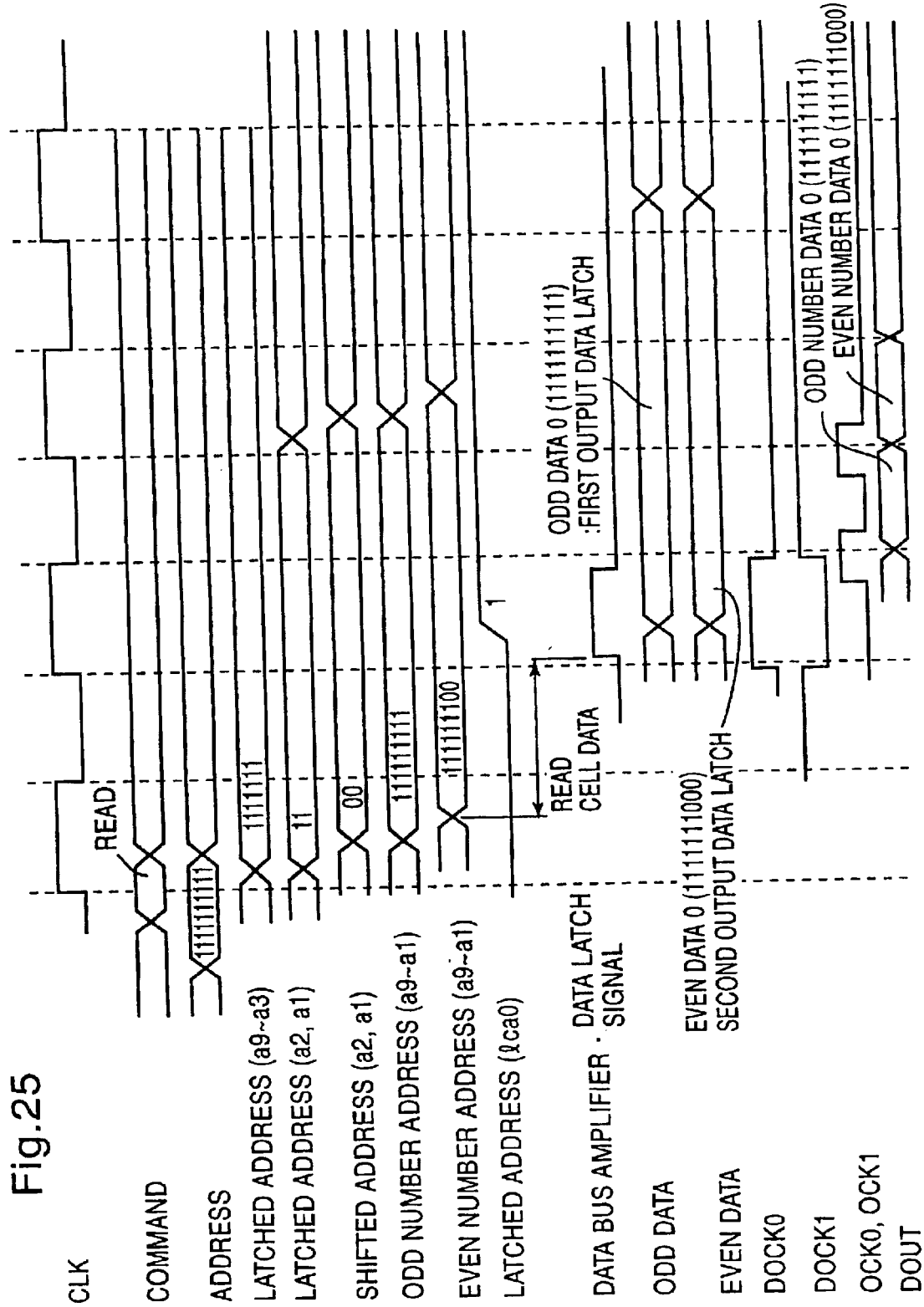
FIG. 25 is a timing chart describing a read operation in the DDR mode in the semiconductor memory device in the second embodiment of the present invention.
Figure 26:
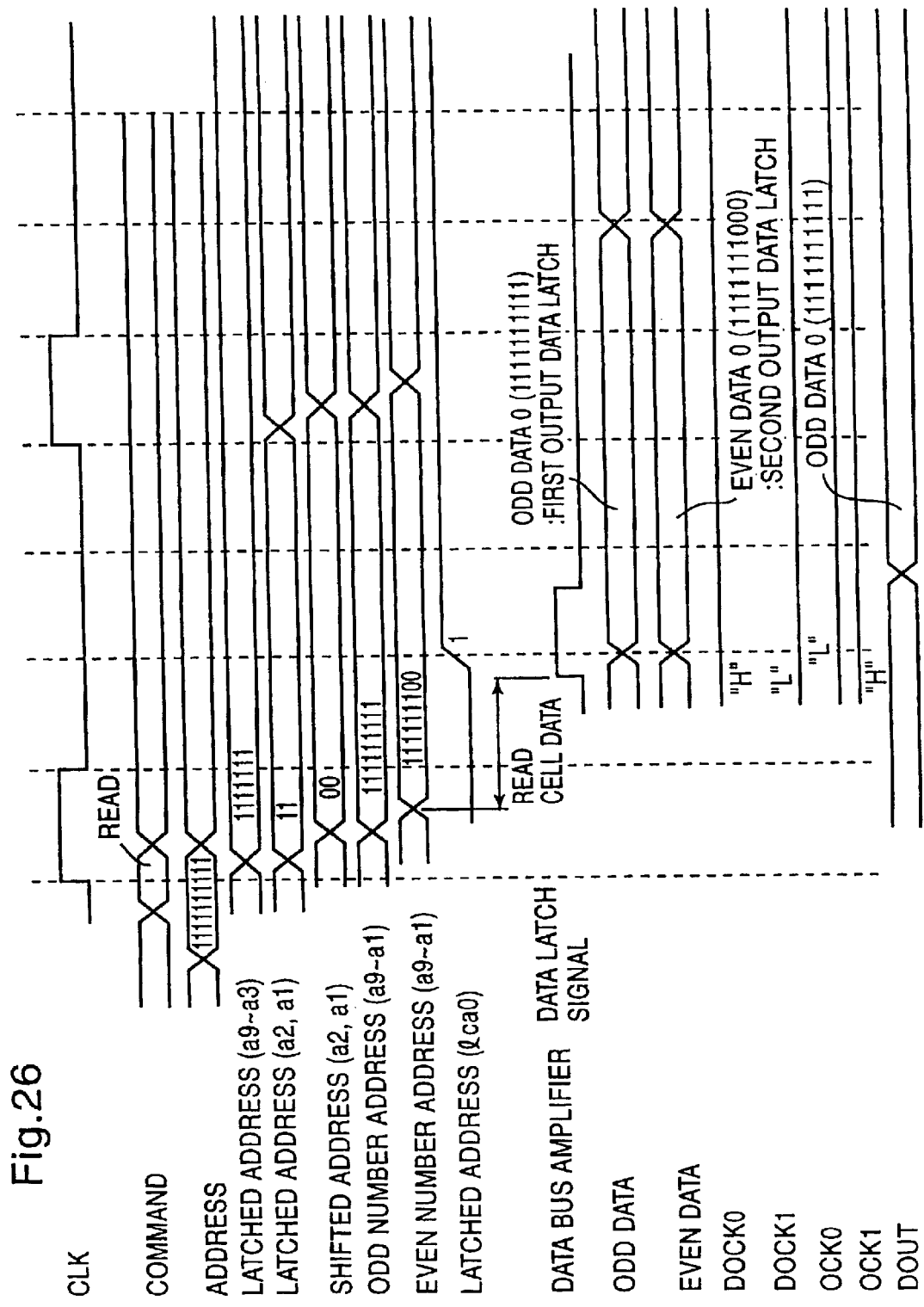
FIG. 26 is a timing chart describing a read operation in the SDR mode in the semiconductor memory device in the second embodiment of the present invention.

To the data output buffer 234, a control signal CSZ controlling the high impedance state of the output terminal DOUT and the output clocks OCK0 and OCK1 are supplied. It should be noted that examples of the structures of the selectors 230 and 231, the output data latches 232 and 233, and the data output buffer 234 will be later described in detail with reference to FIG. 27. FIG. 25 is a timing chart to describe the read operation in the DDR mode of the semiconductor memory device in the second embodiment shown in FIG. 23 and FIG. 24. FIG. 26 is a timing chart to describe the read operation in the SDR mode of the semiconductor memory device in the second embodiment shown in FIG. 23 and FIG. 24. Also, FIG. 27 is a circuit diagram showing an example of the output section of the semiconductor memory device in the second embodiment shown in FIG. 23 and FIG. 24.

First, as shown in FIG. 25, in the DDR mode which is an ordinary operation mode, when the read command is input, the address (ADD: for example, a9~a0 is "1111111111") is latched, and the read operation is executed to the latched address ADD and simultaneously also to the address which has counted up the address ADD. In short, the access operation is simultaneously executed to the memory cell array 225 for the odd number address and to the memory cell array 226 for the even number address. Here, for example, the output (latch address) a9~a3 of the address latch 215 is "1111111", the output (latch address) a2, a1 of the address latch 216 is "11", and the output (shift address) a2,a1 of the address conversion circuit 222 is "00". Here, since a0 is equal to 1, the output (a2, a1="00") of the address conversion circuit selected by the selector 221, thereby being supplied to the address predecoder 220. Therefore, in this example, the output (odd number address) a9~a1 of the address main decoder 223 is "111111111" and the output (even number address) a9~a1 of the address main decoder 224 is "111111100".

Figure 27:
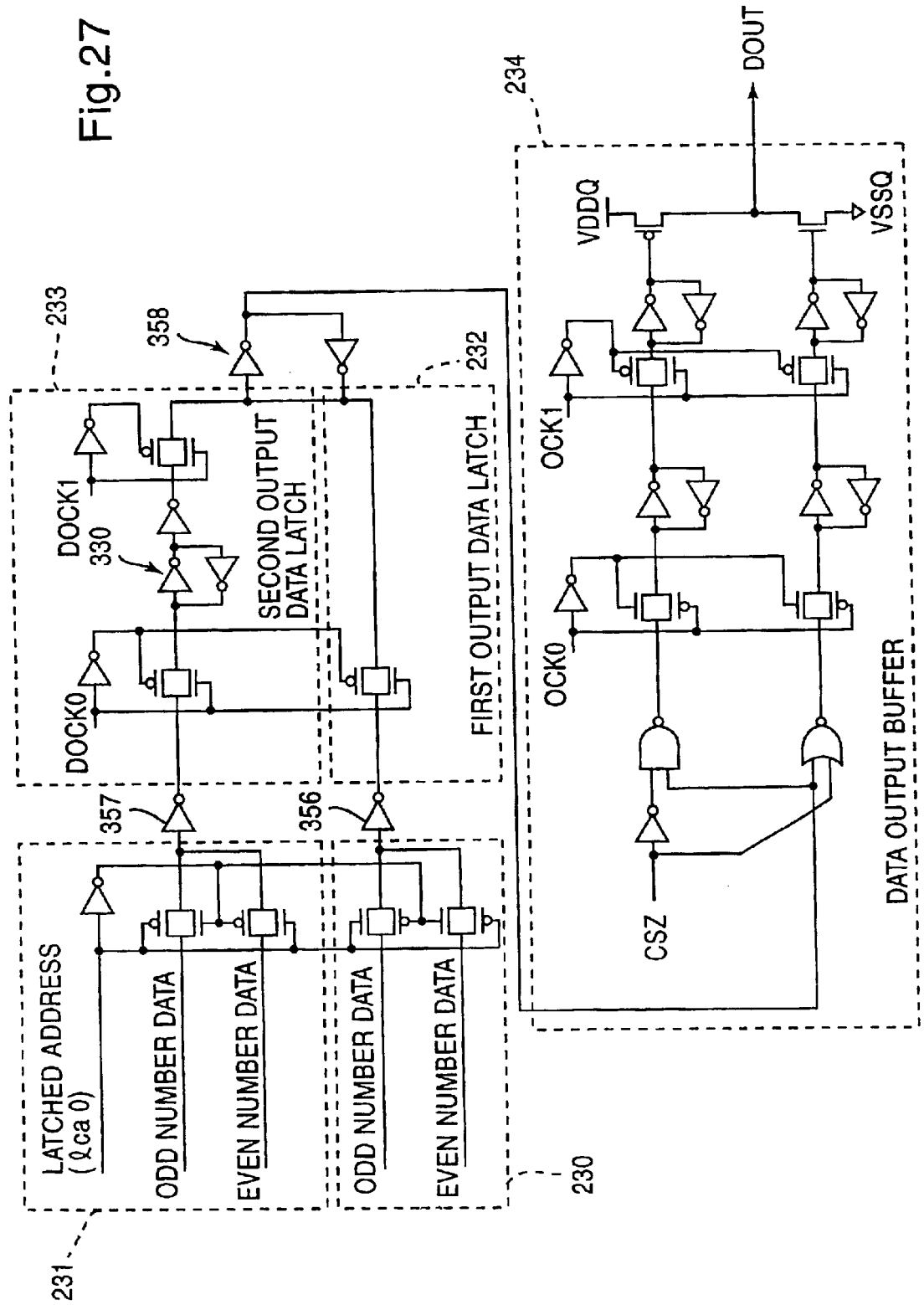
FIG. 27 is a circuit diagram showing an example of an output data latch and an output data buffer at an output section in the semiconductor memory device in the second embodiment of the present invention.

FIG. 27 is a circuit diagram showing an example of the selectors 230 and 231, the first and second output data latches 232 and 233, and the output data buffer 234 (output section) of the semiconductor memory device in the second embodiment shown with reference to FIG. 23 and FIG. 24. It should be noted that in the circuit in FIG. 27, inverters 356 and 357 are provided at the output of the selectors 230 and 231, while a latch 358 is provided at the output of the first and second output data latches 232 and 233.

As shown in FIG. 27, when the output (latch address) lca0 of the address shift register 300 is at a low level "L" (when a0=0), the selector 230 selects the even number data 0 (1111111000) and outputs it to the first output data latch 233 through the inverter 356. Also, the selector 231 selects the odd number data 0 (1111111111) and outputs the second output data latch 233 through the inverter 357. On the other hand, when the latch address lca0 is at high level "H", the selector 230 selects the odd number data 0 (1111111111) and outputs it to the first output data latch 232 through the inverter 356. Also, the selector 231 selects the even number data 0 (1111111000) and outputs it to the second output data latch 233 through the inverter 357. Here, at the output section in FIG. 27, data latched to the first output data latch 232 is first output from the data output buffer, and then data latched to the second output data latch is output. When a0 is equal to 0, in short, when the lest significant bit of the external address is an even number, data is required to be output to the external in the order of the even data and odd data, while when a0 is equal to 1, odd number data is required to be output to the external ahead of the even number. The selectors 230 and 231 are provided to latch the data which first outputs to the first output data latch like this and to latch the data which next outputs to the second output data latch. Thus the selectors 230 and 231 select the odd number data 0 (1111111111) or even number data 0 (1111111000) according to the level of the latch address lca0 to supply the first and second output data latches 232 and 233.

Then, the data that should be read first (for example, odd number data 0: "1111111111") is input to the first output data latch 232 and the data that should be read next (for example, even number data 0: "1111111000") is input to the second output data latch 233.

Next, in DDR mode, since the DDR signal or CLS signal in FIG. 24 is "L", each of the OR circuits 354 and 355 and the AND circuit 353 operates merely as a buffer, the DOCK 0, OCK 0, and OCK 1 are supplied from the second clock generator 227 to the output data latches 232 and 233 and the data output buffer 234 at the timing shown in FIG. 25. And, as shown in FIG. 27, when the data clock DOCK 0 is at high level "H" (Dock 1 is at low level "L"), the first output data latch 232 inputs in the odd number 0 (1111111111), thus outputting it to the output data buffer 234 through the latch 358. Also, the second output data latch 233 inputs in the odd number 0 (1111111000) and maintain it in the latch 330. Next, when the data clock DOCK 0 changes to low level "L" (DOCK 1 is high level "H"), the second output data latch 233 outputs the even data 0 (1111111000) maintained at the latch to the output data buffer 234 through the latch 358.

Then, the data in the first output data latch 232 and the data in the second output data latch 233 are supplied to the data output buffer 234, so being output to the output terminal DOUT (the external of the chip) according to the output clocks OCK 0 and OCK 1. It should be noted that the control signal CSZ is for controlling the state of the output terminal of the data output buffer 234. For example, when no read operation or write operation is executed, the control signal CDZ is controlled to be high level "H", thus making the output of the data output buffer 234 to high impedance state.

Next, as shown in FIG. 26, for example, in the SDR mode in the read test and so on for the wager test, as is the case of the above-mentioned DDR mode, when the read command is input, the address (ADD: for example, a9~a0 is "1111111111") is latched and the read operation is also simultaneously executed to the address which counts up the address ADD plus one along with the latched address ADD and. In short, the access operation is executed simultaneously to the memory cell array 225 for the odd number address and to the memory cell array 226 for the even number address. Here, for example, the output (latch address) a9~a3 of the address latch 115 is "1111111", the output (latch address) a2,a1 of the address latch 216 is "11", and the output (shift address) a2, a1 of the address conversion circuit 222 is "00". Further, for example, the output (odd number address) a9~a1 of the address main decoder 223 is "111111111" and the output (even number address) a9~a1 of the address main decoder 224 is "111111100".

As shown in FIG. 27, when the output (latch address) ica0 of the address shift register 300 is at low level "L", the selector 230 selects the even number data 0 (1111111000) and outputs it to the first output data latch 232 through the inverter 356, while the selector 231 selects the odd number data 0 (1111111111) and outputs it to the second output data latch 233 through the inverter 357. On the other hand, when the latch address lca0 is at the high level "H", the selector 230 selects the odd number data 0 (1111111111) and outputs it to the first output data latch 232 through the inverter 356, while the selector 231 selects the even number data 0 (1111111000) and outputs it to the second output data latch 233 through the inverter 357. Thus, the selectors 230 and 231 select the odd number data 0 (1111111111) or the even data number 0 (1111111000) in accordance with the level of the latch address lca 0 and supplies it to the first and second output data latches 232 and 233.

Here, in the case of the SDR mode, since the level of the CAS latency control signal CLS is "H", the data clock DOCK 0 is maintained at high level "H", the output clock OCK 0 is maintained at low level "L" and the output clock OCK 1 is maintained at high level "H", therefore the data (for example, odd number data 0 (1111111111)) of the first output data latch 232 is output to the output terminal DOUT (the external of the chip) through the data output buffer 234 as it is. It should be noted that the second output data latch 233 does not output the data because the data clock DOCK 1 is maintained at low level "L".

Thus, the semiconductor memory device in the second embodiment provides not only the DDR mode which is an ordinary operation but also, for example, the SDR mode usable in the read test for the wafer test, and it can start the SDR mode by merely controlling the level of the signals (DOCK 0, DOCK 1, OCK 1, OCK 1, and so on) by only switching the level of the CAS latency control signal CLS.

Figure 28:
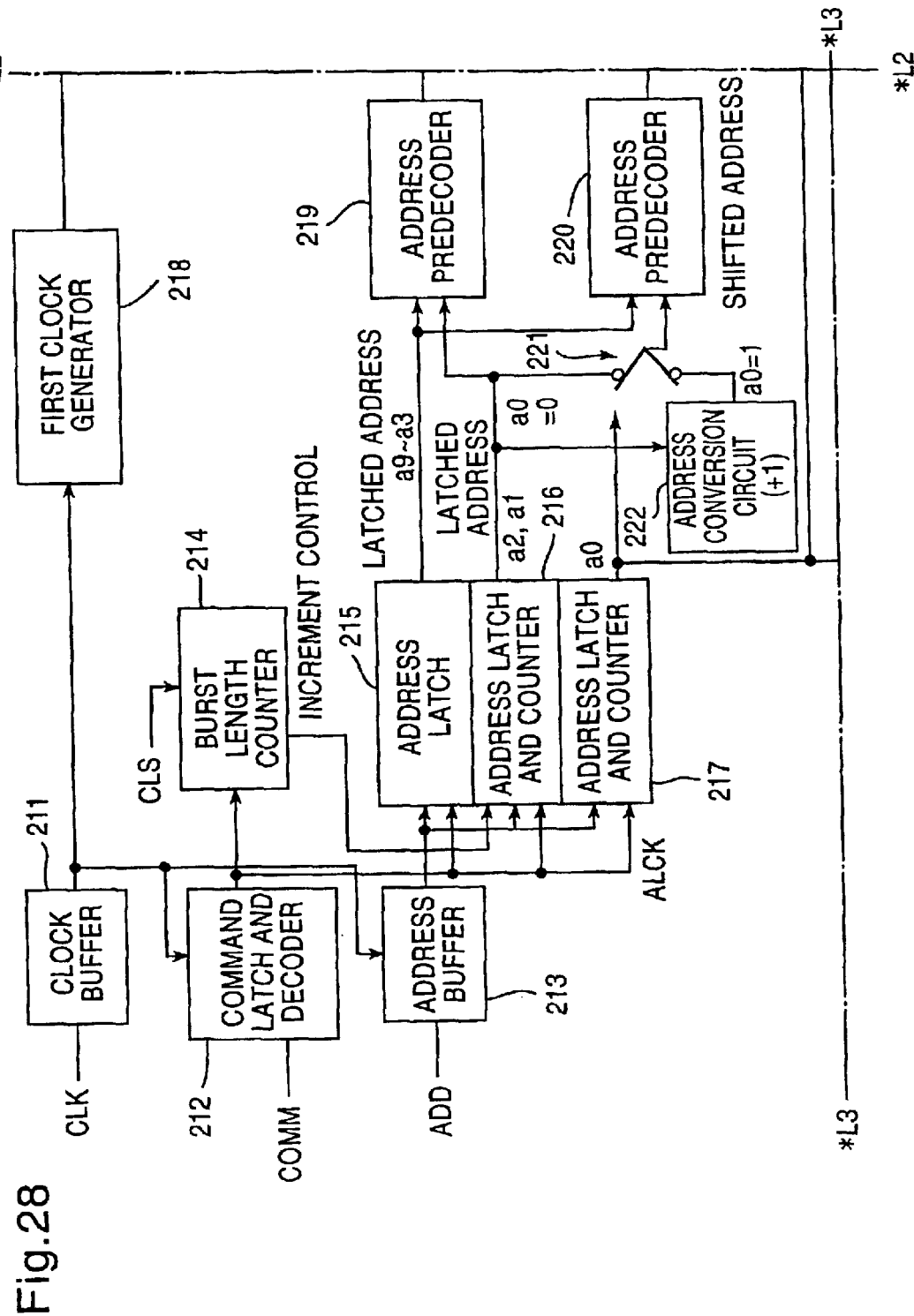
FIG. 28 is a block diagram (first) showing an example of a write circuit of the semiconductor memory device in the second embodiment of the present invention.
Figure 29:
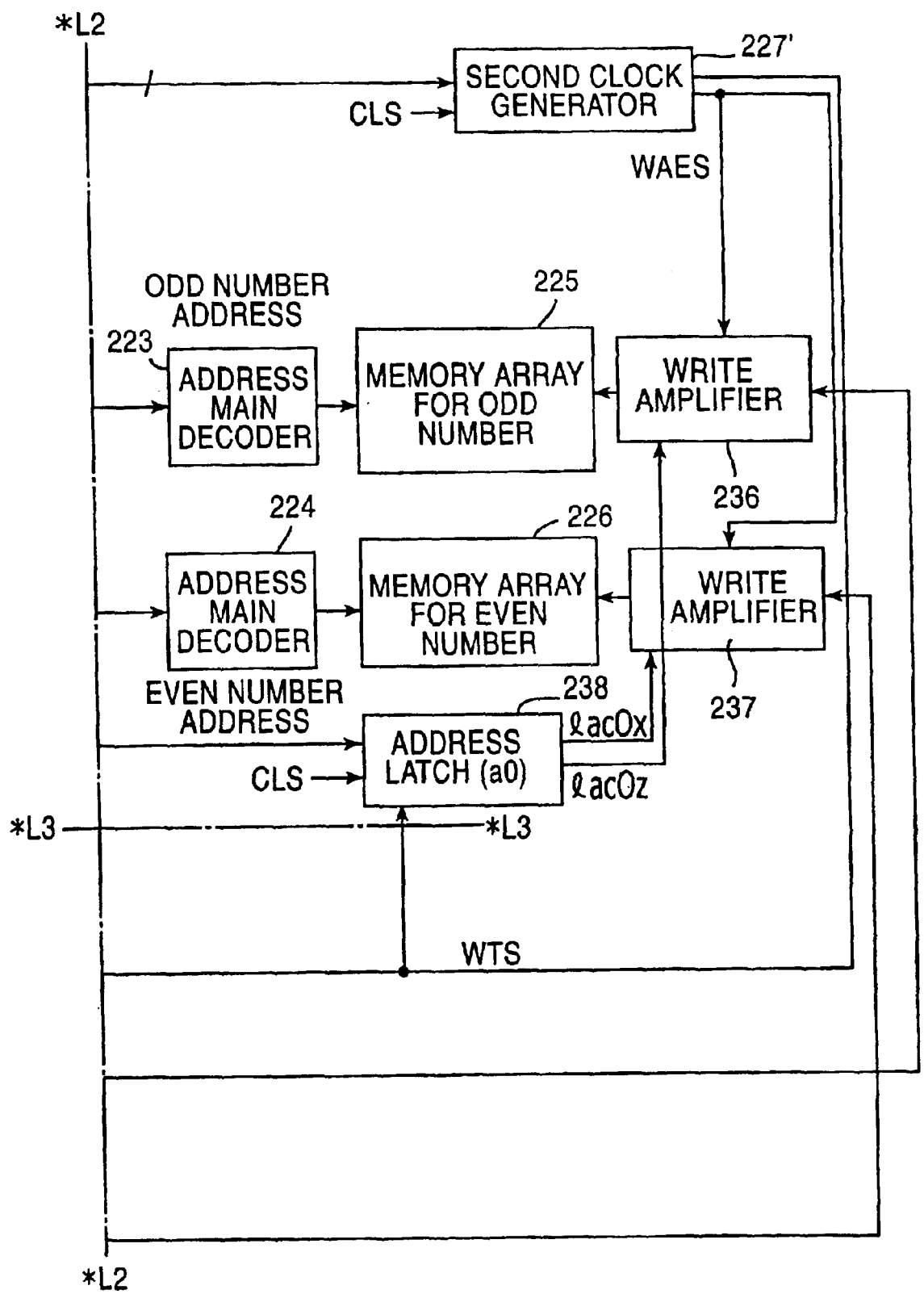
FIG. 29 is a block diagram (second) showing an example of a write circuit of the semiconductor memory device in the second embodiment of the present invention.
Figure 30:
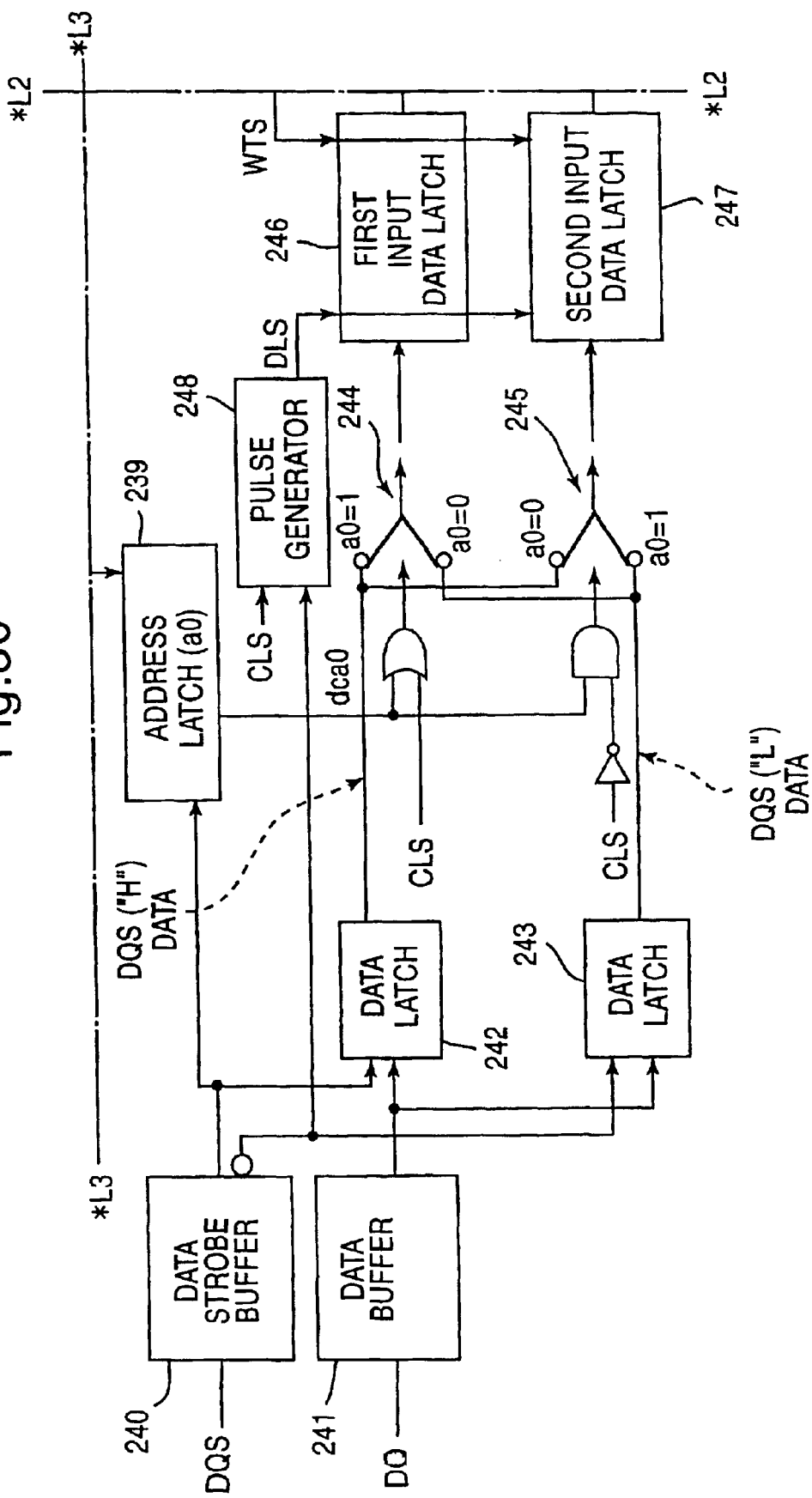
FIG. 30 is a block diagram (third) showing an example of a write circuit of the semiconductor memory device in the second embodiment of the present invention.

FIG. 28 through FIG. 30 is each a block diagram showing an example of the write circuit of the semiconductor memory device in the second embodiment.

In FIG. 28 through FIG. 30, the same reference numbers are referred to the structural elements having the same functional action shown in FIG. 23 and FIG. 24 omitting the descriptions. In FIG. 28 through FIG. 30, a reference number 227' shows the second clock generator, 236 and 237 show write amplifiers, 238 and 239 show address latches, 240 shows a data strobe buffer, 241 shows a data buffer, 242 and 243 show data latches, 244 and 245 show the selectors, 246 shows the first input data latch, 247 show the second input data latch, and 248 shows a pulse generator. It should be noted that, in FIG. 28 through FIG. 30, the illustration of the mode register 298 and the OR circuit 299 shown in FIG. 23 is omitted.

The data strobe buffer 240 receives the data strobe DQS in synchronization with a data signal DQ and then supplies the first internal data strobe signal in response to the rising edge of a DQS to the address latch 239 and the data latch 242. At the same time, the data strobe buffer 240 supplies the second internal data strobe signal to the pulse generator 248 and the data latch 243 in synchronization with the falling edge of the data strobe signal DQ. The data buffer 241 receives the data DQ, the data latch 242, latches the data DQ corresponding to the rising edge of the DQS responding to the first internal data strobe signal, and the data latch 243 latches, responding to the second internal data strobe signal, the data DQ corresponding to the falling edge of the DQS. The output (DQS ("H")) of the data latch 242 and the output (DQS ("L")) of the data latch 243 are supplied to the selectors 244 and 245 and each one of the outputs is selected by the output (a0) of the address latch 239, so being supplied to the first and second input data latches 246 and 247. In short, the selector 244 selects the output of the data latch 242 when the address a0 is equal to 1 (odd number address) and the output of the data latch 243 when the address a0 is equal to 0 (even address), so supplying it to the first input data latch 246. Also, the selector 245 selects the output of the data latch 243 when the address a0 is equal to 1 (odd address) and the output of the data latch 242 when the address a0 is equal to 0 (even address), so supplying it to the second input data latch 247.

The output of the first input data latch 246 is supplied to the memory cell array 225 for the odd number address through the write amplifier 236 and then the data is written to the address assigned by the address main decoder 223. Also, the output of the second input data latch 247 is supplied to the memory cell array for the even number address through the write amplifier 237 and the data is then written to the address assigned by the address main decoder 224. It should be noted that outputs (control signals) lac0Z and lac0x from the address latch 238 are supplied to the write amplifiers 236 and 237. And the CAS latency control signal CLS is supplied to the second clock generator 227', address latch 238 and pulse generator 248. Also, the second clock generator 227' receives the output of the first clock generator 218 and the CAS latency control signal CLS, then generates a pulse (write timing signal) WTS and a write amplifier enable signal WAES which are generated two clocks later than a write command, and supplies the write timing signal WTS to the address latch 238 and the first and second input data latches 246 and 247. Further, it also supplies the write amplifier enable signal WAES to the write amplifiers 236 and 237.

Figure 31:
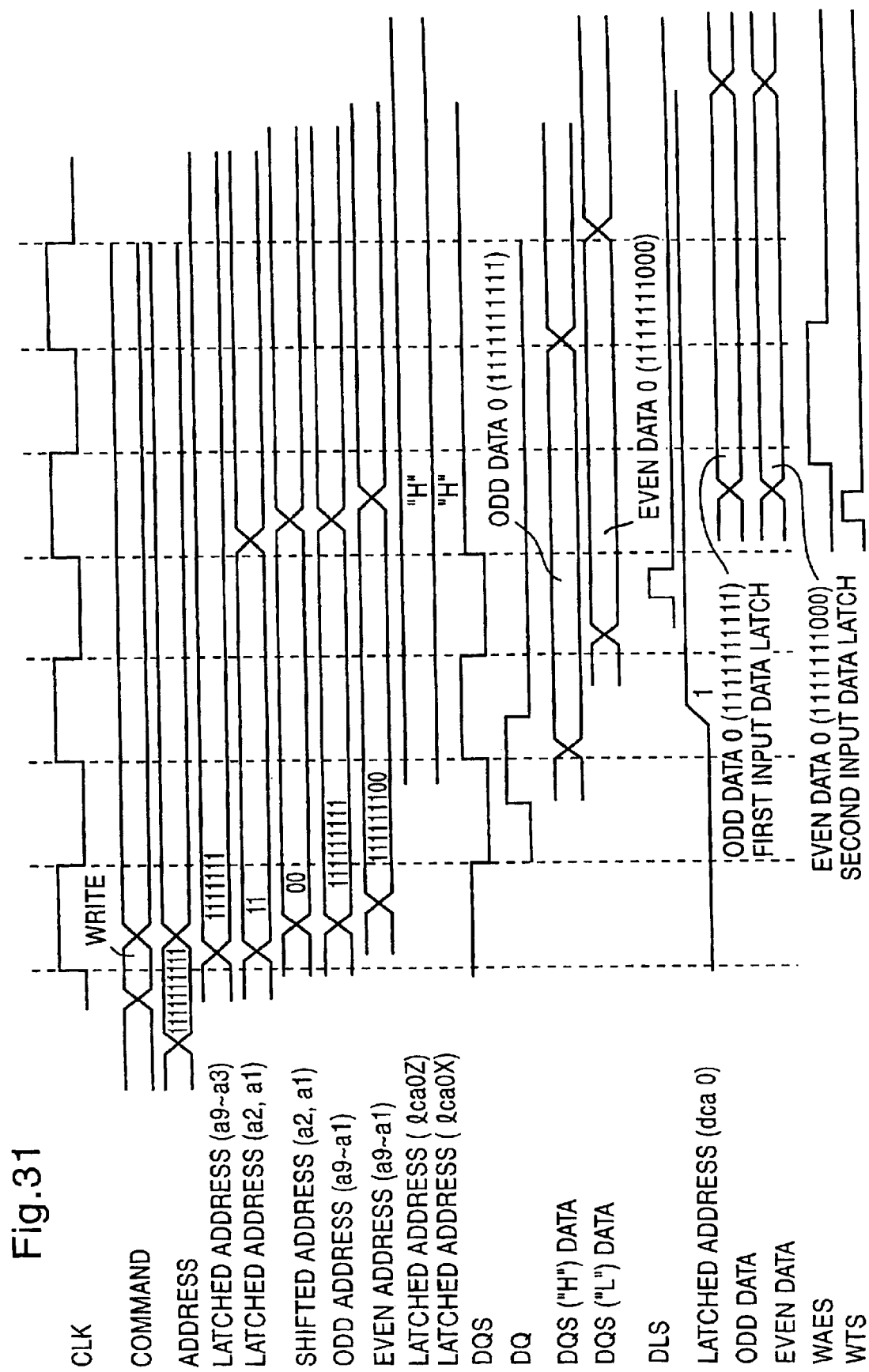
FIG. 31 is a timing chart describing a write operation in the DDR mode in the semiconductor memory device in the second embodiment of the present invention.
Figure 32:
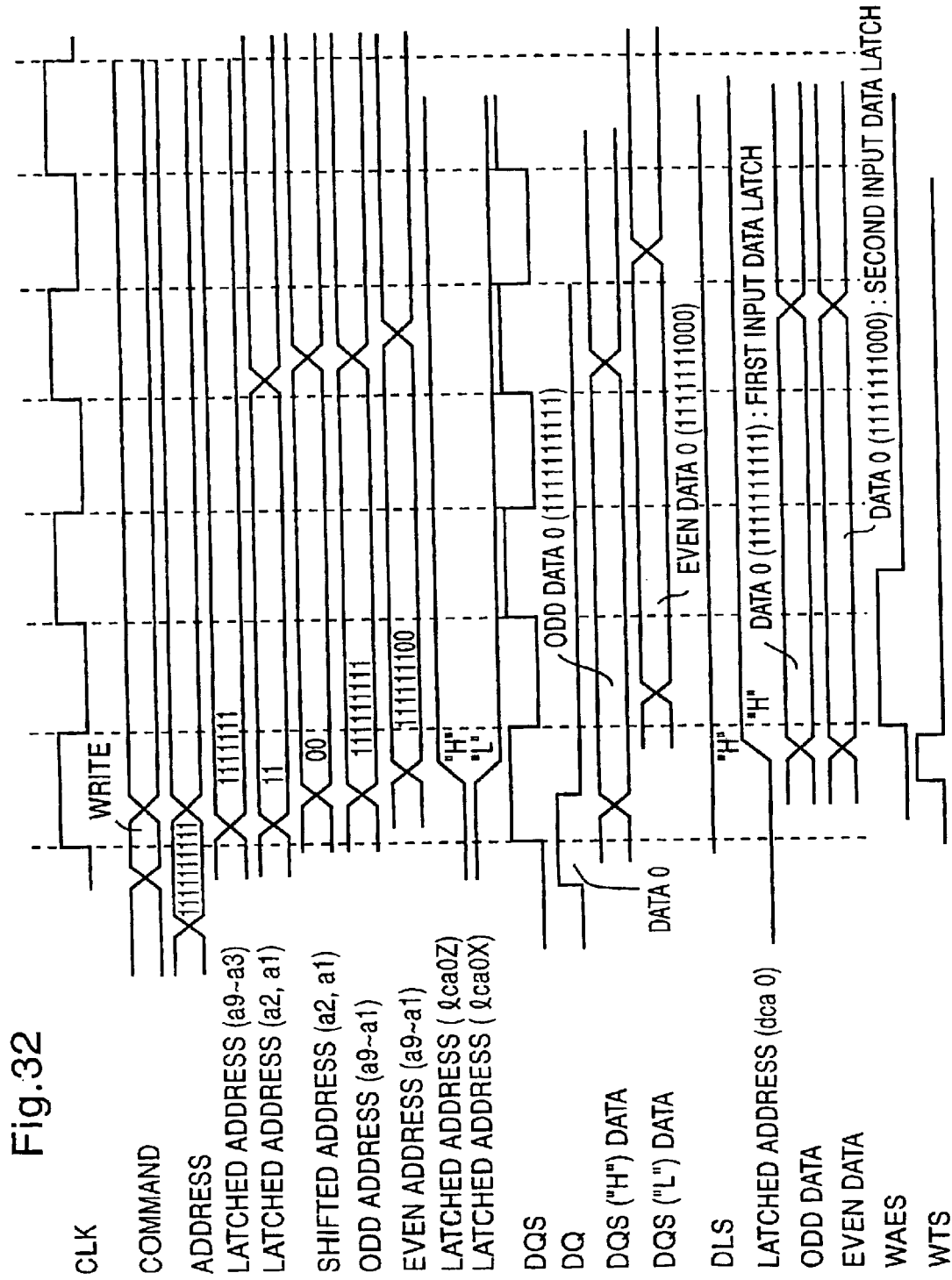
FIG. 32 is a timing chart explaining the write operation in the SDR mode in the semiconductor memory device in the second embodiment of the present invention.
Figure 33:
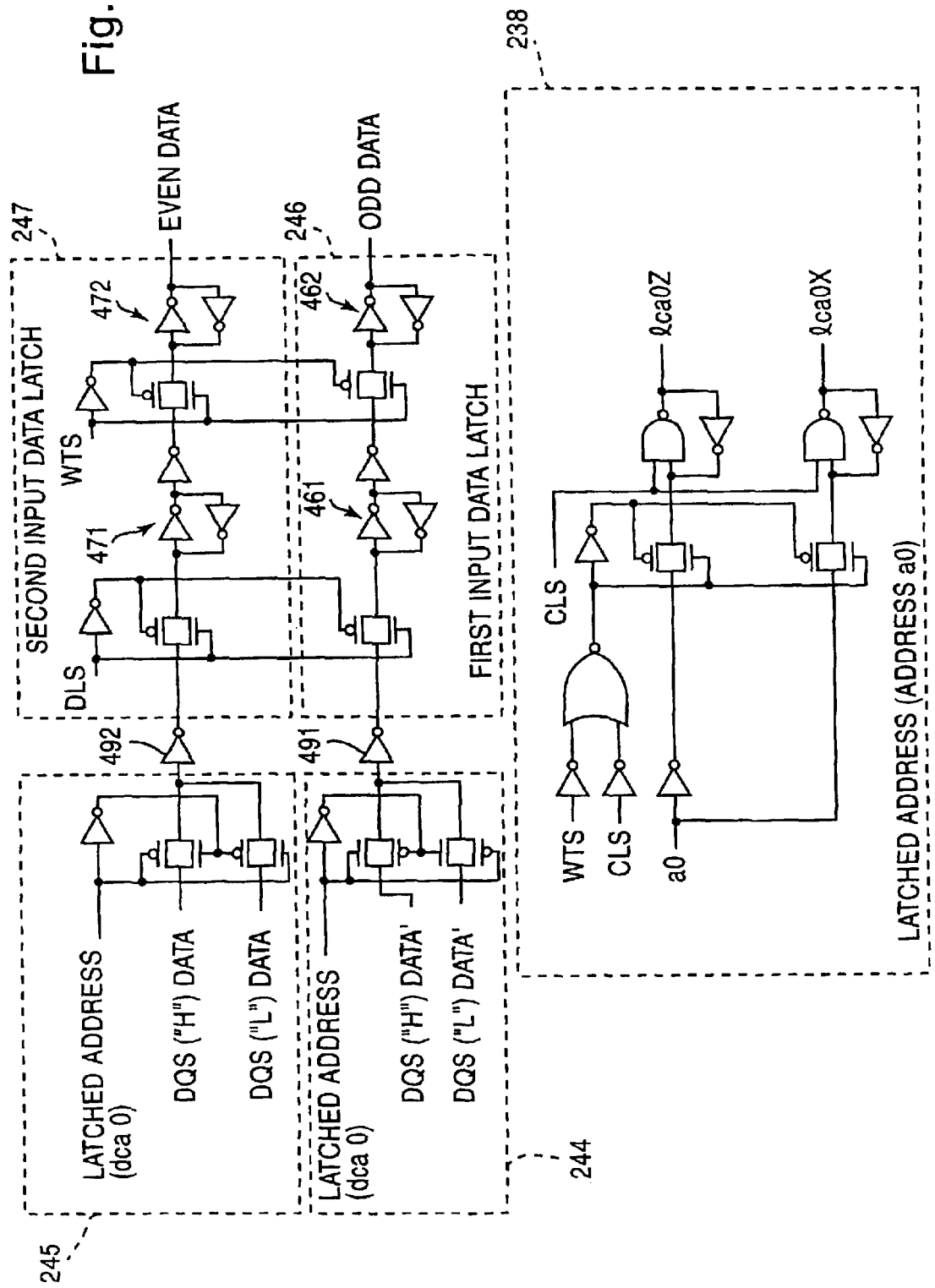
FIG. 33 is a circuit diagram showing an example of an input data latch and an address latch at the input section in the semiconductor memory device in the second embodiment of the present invention.

FIG. 31 is a timing chart describing a write operation in the DDR mode of the semiconductor memory device in the second embodiment shown in FIG. 28 through FIG. 30, while FIG. 32 is a timing chart describing a write operation in the SDR mode of the semiconductor memory device in the second embodiment shown in FIG. 28 through FIG. 30. Also, FIG. 33 is a circuit diagram showing an example of the input data latch and the address latch in the input section of the semiconductor memory device in the second embodiment shown FIGS. 28 through 30.

First, in a write operation in the DDR mode which is an ordinary operation mode, as shown in FIG. 31, when a write command is input, the data latches 242 and 243 are latched at rising and following falling timings of a data strobe DQS approximately one clock cycle delayed. As shown in FIG. 33, the address latch 239 latches the address a0 from the address latch and counter at the rising of the data strobe DQS, and when a0 is equal to 1 (odd number address ADD: for example, a9~a0 is "1111111111"), the latch (column) address dca0 becomes high level "H". Also, since the CLS is "L" in the DDR mode, the selector 244 selects the DQS ("H") data which is an output of the data latch 242, so transferring it to the first input data latch 246 through an inverter 491. Further, the selector 245 selects the DQS ("L") data which is an output of the data latch 243, so transferring it to the second input data latch 247 through an inverter 492.

By a output pulse (data latch signal) DLS of the pulse generator 248 made by the falling timing of the data strobe DQS, the first and second data latches 246 and 247 latch the data transferred through the selectors 244 and 245.

By the write timing signal WTS generated two clocks after the write command which is the output of the second clock generator 227', the first and second data latches 246 and 247 transmit the write data to the write amplifiers 236 and 237 (latches 462 and 472).

Here, since the outputs lac0X and lac0Z of the address latch 238 in FIG. 33 are maintained at high level "H" together because the CLS is "L", the write amplifiers 236 and 237 write the write data to the memory cell array 225 for the odd number address and to the memory array 226 for the even number address by respectively the write amplifier enable signal WAES.

It should be noted that descriptions of the structures such as the clock buffer 211, the command latch and decoder 212, the address buffer 213, the burst length counter 214, the address latch 215, the address latch and counters 216 and 217, the first clock generator 218, the address predecoders 219 and 220, the selector 221, and the address main decoders 223 and 224 all omitted because they are similar to the case of the read processing described before.

Next, as shown in FIG. 32, in the write operation in the SDR mode in the wafer test (writing test) and the like, the same data is latched to the data latches 242 and 243 at the rise timing of the data strobe DQS which is input approximately at the same timing as the write command. And since the CLS is "H" in the SDR mode, the latch address dca0 is invalidated. Since the selector 244 is connected to the side of data latch 242 and the selector 245 is connected to the side of the data latch 243, the data (DQS ("H"): odd number data 0: 1111111111) input at the rise timing of the data strobe DQS is transferred to the first input data latch 246 through the data buffer 241, data latch 242, and selector 244. At the same time, the same data is transferred to the second input data latch 247 through the data buffer 241, the data latch 243, and the selector 245. Here, the data latch signal DLS output from the pulse generator is fixed to high level "H" because the CLS signal at "H" level is input to the pulse generator, and therefore the first and second input data latches 246 and 247 input the data (1111111111) together.

In short, as shown FIG. 30, a signal (select signal) fixed to high level "H" or low level "L" is input regardless of the level of the latch address dca0, and the outputs (DQS ("H")="1111111111") of the data latches 242 and 243 which are the same data are supplied to the first input data latch 246 and the second input data latch 247 through the inverters 491 and 492. Also, at the first and the second input data latches 246 and 247, the data latch signal DLS (by switching the level of the CAS latency control signal CLS which inputs to the pulse generator 248) is fixed to high level "H", so that the data supplied through the inverters 491 and 492 are maintained at the latches 461 and 471 as they are.

Also, by the pulse (write timing signal) WTS generated from the edge of the clock which inputs a write command, the first input data latch 246 transfers the write data (odd number data: data 0: 1111111111) to the write amplifier 236 and the second input data latch 247 transfers the write data (even number data: data 0: 1111111111) to the write amplifier 247. In short, as shown in FIG. 33, at the first and second input data latches 246 and 247, the same data maintained at the latches 461 and 471 are transferred, in accordance with a pulse of the high level "H" of the write timing signal WTS, to the latches 462 ad 472 respectively through the inverters and then the write data (1111111111) is transferred to the write amplifiers 236 and 237.

Also, as shown in FIG. 33, the address latch 238 latches the address a0 and its reversed signal by the write timing signal WTS and then outputs the latch addresses lca0Z an lca0X to the write amplifiers 236 and 237. Here, the CAS latency control signal CLS is a signal defining the CAS latency (CL=0) and at high level "H" in the SDR mode.

And, by a signal input from a logical sum between the latch addresses lca0Z and lca0X and the write enable signal WAES from the second clock generator 227', the write amplifiers 236 and 237 write only one of the same write data maintained in the first and second input data latches 246 and 247, in response to the value of the address a0=0, to the corresponding memory cell array 225 for the odd number address or memory cell array 226 for the even number address.

Thus, the semiconductor memory device in the second embodiment provides, for example, the SDR mode usable for the writing test in a wafer test besides the DDR mode which is an ordinary operation, and it can start the SDR mode by merely controlling the level of the signals (DQS, DLS, WTS, WAES, and so on) only by switching the level of the CAS latency control signal CLS. It should be noted that though, in the above second embodiment, the SDRAM having the memory arrays (25, 26) for the even number and odd number addresses is described as an example, the semiconductor memory device in the second embodiment is not limited to the SDRAM having the above structure. Also, there is no need to say that the level of each signal, and the circuit structure and the like, can transform in various ways.

As has been described in detail above, according to the second embodiment, a semiconductor memory device which can reduce the test time is provided without the use of the expensive test equipment.

In the present invention a variety of the transformation is possible without being limited to the above embodiments. For example, in the first embodiment, the external setting signal is set to the register in the mode register 28 through the address buffer/register & bank select 20, thereby switching the level of the DDR signal on the basis of this setting. However, the present invention is not limited to this and, by providing a switch signal input terminal to which the external DDR signal directly inputs on the substrate of the SDRAM 1 and by directly supplying the DDR signal from the system side without the use of the mode register 28, the data transfer mode can be controlled to be switched.

Figure 34:
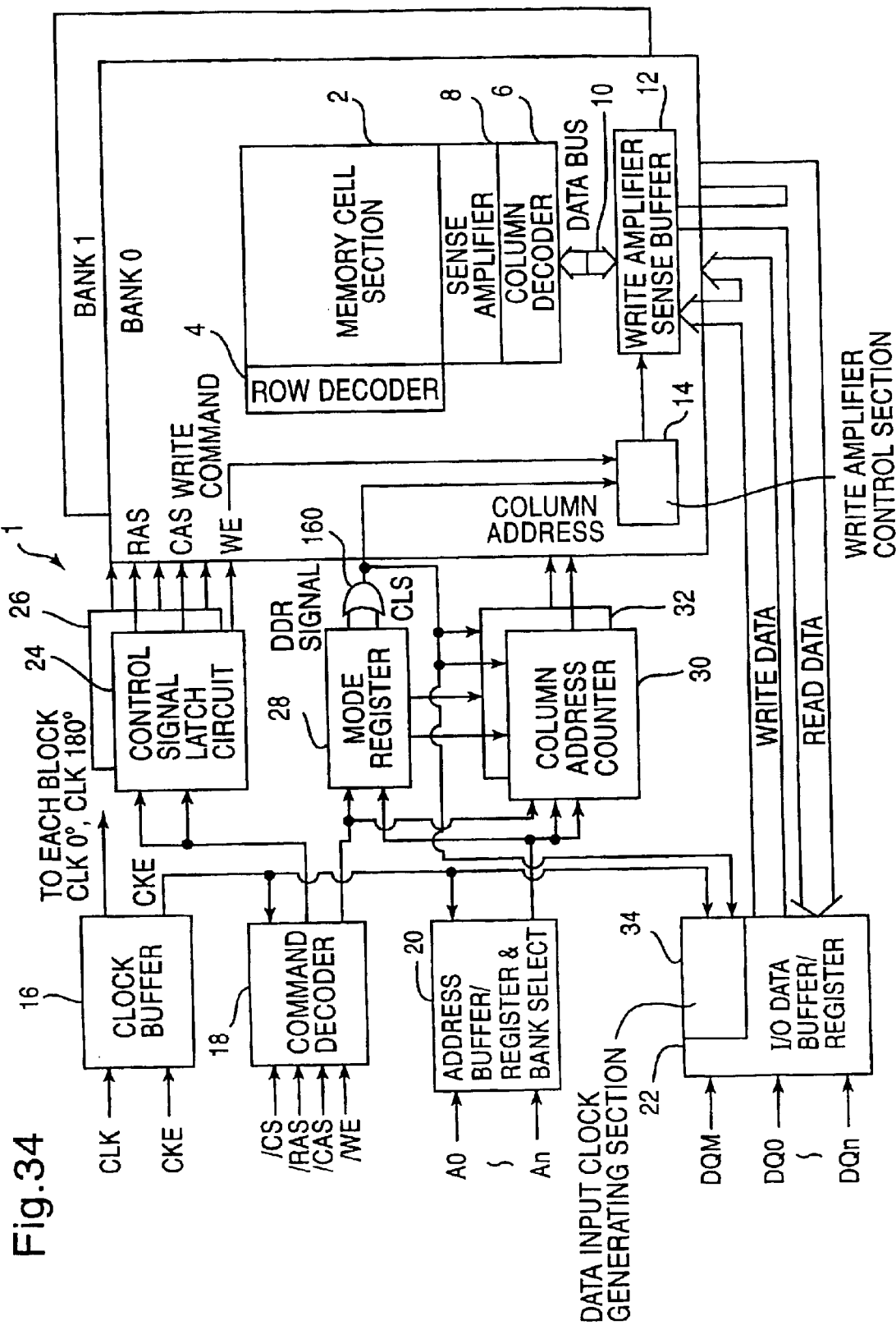
FIG. 34 is a. block diagram showing a total structure of a transformation example of the semiconductor memory device in the second embodiment of the present invention.

Also, in the first embodiment, though the DDR mode and the SDR mode during the write operation of the SDRAM 1 is switched by transmitting the DDR signal as a switch signal, the present invention is not limited to this. For example, as shown in FIG. 34, the control signal used in the conventional SDRAM can be used instead of the DDR signal. The FIG. 34 shows a schematic structure adding a transformation on the semiconductor memory device in the first embodiment in FIG. 1. In FIG. 34, the same codes are referred to the structure elements having the same functional action as those in the first embodiment omitting the description. In a transformation example shown in FIG. 34, the CAS latency control signal CLS is output together with the DDR signal from the mode register 28 and the DDR signal and the CAS latency control signal CLS are input to an OR circuit 160. Therefore, when the SDRAM 1 in the second embodiment is, for example, tested and evaluated by the conventional memory test equipment, the SDRAM 1 can be easily switched to execute the write operation in the SDR mode by controlling either the DDR signal of the mode register 28 or CAS latency control signal CLS.

As has been described above, according to the present invention, with a transfer mode to transfer data in synchronization with both of the rising and falling edges of the external clock, a semiconductor memory device and its control method which can be easily tested and evaluated by the conventional memory test equipment can be realized.

What is claimed is:

1. A semiconductor memory device receiving a data strobe signal and receiving an input data at a double data rate, comprising:
    a first data latch circuit receiving an internal data strobe signal for latching the input data;
    a second data latch circuit receiving the internal data strobe signal for latching the input data;
    a first input data latch receiving a data latch signal for latching data stored in the first or second data latch circuit;
    a second input data latch receiving the data latch signal for latching data stored in the second or first data latch circuit;
    a first write amplifier receiving a control signal for amplifying and transmitting data from the first input data latch to a memory cell array; and
    a second write amplifier receiving the control signal for amplifying and transmitting data from the second input data latch to the memory cell array;
    wherein in a test mode, said first and second data latch circuits latch the input data, the first and second write amplifier receive data from the first and second data latch circuits via the first and second input data latches respectively, and one of the first and second write amplifier transmits data to the memory cell array in response to the control signal.

2. The semiconductor memory device as set forth in claim 1, wherein during the test operation mode, the data latch signal is a constant logic level so that the first and second input data latches receives data from the first and second data latch circuits.

3. The semiconductor memory device as set forth in claim 1, wherein in a read mode of the double data rate, said first data latch circuit latches the input data in response to a rising edge of the data strobe signal, the second data latch circuit latches the input data in response to a falling edge of the data strobe signal and the first and second input data latches store data from the first and second data latch circuits in response to the data latch signal.

4. The semiconductor memory device as set forth in claim 3, wherein in the read mode, the first and second write amplifiers amplify and transmit data from the first and second input data latches to the memory cell array in response to the control signal.

* * * * *